(12) United States Patent
DiDomenico

(10) Patent No.: US 10,371,936 B2
(45) Date of Patent: Aug. 6, 2019

(54) WIDE ANGLE, BROAD-BAND, POLARIZATION INDEPENDENT BEAM STEERING AND CONCENTRATION OF WAVE ENERGY UTILIZING ELECTRONICALLY CONTROLLED SOFT MATTER

(71) Applicant: Leo D. DiDomenico, Oakland, CA (US)

(72) Inventor: Leo D. DiDomenico, Oakland, CA (US)

(*) Notice: Subject to any disclaimer, the term of this patent is extended or adjusted under 35 U.S.C. 154(b) by 28 days.

(21) Appl. No.: 15/480,053

(22) Filed: Apr. 5, 2017

(65) Prior Publication Data
US 2017/0235126 A1    Aug. 17, 2017

Related U.S. Application Data

(63) Continuation-in-part of application No. PCT/US2015/059797, filed on Nov. 9, 2015.

(60) Provisional application No. 62/319,254, filed on Apr. 6, 2016, provisional application No. 62/159,506, filed on May 11, 2015, provisional application No. 62/148,658, filed on Apr. 16, 2015, provisional application No. 62/101,069, filed on Jan. 8, 2015, provisional application No. 62/087,541, filed on Dec. 4, 2014, provisional application No. 62/077,371, filed on Nov. 10, 2014.

(51) Int. Cl.
| | | |
|---|---|---|
| *G02B 5/10* | (2006.01) | |
| *G02B 26/00* | (2006.01) | |
| *G02B 26/08* | (2006.01) | |
| *G02F 1/29* | (2006.01) | |
| *G02B 19/00* | (2006.01) | |
| *F24S 23/70* | (2018.01) | |
| *H01L 31/054* | (2014.01) | |
| *F24S 23/79* | (2018.01) | |
| *F24S 23/00* | (2018.01) | |

(52) U.S. Cl.
CPC ............ *G02B 26/005* (2013.01); *F24S 23/70* (2018.05); *F24S 23/82* (2018.05); *G02B 19/0023* (2013.01); *G02B 19/0042* (2013.01); *G02B 26/004* (2013.01); *G02B 26/0825* (2013.01); *G02F 1/29* (2013.01); *H01L 31/0543* (2014.12); *H01L 31/0547* (2014.12); *F24S 23/12* (2018.05); *F24S 23/79* (2018.05); *F24S 2023/878* (2018.05); *G02F 2203/24* (2013.01); *Y02E 10/40* (2013.01)

(58) Field of Classification Search
CPC ................ G02B 26/005; G02B 19/023; G02B 19/0042; G02B 26/004; G02B 26/0825; F24S 23/82; F24S 23/70; F24S 23/79; F24S 23/12; F24S 2023/878; G02F 1/29; G02F 2203/24; H02S 40/22
USPC ......................................................... 359/853
See application file for complete search history.

(56) References Cited

U.S. PATENT DOCUMENTS 7,898,740 B2 * 3/2011 Heikenfeld ............ G02B 5/045
359/665

* cited by examiner

*Primary Examiner* — Euncha P Cherry
(74) *Attorney, Agent, or Firm* — Christopher Peil; Law Office of Christopher Peil

(57) ABSTRACT

A general method is provided for electronically reconfiguring the internal structure of a solid to allow precision control of the propagation of wave energy. The method allows digital or analog control of wave energy, such as but not limited to visible light, while maintaining low losses, a multi-octave bandwidth, polarization independence, large area and a large dynamic range in power handling. Embodiments of the technique are provided for large-angle beam steering, lenses and other devices to control wave energy.

34 Claims, 40 Drawing Sheets

WIDE ANGLE, BROAD-BAND, POLARIZATION INDEPENDENT BEAM STEERING AND CONCENTRATION OF WAVE ENERGY UTILIZING ELECTRONICALLY CONTROLLED SOFT MATTER

CROSS REFERENCE TO RELATED APPLICATIONS

This application claims benefit of U.S. provisional patent application Ser. No. 62/319,254, filed Apr. 6, 2016, and is a continuation in part of PCT/US2015/059797 filed by patent attorney Christopher Peil of the Law Office of Christopher Peil 1701 22nd Avenue, San Francisco Calif. US, 94122 on 2015 Nov. 9 and entitled Wide-Angle Broad-Band, Polarization Independent Beam Steering and Concentration of Wave Energy Utilizing Electronically Controlled Soft Matter, which claims priority from U.S. patent applications: [1] U.S. 62/077,371 filed by the inventor, Leo D. DiDomenico, on 2014 Nov. 10 and entitled Efficient Wide-Angle, Broad-Band, Polarization Independent, Electronic Beam Steering and Concentration of Light Utilizing Microfluidics, U.S. 62/077,371 is hereby incorporated in its entirety; [2] U.S. 62/087,541 filed by the inventor, Leo D. DiDomenico, on 2014 Dec. 4 and entitled Efficient Wide-Angle, Broad-Band, Polarization Independent, Electronic Beam Steering and Concentration of Light Utilizing Electronically Controlled Soft Matter, U.S. 62/087,541 is hereby incorporated in its entirety; [3] U.S. 62/101,069 filed by the inventor, Leo D. DiDomenico, on 2015 Jan. 8 and entitled Efficient Wide-Angle, Broad-Band, Polarization Independent, Electronic Beam Steering and Concentration of Light Utilizing Electronically Controlled Soft Matter, U.S. 62/101,069 is hereby incorporated in its entirety; [4] U.S. 62/148,658 filed by the inventor, Leo D. DiDomenico, on 2015 Apr. 16 and entitled Efficient Wide-Angle, Broad-Band, Polarization Independent, Electronic Beam Steering and Concentration of Light Utilizing Electronically Controlled Soft Matter, U.S. 62/148, 658; [5] U.S. 62/159,506 filed by the inventor, Leo D. DiDomenico, on 2015 May 11 and entitled Efficient Wide-Angle, Broad-Band, Polarization Independent, Electronic Beam Steering and Concentration of Light Utilizing Microfluidics, U.S. 62/159,506.

TECHNICAL FIELD

This invention relates in general to steering, concentrating and controlling the propagation of wave energy, such as but not limited to light, over large angular extents without substantial restrictions due to polarization, bandwidth, area and power by means of electronically controlled soft matter.

BACKGROUND ART

Much of the prior art in beam steering and control is for electromagnetic radiation. Thus much of the following prior art is for beam steering in optical systems. In particular, the electronic control of the direction of propagation of light, which also includes concentration, focusing and the spectral and/or spatial distribution of electromagnetic radiation in general, is often desired to enable various optical functions. For example, prior art systems have achieved some capability in beam steering by severely limiting one or more parameters, such as: wavelength, steering angle, polarization, input/output aperture extent and the angular resolution of the light steering. There are many examples of prior art that explicitly demonstrate the dynamic control of light, but with one or more shortcomings. Several such devices are now discussed and many more are available in the literature especially for narrow-band phased array systems for electromagnetic waves and sound waves.

U.S. Pat. No. 7,924,495, entitled "Active Matrix Sun Tracker", issued to Leo DiDomenico on 2011 Apr. 11. This patent shows miniature optical elements controlled by quasi electrostatic forces. However, mechanical optical systems often require many components in a complex arrangement, are prone to wear and are potentially too costly for some applications.

U.S. Pat. No. 6,958,868 entitled "Motion-Free Tracking Solar Concentrator", issued to John George Pender on 2005 Oct. 25. This patent shows liquid crystal filled prism arrays that can steer light. This prior art has a limited range of angles over which it can steer light due to the limited range of refractive indices that a liquid crystal can provide. It is also polarization dependent, which can only be overcome by utilizing multiple layers to compensate for polarization diversity of incident light.

U.S. Pat. No. 8,311,372 entitled "Liquid Crystal Waveguide Having Refractive Shapes For Dynamically Controlling Light", issued to Michael H. Anderson et. al. on 2012 Nov. 13. This patent shows how to use evanescent field coupling to liquid crystals to steer light. It has shortcomings of requiring narrowband laser light having only one polarization on a predominantly two dimensional structure so that the area extent of both input and output is limited.

U.S. Pat. No. 7,215,472 entitled "Wide-Angle Beam Steering System", issued to Irl W. Smith et. al. from Raytheon on 2007 May 8. Through the use of multiple stacked holograms a set of discrete steering angles can be addressed by means of a separate beam steerer, which selects a particular volume phase hologram within the stack of volume phase holograms to use for course steering. A second post-steering (or vernier) technology is also required to fine tune the direction of propagation of the light. One shortcoming of this invention is limited steering range, which was stated to be about $\pm\pi/4$ radians. The prior art's has a total of $\pi/2$ radians for its angular field of regard for in-plane light steering and this falls significantly short of $\pi$ radians needed for many applications. For systems not restricted to control radiation in a plane the typically desired solid-angle field of regard is $2\pi$ steradians, which is also not achieve by this prior art. Yet another limitation of this prior art is that it is a narrowband device that ideally functions on laser light of only one polarization.

U.S. patent application 2012/0188467 entitled "Beam steering devices including stacked liquid crystal polarization gratings and related methods of operation", issued to Michael J. Escuti et. al. on 2012 Jul. 26. This patent shows stacks of polarization holograms formed from electronically controlled liquid crystals. Its first shortcoming is that light steering is limited to discrete angles instead of a continuous range of angles unless yet another steering technology is utilized to compensate. Another shortcoming is that the number of stages within the beam-steering stack limits the overall efficiency, which is strongly affected by: scatter, absorption, and Fresnel loss—which could be significant. Another shortcoming is that as a diffractive-based system additional layers of compensation are needed to steer different wavelengths into the same angular direction. Each of the additional layers requires a lossy transparent conductor further limiting its overall efficiency. Another shortcoming is a restricted angular field of regard, which is shown to be about $\pm\pi/4$ radians in a principle plane, instead of $\pm\pi/2$ radians or more. By stacking steering systems in two orthogonal directions up to 87% efficiency over an $\pi/2\times\pi/4$ steering field of regard is possible, with with 1/45 of a radian steering increments at one wavelength of light. Larger spectral bandwidths would further increase losses. Yet another shortcoming, is that the incident light must be circularly polarized. This means that even through the polarization gratings are inherently very low loss, there is nonetheless at least a loss of 50% of any incident natural light (sunlight or light from a thermal source), which is wasted in a process used to convert the light to the correct polarization before being steered. While polarization gratings can in principle provide a means to convert natural light to circular polarized light at a normal incident angle, there is at this time no way to also provide for that polarization conversion over a large $\pm\pi/2$ radian angular field of regard. Thus this light steering system is not efficient with broadband polarization-diverse natural light sources such as sunlight.

U.S. Pat. No. 7,898,740 entitled "Tunable Optical Array Device Comprising Liquid Cells", issued to Jason Heikenfeld at. al. on 2011 Mar. 1. This patent shows an array of liquid-filled cells comprising at least two transparent and non-miscible fluids, each having a different refractive index. Voltages applied to the cells induce polarization charges that change the wetting angle of the boundary between the two non-miscible fluids, by a process called electrowetting, and this causes the optical boundary to change orientation so that light is refracted into different directions. Its shortcomings include a limited range of steering angles due to the small differences in the refractive indices of the non-miscible fluids and a relatively large light loss due to unused area surrounding each of the cells.

U.S. patent application 2010/0033788 entitled "Micromirror and Fabrication Method for Producing Micromirror", issued to Huikai Xie et. al. on 2010 Feb. 11. This patent shows arrays of micro-mirror structures comprising a flat mirror, a pillar structure and electrothermal actuators for steering light by means of reflection. Some of its shortcomings include that fact that it is limited to reflection only and that the space surrounding each mirror is unused so that significant optical losses are possible.

The following patents describe optical switches: U.S. Pat. No. 4,988,157 entitled "Optical Switch Using Bubbles", issued to J. L. Jackel et. al. on 1991 Jan. 29; U.S. Pat. No. 5,699,462 entitled "Total Internal Switches Employing Thermal Activation", issued to J. E. Fouquet et. al. on 1907 Dec. 16; U.S. Pat. No. 6,707,592 entitled "Optical Switch With Static Bubble", issued to D. W. Schroeder on 2004 Mar. 16; U.S. Pat. No. 7,024,062 entitled "Optical Switch With Low Pressure Bubble", issued to J. J. Uebbing on 2006 Apr. 4, which all show the use of index matching fluids for switching light into typically two directions per switch by total internal reflection between input and output waveguides. Thus there is a highly restrictive requirement of having input and output waveguides to control the waves.

The shortcomings of a number of these and other prior-art systems are discussed in: "A Review of Phased Array Steering for Narrow-Band Electrooptical Systems", By Paul F. McManamon et. al. in the Proceedings of the IEEE, vol. 97, No. 6, June 2009, which is included herein in its entirety by reference.

The "Handbook of Optofluidics", edited by A. R. Hawkins et. al., CRC Press 2010, ISBN 978-1-4200-9354-4, provides a review of optofluidic switches based on total internal reflection from a number of different authors in section 10.1.1.1 of the handbook, the description and references of which are included in its entirety herein. The handbook goes on to describe how certain of its listed references have developed opto-fluidic switches which are restricted by the need for input and output waveguides.

The "Handbook of Optofluidics", edited by A. R. Hawkins et. al., CRC Press 2010, ISBN 978-1-4200-9354-4, provides a review of optofluidic deflectors and beam scanners from many authors in section 10.1.1.3 of the handbook, the description and references of which are included in its entirety herein. The handbook goes on to describe electrowetting micro-prisms as well as micro-mirrors mounted on membranes that are actuated by means of a pressure differential. These techniques are limited in area coverage or steering angle range as described in the handbook.

The "Handbook of Optical and Laser Scanning", edited by Gerald F. Marshall, ISBN: 0-8247-5569-3, which is an authoritative review of methods of optical and laser scanning describes the shortcomings of current light steering technologies.

Therefore, it is clear that there are many methods for steering light (and by extrapolation other forms of wave energy) and that these methods have an assortment of shortcomings. Moreover, there is a clear need for a method of steering light that can overcome the shortcomings cited above.

SUMMARY OF THE INVENTION

Technical Problem

The technical problem addressed in this patent disclosure is to provide methods and device embodiments that allow electronic control of the propagation direction of freely propagating waves, such waves include, but are not limited to light and sound. The desired devices typically have all or most of the following properties: low loss, broad spectral range (for continuous and/or pulsed waves), large angular steering range, high angular steering precision and accuracy, polarization independence, voltage controllability, low power consumption, capable of processing high-intensity or low-intensity waves, fast responding, thin in profile, configurable to provide wave steering, configurable to provide concentration (or expansion) of waves, an angular field of regard of up to $2\pi$ radians in two dimensions and $4\pi$ steradians in three dimensions.

Solution of the Problem

Soft matter (SM) beam steering, as described herein, is a technique to electronically steer waves, such as but not limited to light and sound waves, using electronically controllable SM structures to "hide" or "reveal" spatial boundaries and regions by means of the presence of absence of SM. There are four embodiments primarily discussed in this disclosure: a Liquid Phase Beam Steering (LPBS) device, a Solid Phase Beam Steering (SPBS) device, a Gas Phase Beam Steering (GPBS) device and a Plasma Phase Beam Steering (PPBS) device. These are simply different phases of matter used in the control channels described later in this document so as to be able to control different forms of wave energy. In general, controlled SM can manage the flow of wave energy by Total Internal Reflection (TIR), refraction, or diffraction of waves. Special attention is focused on beam steering using dynamic "mirrors" for different types of wave energy because it is effectively lossless. This is then generalized into dynamic focusing and wavefront control.

Note: because of the similarity of the embodiments for controlling different types of transverse, longitudinal and surface waves the majority of this patent disclosure will focus on the specific case of light waves, which are transverse electromagnetic waves in a dielectric and free space. However, this in no way should be construed as limiting the types of wave energy that can be controlled.

Additionally experimental demonstrations of the technology for the specific case of optical systems, as well as in-depth discussions of a solar application of SM beam steering, are provided by the author of this patent disclosure in a peer-reviewed journal: "*Towards doubling solar harvests using wide-angle, broad-band microfluidic beam steering arrays*," by Leo DiDomenico, Optics Express, Vol. 23, Issue 24, pp. A1398-A1417, 2015, published by the Optical Society of America (OSA). This reference is included in its entirety into this document by reference.

BRIEF DESCRIPTION OF DRAWINGS

The foregoing discussion is only an introduction and other objects, features, aspects, and advantages will become apparent from the following detailed description and drawings of physical principles given by way of illustration. Note that figures are often drawn for improved clarity of the underlying physical principles and are not necessarily to scale.

DESCRIPTION OF THE EMBODIMENTS

Au Index Matching Fluid (IMF) having substantially the same refractive index as a transparent solid can optically hide voids within a transparent solid when the IMF fills the void. This is because Snell's well-known law of optical refraction states that when two adjacent optical media having refractive indices $\{n_1, n_2\}$ and refracted light at normal angles $\{\theta_1, \theta_2\}$ to the boundary between the media, then conservation of linear optical momentum requires that $n_1 \sin \theta_1 = n_2 \sin \theta_2$. Therefore, if $n_1=n_2$ then $\theta_1=\theta_2$ and there is no refraction, even though one medium is a solid and the other medium is a fluid or a SM medium in general. Additionally, there are no reflections or changes of polarization at the boundary. This principle can be extended to diffraction gratings at a fluid/solid boundary.

Index Matching Fluid (IMFs) may be single chemicals or mixtures of chemicals. A single chemical IMF is chosen if the refractive index of the chemical is close to that of the transparent solid over the spectral band and temperature range of interest. Often, it is the case, that there is no single liquid-state chemical that has all of the desired properties. Consequently, more than one liquid-state chemical may be used. For example, to have a liquid mixture with a low dynamic viscosity, i.e. of less than 1.5 cP at 25° C., that is refractive index matched to PolyMethyl MethAcrylate (PMMA) (Acrylic) with a refractive index of 1.493 at 532 nm wavelength and 25° C. it is possible to use two miscible fluids prepared in suitable proportions to match the refractive index of solid PMMA. The first fluid may be chosen as MethylPhenylPolySiloxane (MPPS), which is a transparent and colorless silicone oil with a dynamic viscosity of about 1.5 cP at 25° C. and a refractive index of about 1.498. The second fluid may be chose as Ethyl Acetate (EA), which is a transparent and colorless liquid with a dynamic viscosity of about 0.4 cP at 25° C. and a refractive index of about 1.3720. If MPPS and EA are taken in the ratio of approximately 2 grams EA for every 23 grams MPPS (for a total of 25 grams) the refractive index of the mixture is almost identical to that of PMMA. Many other chemicals may be mixed with MPPS to adjust refractive index and other chemical properties. Examples of other chemicals compatible with MPPA include, but are not limited to: cyclomethicone, toluene, cyclohexane, butyl acetate, methyl ethyl ketone, cyclohexanol, ethanol and phenylmethylsiloxane. To ensure the stability of the IMF it is often hermetically sealed within an airtight containment so that oxygen cannot react with the IMF. Additionally, steps may be taken to ensure that ultraviolet light is not absorbed directly by the IMF so that the IMF does not disassociate by photochemical processes. The above mentioned chemicals in no way exhausts the possible chemicals that can be used for creating an IMF mixture.

Figure 1:
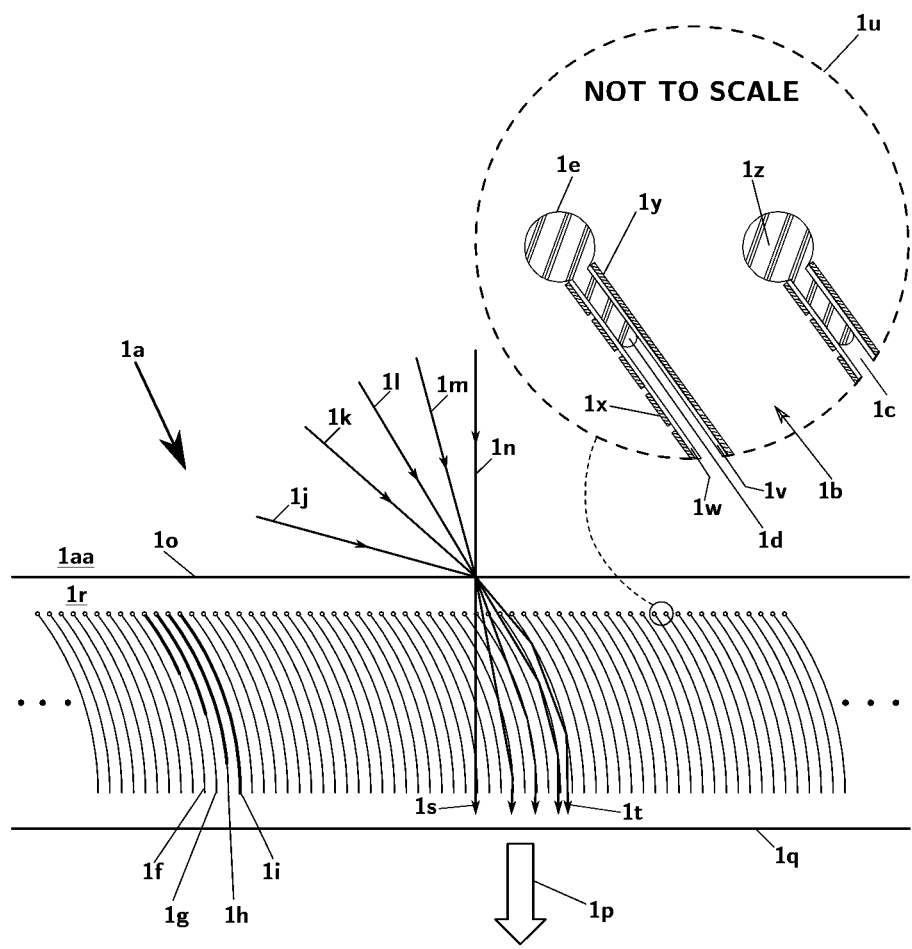
FIG. 1 shows in cross section an electronically controlled light steering system based on fluidic control channels and optical waveguides.

FIG. 1 shows a cross sectional view of one embodiment for a LPBS device formed from thin transparent glass or plastic sheets. An example of such a transparent sheet is shown as 1a of FIG. 1. Within the glass sheet an array of curved optical waveguides is provided. The shape of the curve may be a circular section, a section of an equiangular spiral, a section of a macro-focus parabola or other curve shape that provides the capacity to steer electromagnetic radiation. An example of one such waveguide is 1b, which is shown in a magnified view, and is separated from other waveguides by thin layers of free-space, which form waveguide claddings via fluidic control channels, an example of which is 1c. The fluidic control channels contain an IMF 1d, which is either injected or extracted to a storage reservoir (not shown) through reservoir channels 1e. Alternately the IMF may be vaporized or condensed by the injection or extraction of thermal energy. The transport of the index matching fluid in the fluidic control channels is accomplished electronically and has the effect of making sections of the waveguides active, by means of TIR when the control channels are only filled with a vacuum. Alternatively, when the control channels are filled with an index matching fluid then the waveguides no longer trap electromagnetic waves by TIR and rays pass through the device without optical losses, reflection, refraction or diffraction.

The direction in winch an index matching fluid is transported over time in shown schematically in FIG. 1 by means of fluidic control channels 1f, 1g, 1h and 1i, where the printed weight of the curve provides an indication of the extent to which the index matching fluid (indicated by a thicker line) has been transported within its respective control channel. The extent of fluid transport in each control channel is different in order to represent a time sequence of fluid transport. In practice, the reader is to imagine that all control channels are typically filled identically at any given time.

Light rays 1j, 1k, 1l, 1m and 1n are representative of rays that fill an angular range of $\pi/2$ radians between a first surface 1o and its normal direction in the plane of the figure. It is to be understood by the reader that these rays are not all incident on the first surface 1o simultaneously, but rather are separated in time. The rays are refracted at the first surface 1o and this starts the steering process. The LPBS device is then reconfigured over time by adjusting the volume of index matching fluid within each fluidic control channel 1c, and this steers the light into the output direction 1p relative to the second surface 1q simply by utilizing more or less of the waveguide as needed. Note, the reader is to imagine that for each of the above mentioned rays there are many other parallel rays that fill up the space of the first surface 1o—those additional rays are not shown to reduce clutter.

So for example light ray 1n, and all parallel rays filling the first surface 1o, would pass through the entire LPBS device substantially without deviation and emerge as light rays parallel to light ray 1s so long as all the fluidic control channels are completely filled with the index matching fluid. Similarly, light ray 1j, and its parallel counter parts filling the first surface 1o, would pass through the entire device with multiple redirections within the optical waveguides by means of TIR and emerge as light rays parallel to light ray 1t, however in this case there is no index matching fluid in the fluidic control channels so that optical waveguides like 1b become active and guide light by TIR. The result is that incident light is redirected into the output direction 1p. This represents an optical tracking receiver. Moreover, by reversing the rays a laser or collimated white-light source, could be steered to multiple locations—i.e. a LPBS being used as transmitter. This is shown and discussed in more detail later in FIG. 13.

The LPBS system is also compact for visible electromagnetic radiation, with a thickness that is on the order of about 1-10 mm, due to the small dimensions of fluidic control channels, such as 1c, which can in principle be as small as 1-10 μm wide. This width is typically chosen to be larger than any anticipated wavelengths of light to be processed to avoid evanescent coupling between neighboring waveguides. Additionally, each optical waveguide, such as waveguide 1b, may be made 100 times wider than the microfluidic control channels so that 99% of the light received is processed without loss at the edges of the cladding—note FIG. 1 is not to scale.

The optical principles of the beam steering device are straight forward and much of the variety of the embodiments for LPBS devices are associated with the method of precision fluid actuation by a soft matter distributor. In particular, there are many methods for moving index matching fluid through fluidic control channels including, but not limited to actuation based on: electrowetting (fluid transport by electric field modified surface wettability), electrohydrodynamics (which is fluid transport by electric field forces on mobile fluidic charges), magnetohydrodynamics (electrolytic fluid transport by magnetic Lorentz forces acting on fluids carrying currents), electro-osmosis (electrolytic fluid transport by electric field forces on net mobile electric charges formed by a chemical equilibrium between a solid and electrolytic fluid), thermocapillarity (fluid transport by temperature dependent surface tension), dielectrophoresis (fluid transport by non-uniform electric fields acting on polarizable fluids), surface acoustic waves (fluid transport by electric field induced acoustic waves traveling along a solid/liquid interface), Gibbs-Marangoni effect (fluid transport along interface between two fluids due to surface tension gradients), micro-electro-mechanical pumping, pressure gradients, thermal expansion of a liquid, thermal expansion of a liquid to the point of vaporization into a gas and others.

For example, the technique of fluid transport via electrowetting is shown in magnified view 1u. Electrowetting is based on the use of electric fields to alter the wetting behavior of an index matching fluid 1d relative to surfaces comprising normally hydrophobic coatings, examples of which are 1v and 1w. The normally hydrophobic coatings separate a transparent electrode array 1x and a reference transparent electrode 1y from the index matching fluid 1d.

Moreover, the transparent electrode array 1x, comprises individual electrodes that may take on a positive or negative voltage relative to the reference transparent electrode 1y, as indicated by the use of "+" and the "−" symbols in the figure. The cross sectional width of each electrode in FIG. 1 may also be different to allow angular steering steps that are equal. As the electrode voltages are sequentially switched from negative to positive the index matching fluid 1d is drawn deeper into the fluidic control channel in discrete steps. The process can be reversed as needed with the index matching fluid moving into or out of reservoir channels like 1z. The application of an electric field changes the normally hydrophobic coating to a hydrophilic coating, or vice versa, and thereby allows unbalanced forces to exist on the fluid, which moves the IMF with precision within the fluidic control channels and activates or deactivates all of the optical waveguides simultaneously so that light can be steered from or into an external medium 1aa, e.g. air, from an waveguide medium 1r. Note that the time sequence of voltages on the electrodes is often chosen to ensure that only the leading edge of the IMF is in a hydrophilic state temporarily, this requires that the voltage on electrode at desired position of the leading edge of the IMF is toggled on and off just long enough for the IMF to move to the desired position and be held in place by capillary forces.

Figure 2:
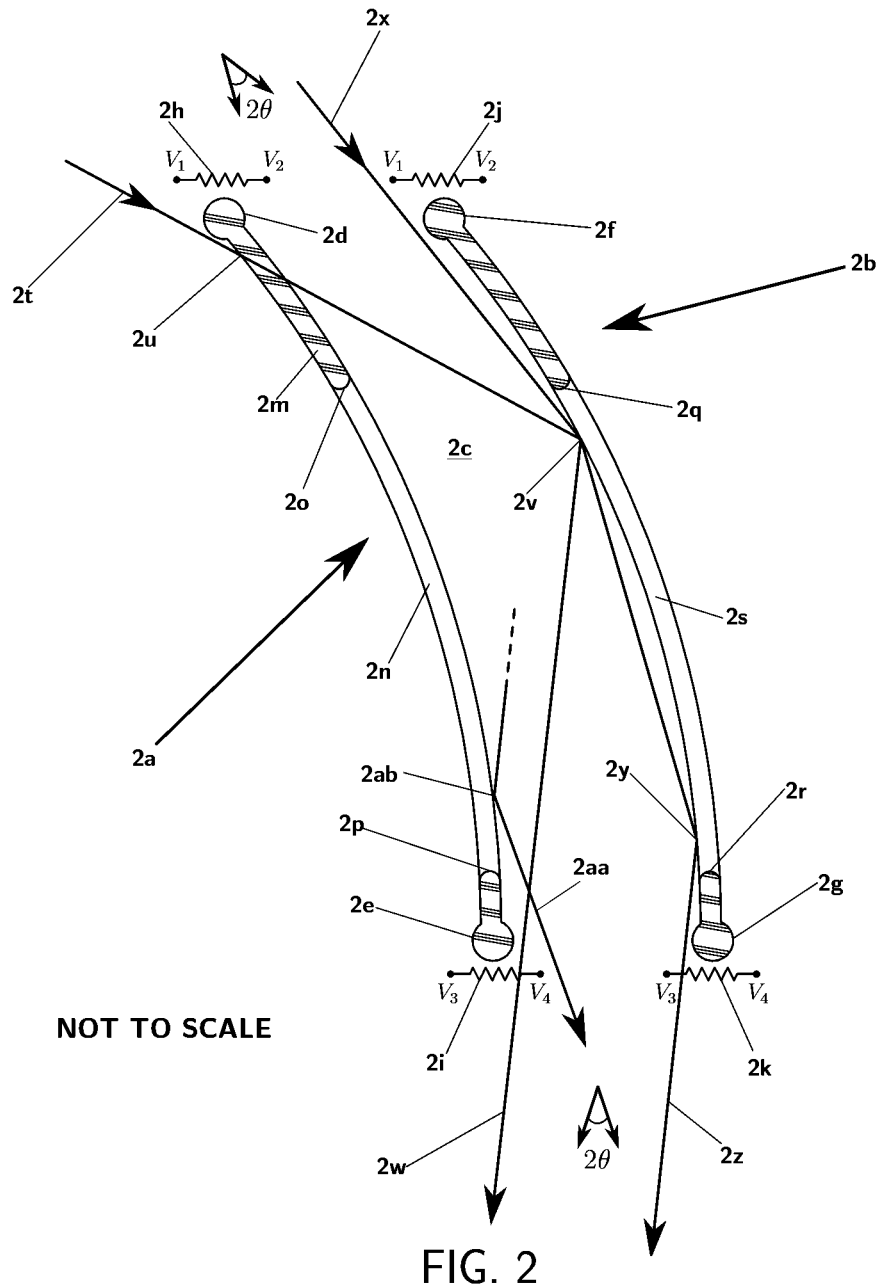
FIG. 2 shows a cross section of two micro fluidic control channels that actuate index matching fluid to steer waves based on thermal expansion.

Next, we consider the specific embodiment of index matching fluid actuation based on thermal expansion of fluids for a LPBS device. In particular, FIG. 2 shows in cross-section two representative fluidic control channels 2a and 2b, taken from an array of fluidic control channels, as well as a transparent waveguide 2c, having waveguide refractive index $n_{wg}$ located in-between. Each fluidic control channel has up to two index matching fluidic reservoirs, one on each end. Fluidic control channel 2a has reservoirs 2d and 2e. Fluidic control channel 2b has reservoirs 2f and 2g. Additionally, fluidic control channel 2a has heating resistors 2h and 2i, and fluidic control channel 2b has heating resistors 2j and 2k. The heating resistors are placed close to the reservoir channels as shown in FIG. 2. In one embodiment the resistors are formed as thin film resistors and are made transparent using a lossy transparent oxide or conductor.

When the index matching fluid 2m is heated it expands into a vacuum (or a partial vacuum) 2n. This is very similar to having an alcohol thermometer on each end of a fluidic control channel. The extent of fluid transport is controlled by adjusting the potential differences $\Delta V_{21}=V_2-V_1$ and $\Delta V_{43}=V_4-V_3$ across the heating resistors. Alternatively, the heating resistors may be replaced by a thermoelectric effect device, which provide solid-state heating and cooling. Polarity of the voltages $\Delta V_{21}$ and $\Delta V_{43}$ then sets the effect to heat or cool the index matching fluid. This allows quick response injection or extraction of index matching fluid. Examples of the thermoelectric effect include: the Seebeck effect, Peltier effect and the Thomson effect.

The result is that the index matching fluid moves along the control channels from as many as two directions simultaneously. Fluidic control channel 2a has fluid leading edges 2o and 2p, which moves into (or out of) the vacuum 2n. Similarly, fluidic control channel 2b has fluid leading edges 2q and 2r. All of these fluid edges move into (or out of) the vacuum (or partial vacuum) 2s and is fast-acting for a low thermal mass system. There is no need for hydrophobic coatings and transparent electrodes along fluidic control channels, which can cause optical losses. Moreover, the index matching fluid moves continuously along the control channels, thereby providing the potential for a continuous angle, i.e. non-discrete, high-resolution steering capability.

Also notice how a deactivated section of a waveguide (mirror section) works: light ray 2t is able to pass through a transparent region 2u of the fluidic control channel 2a, where there is index matching fluid, and it is reflected by TIR at fluidic control channel 2b, at a TIR point 2v, where the waveguide medium is adjacent to a portion of a control channel without index matching fluid. The resulting output light ray is 2w. Similarly, input light ray 2x is reflected multiple times at TIR points 2v and 2y and emerges as output light ray 2z. The multiple reflections may form as wave modes at the surface of fluidic control channel 2b. Alternately, both surfaces of the waveguide may be used, so for example light ray 2aa was reflected by TIR from the opposite side of the waveguide (compared to TIR point 2v) at TIR point 2ab. A variation on the above approach is to allow the resistors to heat up sufficiently to vaporize the IMF so that a gaseous void is formed. For microscale systems the energy needed may be quite small.

Figure 3:
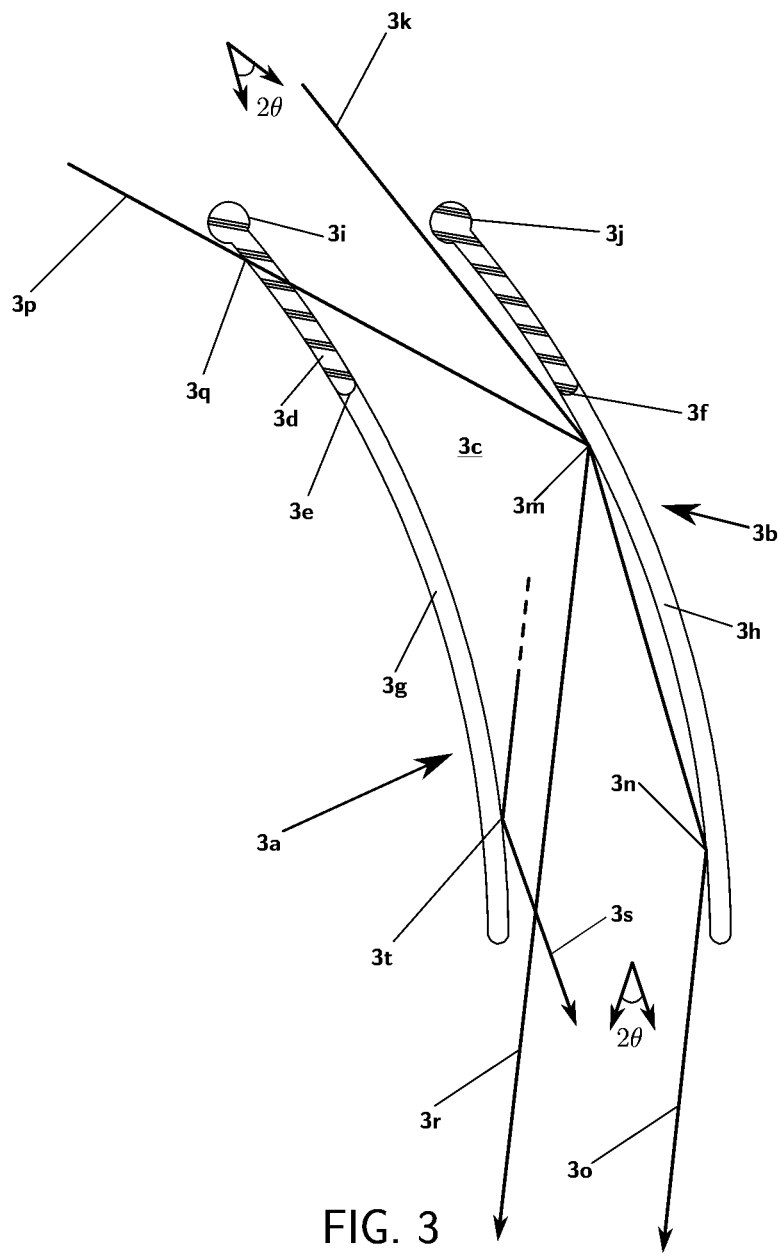
FIG. 3 shows a cross section of two micro fluidic control channels that actuate index matching fluid to steer waves based on pressure differences.

Another embodiment for fluidic actuation is shown in FIG. 3, which shows two example control channels 3a and 3b that form the waveguide cladding on either side of a waveguide medium 3c, which forms the core of the waveguide. In this embodiment the control channels may have an inert gas that shares each control channel with an IMF. The IMF, which is shown with cross hatches in 3d, has fluid leading edge 3e. Similarly, the other control channel shows a fluidic leading edge 3f. The depth of travel of the IMF 3d is now based on the pressure driving said IMF. The greater the pressure pushing on the fluid the greater the distance that the index matching fluid flows into the gas filled channel segment 3g and 3h. The pressure is applied via reservoir channels 3i and 3j from a pump or actuator (not shown). The index matching fluid maintains its minimal form within the control channels by means of capillary forces and surface wetting. Note, to include liquids and other phases of soft matter (i.e. liquid, gas, plasma, soft-solids) simultaneously the concept of a fluid pump or actuator will be called a soft matter distributor, which shall include a control signal and a mechanism to distribute soft matter.

In this way light ray 3k is reflected at TIR points 3m and 3u into output light ray 3o. Also, light ray 3p passes through the control channel having index matching fluid 3d beginning at point 3q, as it progresses towards TIR point 3m and becomes output light ray 3r. Light rays may also bounce between the cladding-waveguide interfaces. For example light ray 3s uses the opposite side of the waveguide to reflect from TIR point 3t. Thus both sides of the waveguide are equally capable of supporting TIR and controlling the extent of the steering of light.

Figure 4:
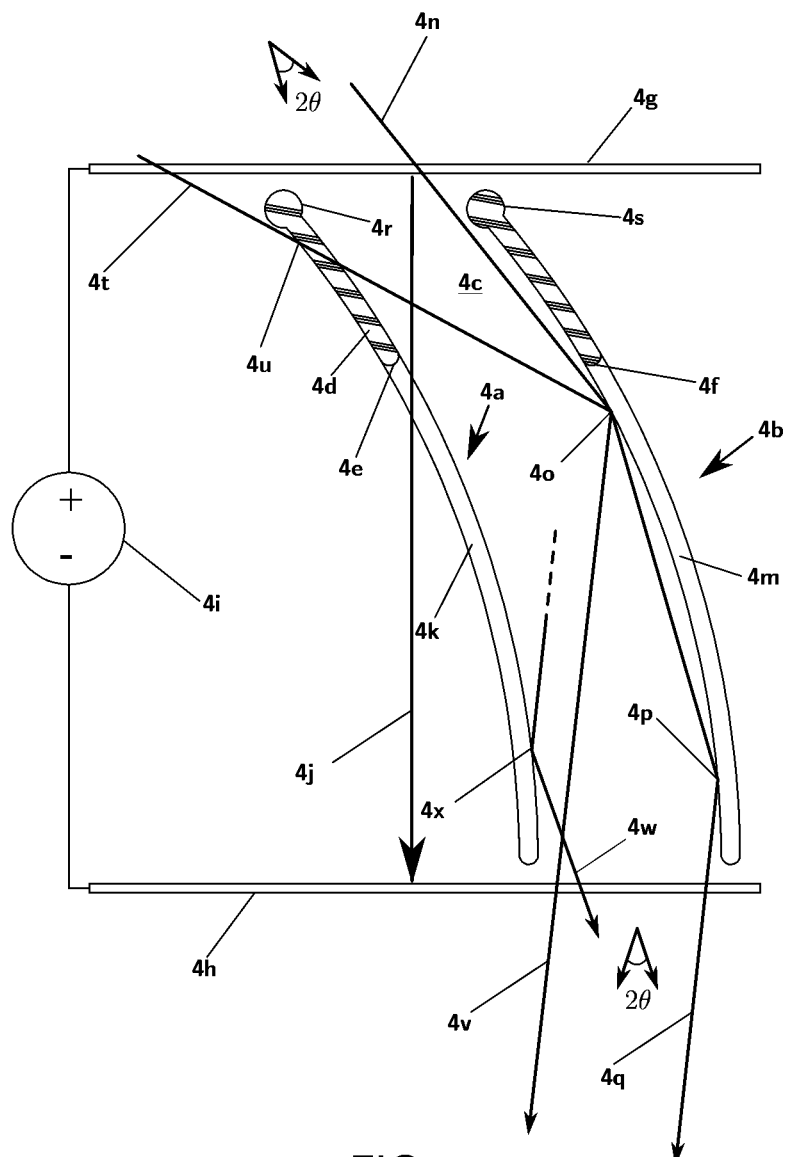
FIG. 4 shows a cross section of two micro fluidic control channels that actuate index matching fluid to steer waves based on electro osmosis.

Another embodiment for fluidic actuation leading to LPBS of electromagnetic radiation is shown in FIG. 4. Again we see two example control channels 4a and 4b, which form the waveguide cladding on either side of a waveguide medium 4c forming the core of the waveguide. The core and the cladding are part of a larger array that is not shown in its entirety so we may focus on the essential features of the embodiment. An index matching fluid 4d, which is shown schematically with cross hatches, has fluid leading edge 4e. Similarly, the other control channel shows a fluidic leading edge 4f. The depth of travel of the IMF 4d within a control channel is now based on electro osmotic forces.

In particular, when a dielectric is immersed in an electrolyte it results in the formation of a spontaneous surface charge distribution. In this way a piece of glass immersed in an aqueous solution becomes negatively charged because the silane terminals Si—O—H on the glass surface lose hydrogen ions in an aqueous solution. The protonation leaves Si—O$^-$ terminals on the glass surface, which provides a net negative charge at the surface. The electric potential associated with an aqueous solution having a pH of 7 is on the order of −100 mV. Moreover, the surface charges are subsequently equilibrated in the volume of the fluid by a layer of counter ions. In a fluidic control channel there are two surfaces so that there is an electric charge double layer formed—e.g. one layer for each side of a control channel.

Electro osmotic flow is then established in an IMF when a component of an externally applied electric field is parallel to the surfaces of the control channels in the presence of an electric charge double layer. The index matching fluid is then moved along and held in place within the control channels by a combination of effects including: [1] the double layer being moved by Coulomb forces and [2] a low Reynolds number flow inducing viscous forces that drag different fluid layers of the fluid flow along and [3] capillary forces.

In FIG. 4 two transparent electrodes 4g and 4h are provided along with an external voltage source 4i. The electrodes are in close proximity to the fluidic control channels 4k and 4m and may or may not be on the surface (not shown) of a solid transparent host material. The electrodes and voltage source, taken in combination, provide an electric field 4j, which has tangent components along the fluidic control channels 4k and 4m, which contains IMF, such as 4d. The leading edges 4e and 4f of the IMF in each control channel can move deeper into each control channel or can be withdrawn from the control channel by means of a suitably chosen voltage magnitude and polarity.

Therefore, continuous positioning of the IMF within a fluidic control channel is passible using voltage control. This allows continuous angular steering of the light by application of a voltage. The continuous nature of the steering is made possible by IMF received at the control channels from a reservoir (not shown) by means of reservoir channels 4r and 4s, which in the current figure flow in a direction normal to the page of the figure.

An input light ray 4n passes through transparent electrode 4g and strikes an evacuated portion of a fluidic control channel at TIR points 4o and 4p and emerges as output ray 4q. Another input light ray 4t passes through the transparent electrode 4g and the index matching fluid 4d in fluidic control channel 4k starting at point 4u and reflects at TIR point 4o to produce output light ray 4v. Light rays may use either (or just one) side of the waveguide medium 4c by TIR from either control channel 4k or 4m. An example of this is shown as light ray 4w, which reflects at TIR point 4x. In this way light having an angular extent of 2θ at the input can be transmitted with an angular extent of about 2θ at the output so long as the waveguide is much longer than its width or by use of macro focus parabolas for part of the profile of the control channels.

Figure 5:
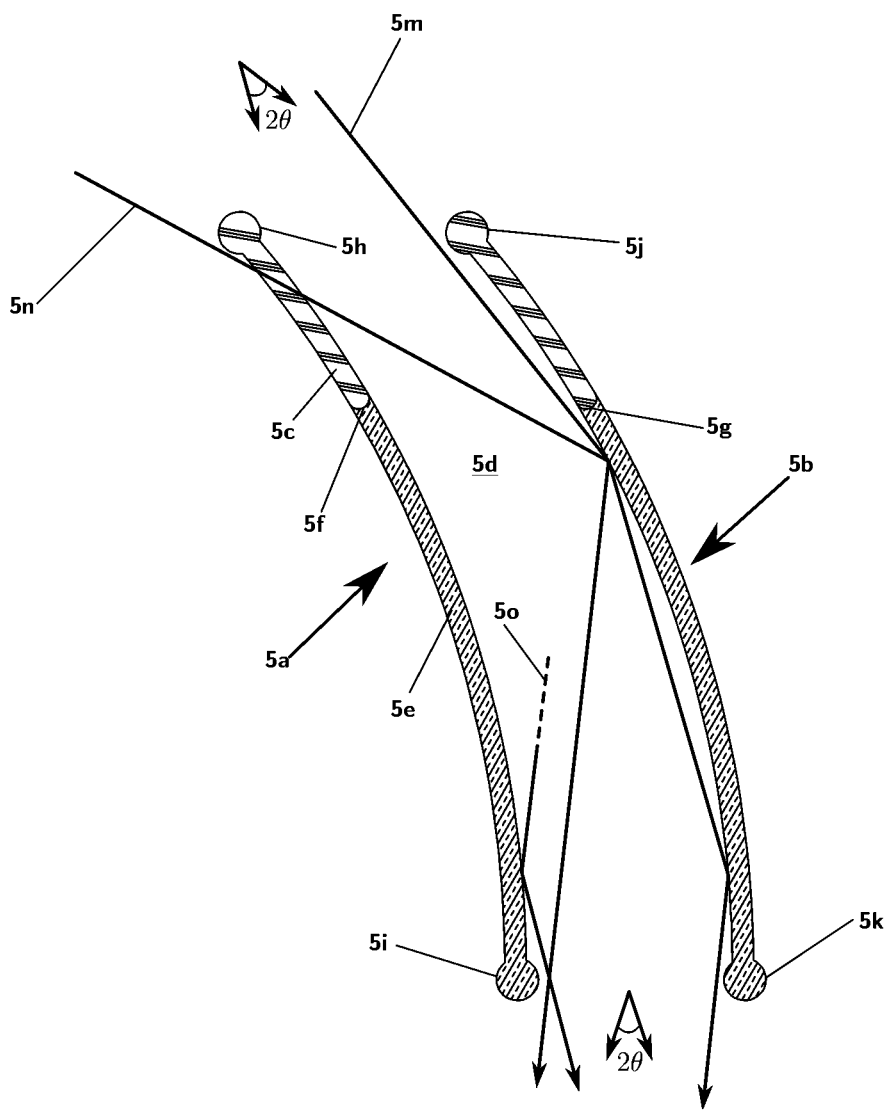
FIG. 5 shows a cross section of two micro fluidic control channels that support two non-miscible fluids with dissimilar refractive indices to steer waves.

Another embodiment for fluidic actuation leading to LPBS of electromagnetic radiation is shown in FIG. 5. Here we see two fluidic control channels 5a and 5b each having two non-miscible fluids therein. A first fluid 5c is index matched to the waveguide medium 5d and a second fluid 5e typically has a lower refractive index than the index matching fluid so that TIR is possible for light trapped within the waveguide medium 5d. The use of two fluids decreases the acceptance angle of the waveguide because the second fluid has a refractive index greater than unity. However, two non-miscible fluids also makes it possible to have a circular closed loop wherein both fluids are actuated in a gravity field when the control channels are large and do not support strong capillary forces. This moves the leading edges 5f and 5g into and out of the control channels to effect continuous steering of light. The fluids in the first control channel would flow in a closed loop through reservoir channels 5h and 5i. The fluids in the second control channel would flow in a closed loop through reservoir channels 5j and 5k.

Figure 6:
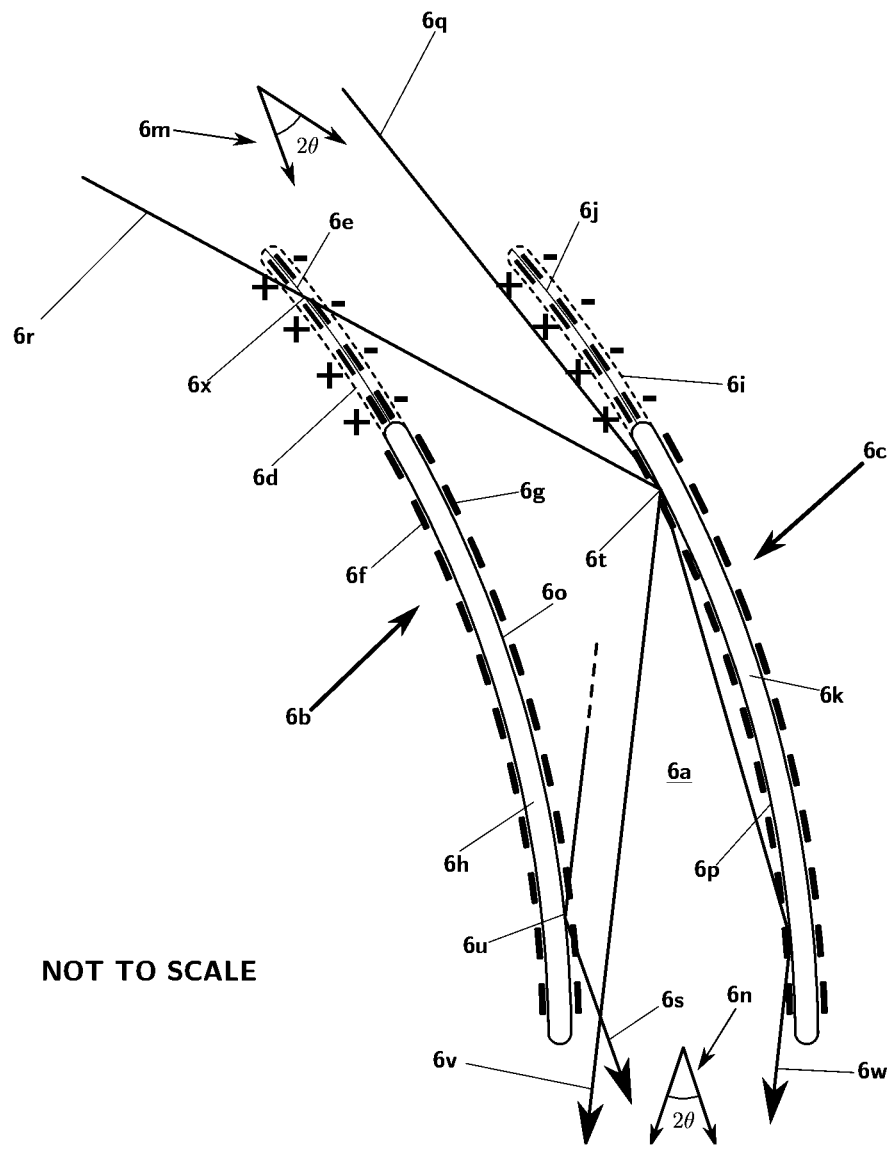
FIG. 6 shows a cross section of vacuum filled control channels on either side of a soft matter waveguide allowing charged electrodes to provide a zipper effect actuation to open or close the control channels—no fluids are used in this embodiment and the control channels are normally vacuum filled and open.

FIG. 6 provides a first embodiment of a SPBS device. In particular, a non-fluid soft transparent medium 6a has and array of control channels formed into it. Two examples of these control channels are shown as 6b and 6c. A portion of these control channels is clamped together by electrostatic forces that stretch the medium into a closed configuration and another portion remains unclamped due to a lack of electrostatic forces.

In particular, control channel 6b has a normally open segment 6d (shown as a dashed curve) that is shown as a closed segment 6e in this figure. The normally open segment is closed by means of voltages that are placed on electrode pairs that run parallel to the control channel 6b, which form an Electrostatic Zipper (EZ). An example of a transparent electrode pair is 6f and 6g. The sign of the voltages is indicated by "+" and "−" signs in FIG. 6 and those electrodes without any sign indication have the same voltage, which is typically zero volts. Control channel 6b has open segment 6h, within which a partial vacuum may exist.

Similarly, control channel 6c has a normally open segment 6i (shown as a dashed curve) that is shown as a closed segment 6j in this figure. The normally open segment is closed by means of voltages that are placed on electrode pairs that run parallel to the control channel 6c, which forms another EZ. The sign of the voltages is again indicated by "+" and "−" signs and those electrodes without any sign indication have the same voltage, which is typically zero volts. Control channel 6c has open segment 6k, within which a partial vacuum may exist.

The soft transparent medium 6a is therefore actuated to open or close a channel segment by means of an applied voltage. The two edges of the control channel that are brought together to "zipper" up the channel from closed segments 6e and 6j. When voltages are applied to the electrodes then the boundaries of the control channels are optically zippered together due to both electrostatic forces and a stickiness that is inherent in the soft transparent medium 6a. This stickiness can manifest itself in several ways. One such way is via van der Waals forces.

Thus input light having an angular extent of 2θ, as shown by edge rays 6m, is transformed to output light having angular extent of approximately 2θ, as shown by output edge rays 6n. The light is reflected by TIR at the active boundaries 6o and 6p between the soft transparent medium 6a forming the waveguide core and the open control channels forming the waveguide cladding.

Thus light rays 6q, 6r and 6s reflect from TIR points such as 6t and 6u and emerge as light rays, such a 6v and 6w. Notice that light ray 6r passes through the zippered portion of the control channel at point 6x.

Figure 7:
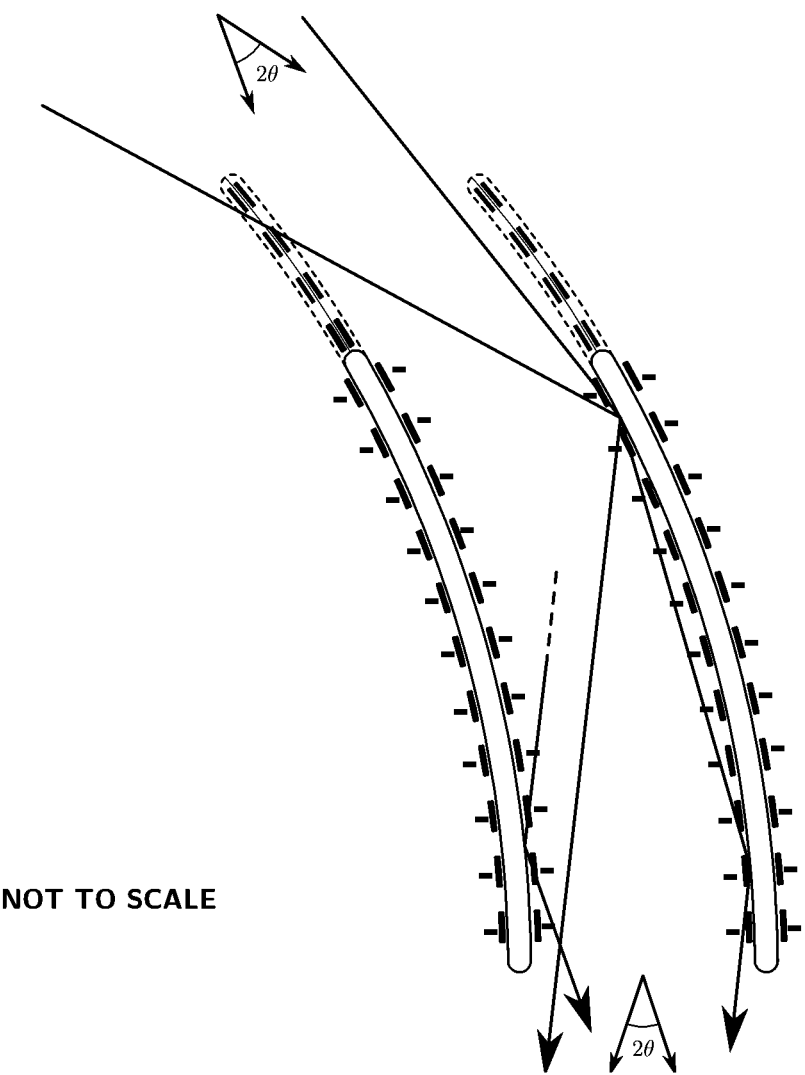
FIG. 7 shows a cross section of vacuum filled control channels on either side of a soft matter waveguide allowing charged electrodes to provide a zipper effect actuation to open or close the control channels—no fluids are used in this embodiment and the control channels are normally vacuum filled and closed.

FIG. 7 is nearly identical to FIG. 6 except that the normally open control channels of FIG. 6 are now normally closed control channels in FIG. 7. Thus a different set of control voltages and charge distributions are impressed on the electrodes by one more electric sources (not shown). The new charge distribution required to have the same optical configuration as in FIG. 6 is shown in FIG. 7. Notice that in FIG. 7 charges of like sign are injected onto electrode pairs to induce a repulsive force on the soft transparent media to separate the two edges of the control channels, while in charges of opposite sign are set on electrode pairs in FIG. 6 to induce an attractive force on the soft transparent media.

The normally closed control channels can alternately have a thin IMF layer therein that acts to wet the surfaces of each control channel to form an optically hidden channel. This provides a normally deactivated mirror. The electrodes in FIG. 6 may then be replaced with one or more thin film resistors that provide heat to the IMF to cause vaporization of the IMF, winch also expands the control channel so that TIR may take place. For some applications, like optical reconfiguration of networks for telecommunications, this provides a faster reconfiguration capability at the expense of more power drawn due to the constant current that must be placed through the resistors to keep the channels filled with a rarified gas of IMF. Once the current to the resistors is removed the system quickly cools and the IMF condenses throughout the control channel and the control channel collapses so that TIR is no longer possible.

Additionally, note that FIGS. 1-7 show a plurality of fluid actuation mechanism in curved control channels embedded within a uniform solid. However, this in no way limits what is possible. For example the control channels may be flat, i.e. curved with infinite radius, or even twisting and curved in three dimensions. Additionally, the solid material between the control channels may have a graded refractive index, instead of a homogenous refractive index, to better control the angular distribution of the output wave energy. Also, note that it is not necessary that the structures that are controlling the direction of propagation of wave energy are significantly larger than the wavelength of the energy.

Figure 8:
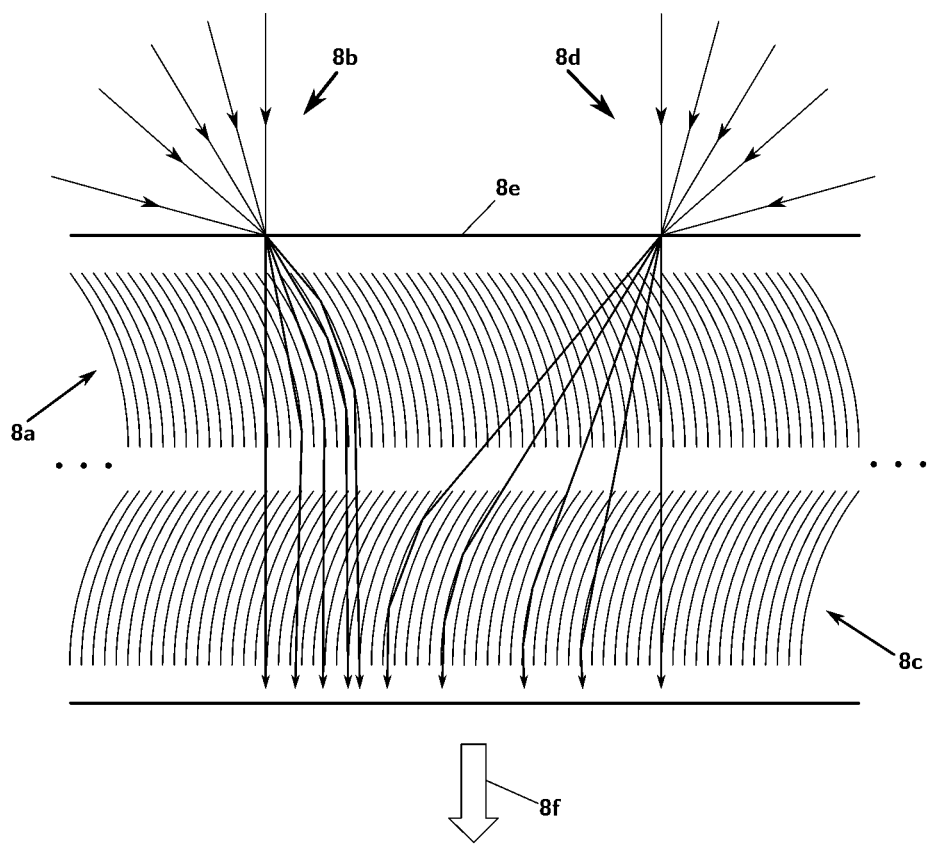
FIG. 8 shows in cross section a stack of two fluidic wave steering arrays configured to provide a full $\pi$ radians of wave steering in the plane of the figure.

FIG. 8 shows in cross section a stack of two π/2 radian light steering devices. A first light steering layer 8a can redirect light rays 8b, which are separated in time. Similarly, a second light steering layer 8c can redirect light rays 8d, which are also separated in time. This allows any light ray that is incident on a first surface 8e at any angle in the plane of the figure to be steered substantially into output direction 8f.

The device can also work in reverse so that light from a source of substantially parallel rays can be steered into any of π radians, substantially independent of wavelength and polarization. This is shown in more detail in FIGS. 9-13. For example in FIG. 9 a stack of two π/2 radian light steering layers 9a and 9b are formed in a solid (and potentially soft) transparent medium having a first optical surface 9c and a second optical surface 9d. Note, a π/2 radian layer can redirect light by as much as π/2 radians. In the configuration shown the π/2 radians is obtained from the electronically controllable waveguide arrays and the refraction that occurs at the second optical surface 9d. A light source (not shown) provides input light 9e that is directed (typically normally) to the first optical surface 9c. The π/2 steering layer 9b is deactivated by making it transparent—e.g. by filling it with IMF. The π/2 steering layer 9a is activated (e.g. by removing IMF) electronically allowing its waveguides to support TIR, which redirects all light into output light 9f, which has a direction that is substantially different than the input light 9e.

Figure 9:
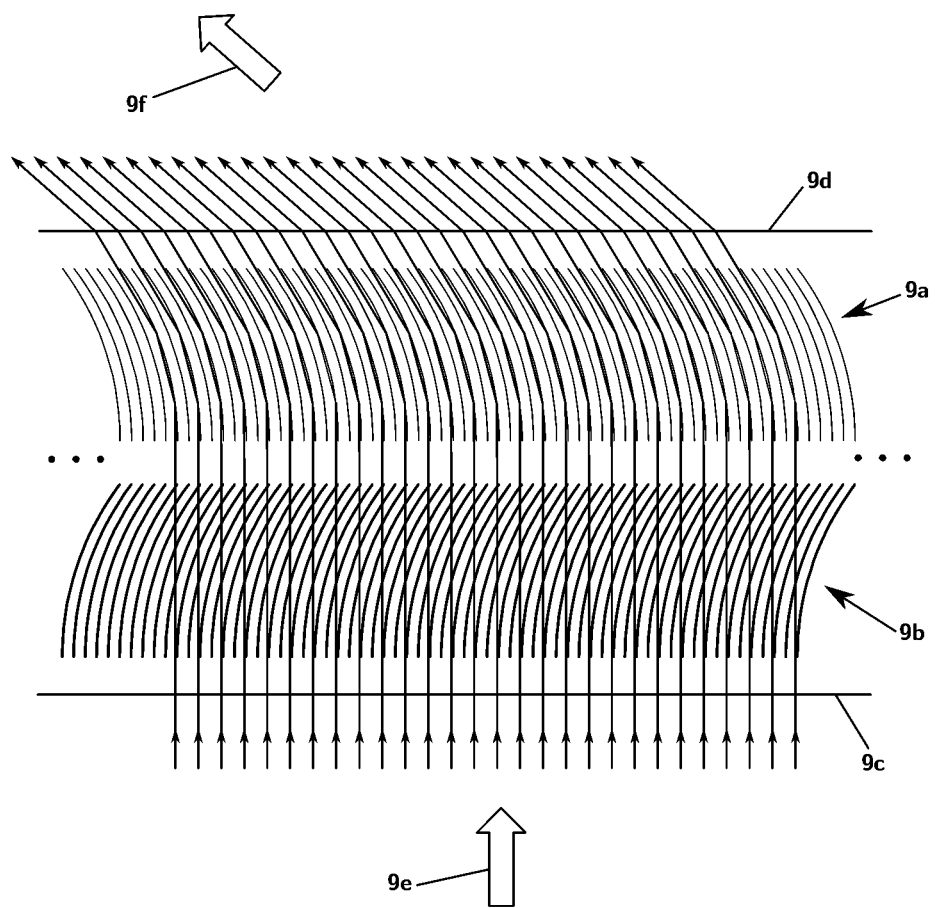
FIG. 9 shows in cross section a stack of two $\pi/2$ radian wave steering layers used in steering a collimated input beam to a negative output angle.
Figure 10:
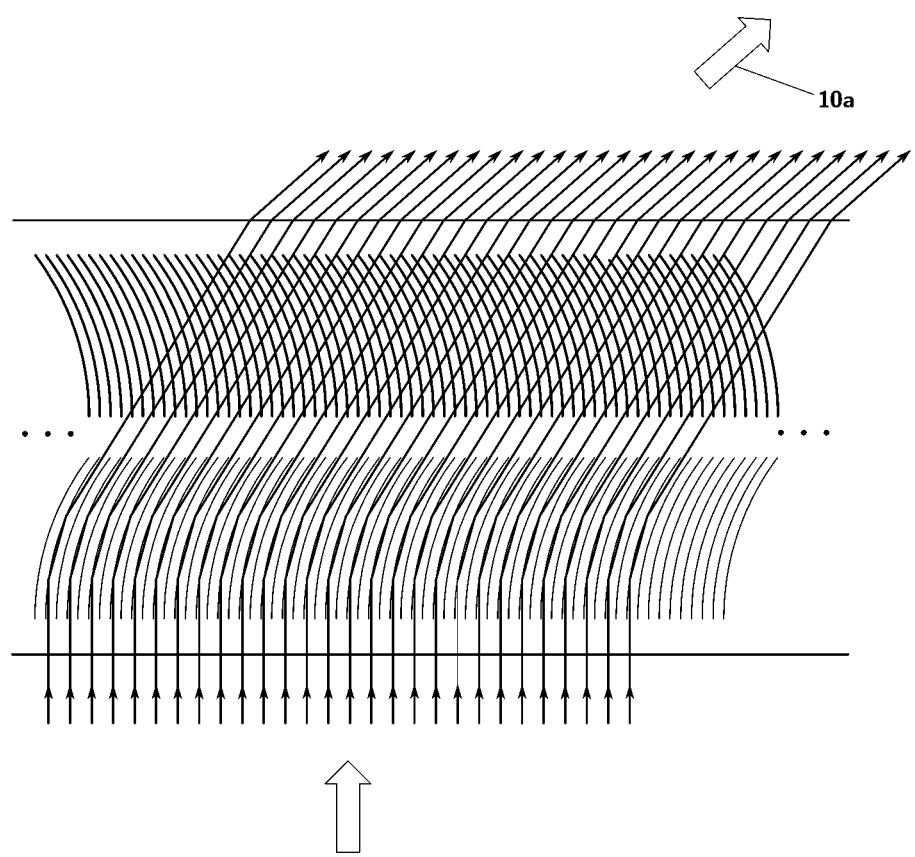
FIG. 10 shows in cross section a stack of two $\pi/2$ radian wave steering layers used in steering a collimated input beam to a positive output angle.

FIG. 10 shows the exact same system as in FIG. 9, but with a reversal of the configuration so that layers in FIG. 9 that are active (or non-active) become non-active (or active) in FIG. 10. The result is that light is steered into output light 10a, which is in a different direction than in FIG. 9.

Figure 11:
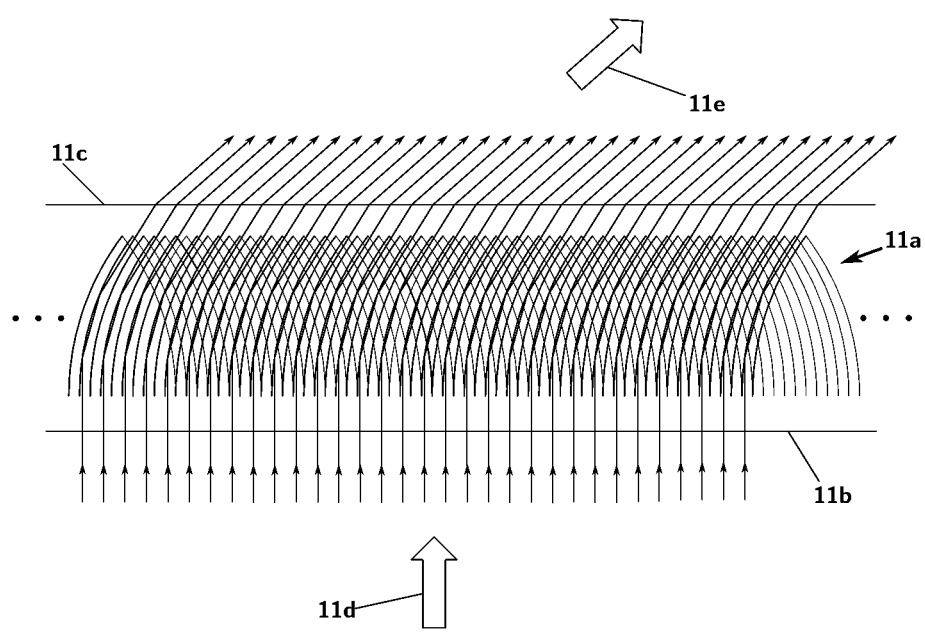
FIG. 11 shows in cross section a $\pi$-steering layer comprising two $\pi/2$-steering sections, which are all contained in the same material layer.

In FIG. 11 two π/2 radian steering layers are spatially multiplexed into a π radian layer 11a formed in a solid (but potentially soft) transparent medium having a first optical surface 11b and a second optical surface 11c. A light source (not shown) provides input light 11d that is directed (typically normally) to the first optical surface 11b. The π/2 steering layer 9a is deactivated by making it transparent using techniques discussed previously. Waveguides are electronically configured to support TIR, which redirects all light into output light 11e, which has a direction that substantially different than the input light 11d. Notice that this embodiment is especially useful with the SPBS devices as there may be no IMFs to leak between criss-crossed control channels.

Figure 12:
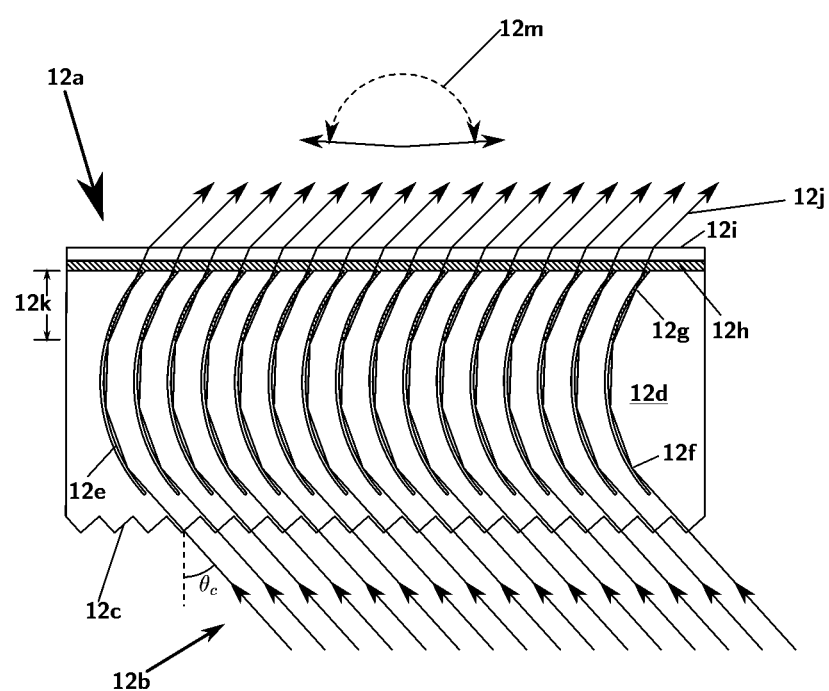
FIG. 12 shows in cross-section a wave steering device that is capable of $\pi$ radians of wave steering using only one group of control channels.
Figure 13:
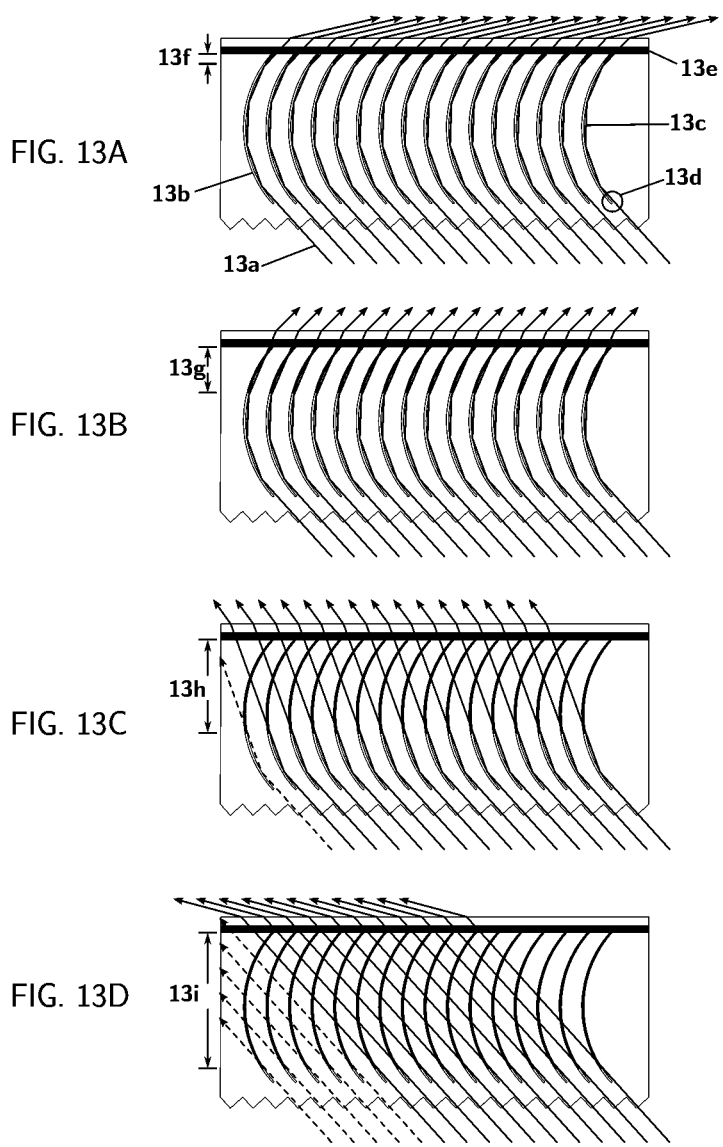
FIGS. 13A-D show a time sequence of a beam being steered by adjusting the injection depth of index matching fluid into microfluidic control channels.

Next we consider FIGS. 12-13. Note that these figures are not to scale because the curved fluid control channels would need to be spaced much closer together and the fluid control channels much thinner in practice. The depiction of the figures was chosen to allow easier visualization for the reader.

FIG. 12 provides an alternative beam steering embodiment based on a beam steering layer 12a that now provides up to a full π radians of steering, instead of the π/2 steering of the previous embodiments of a beam steering layer. In particular, incident light 12b from a source (not shown), is incident on an (optional) first surface 12c, which is typically made from a transparent glass or plastic. The first surface is configured with an array of steps to ensure light is always normal to the first surface so as to minimize reflection losses. Additionally, if the optional steps are not included then the incident light is at an angle no larger than the critical angle $\theta_c = \sin^{-1}(1/n)$ (assuming air as the surrounding medium) relative to the optical axis, where n is the refractive index of the transparent medium 12d.

There is an array of microfluidic control channels within the transparent medium, an example of which is 12e, and the light is consequently reflected by TIR at a plurality of locations along the control channel. Reflection occurs where the control channel contains a vacuum (or a gas). However, along that portion of the control channel where there is an index matching fluid the light is free to pass without loss or deflection. An example of a TIR active point is 12f and an example of refractive index matching fluid allowing the light pass is at a TIR non-active point 12g. The refractive index matching fluid 12h is provided from a reservoir channel by one of a number of actuation processes already described. Finally, the light exits a second surface 12i, where it is refracted into output rays, an example of which is 12j, having a desired output direction. In this way the injection depth 12k of the refractive index matching fluid in the control channels provides optical beam steering. The full angular steering range 12m of about π radians is possible. Note that properly setting the separation between control channels sets the angular resolution and the control channels width sets the device losses. Control channels are 1-10 μm wide with waveguides widths of 50-500 μm are also typical for visible light. As always, the rays may be reversed so that the beam steering transmitter becomes a beam steering receiver and vice versa. Additionally, multiple beam steering layers may be combined to provide 4π steradians of light steering—hemispherical coverage.

FIG. 13 shows a time sequence of light steering for incident light 13a that has a fixed input direction, just as in FIG. 12. The light is redirected by the microfluidic control channels, and example of which is 13b, that supports gallery rays, an example of which is 13c. The leading edge of the microfluidic control channels is 13d. The output side of the beam steering device in this example has a IMF reservoir 13e. FIG. 13A shows the steered rays for the case when the IMF injection depth 13f is near zero. FIG. 13B shows the steered rays for the case when the IMF injection depth 13g is larger than 13f. FIG. 13C shows the steered rays for the case when the IMF injection depth 13h is larger than 13g. FIG. 13D shows the steered rays for the case when the IMF injection depth 13i is larger than 13h and almost completely fills the microfluidic control channel. The actuation system is not drawn in FIG. 13 to reduce clutter and focus the reader's attention towards the optical configuration. Additionally, the output angle is given in terms of the IMF injection depth by $$\theta = \frac{\pi}{2} - \sin^{-1}\left[1 - \frac{d}{r}\csc\theta_c\right],$$

where d is the IMF injection depth, $\theta_c$ is the TIR critical angle, r the radius of the mirrors, IMF depth is $0 \le d \le 2r \sin \theta_c$ and $0 \le \theta \le \pi$.

It is also worth pointing out that the steering of waves, as depicted by rays pointing in the direction of wave propagation shown in FIG. 13 can be useful for embodiments in both forward and reversed propagation directions. Such waves include light waves, sound waves and other forms of wave energy. In the case of light the presence of an IMF allows the light to pass and the absence of an IMF allows reflection by TIR. For sound waves the IFM does exactly the same thing, however the absence of an IMF leaves a vacuum in the control channel and a vacuum never supports a sound wave so that the wave reflects off of the solid-vacuum boundary. An IMF for light would be transparent to optical radiation match the speed of light in the solid and IMG. An IMF for sound would also substantially match the speed of sound in the solid and the fluid and be transparent to sound waves. Obviously the physical scale of the structures for light and sound waves would be different but the same steering principles would still apply. For micro-wave, millimeter-wave, or other long-wavelength electromagnetic bands the use of a plasma for the IMF is also possible. Although the term IMF in the case of a plasma is less descriptive (as there is no fluid) the reader should appreciate that it may be considered for the purposes of this document to be soft matter (i.e. not solid rigid matter). In the case of a plasma, its absence would allow radiation to pass while the presence of the plasma would reflect the radiation. Different forms of IMF actuation and control would typically be needed in different applications due to the differences in scale or phase of matter used for the IMF, but the underlying method for steering a wave remains the same. Moreover, the principles also apply to embodiments comprising flat channels, such as those shown in FIGS. 20-22.

Figure 14:
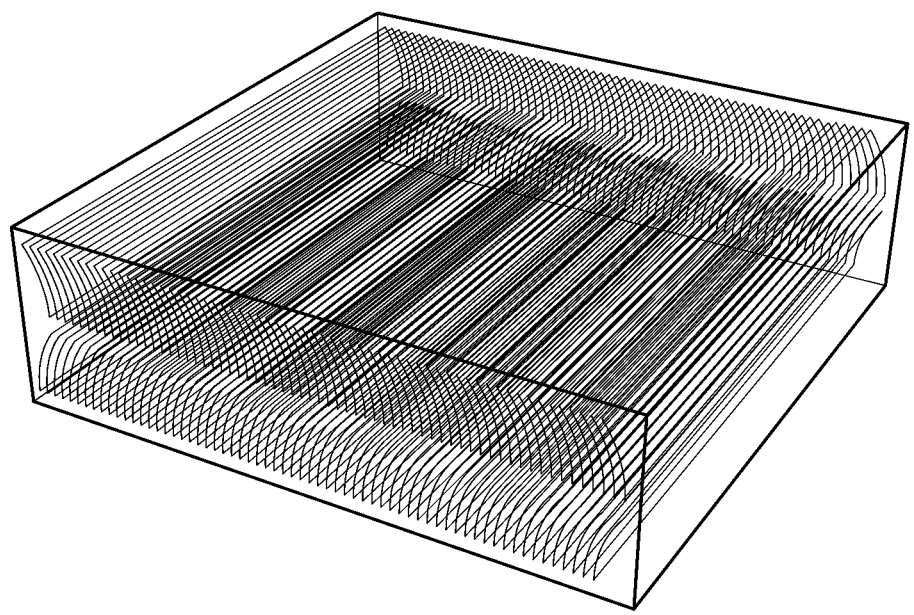
FIG. 14 shows in perspective a stack of two fluidic wave steering arrays to provide a full $\pi$ radians of wave steering in one principle plane.
Figure 15:
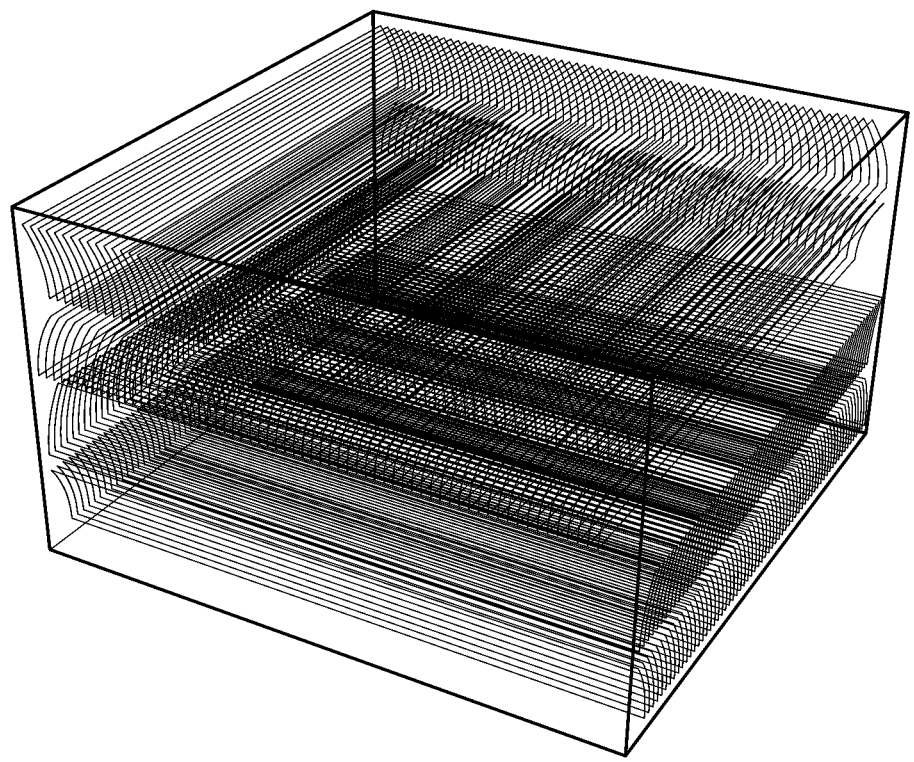
FIG. 15 shows in perspective a stack of four fluidic wave steering arrays to provide a full $2\pi$ steradians of wave steering into a hemisphere.

FIG. 14 is a three-dimensional perspective of a light steering system providing one degree of freedom and π radians of potential light steering capacity by using two π/2-beam steering sections. FIG. 15 is a three-dimensional perspective of a light steering system providing two degrees of freedom and 2π steradians of potential light steering capacity in to a hemisphere. Four π/2-beam steering sections are used. The two degree of freedom system is possible because a light ray that is tilted into or out of the plane of FIG. 8 can propagate through the waveguides with only its in-plane component of linear optical momentum changing. This allows other steering layers to be systematically rotated by π/2 radians to allow steering of light received or transmitted into any direction of a 2π steradians of a hemisphere. For example, the reader can see that the upper two layers are repeated and rotated by π/2 radians in the bottom two layers of FIG. 15.

Figure 16:
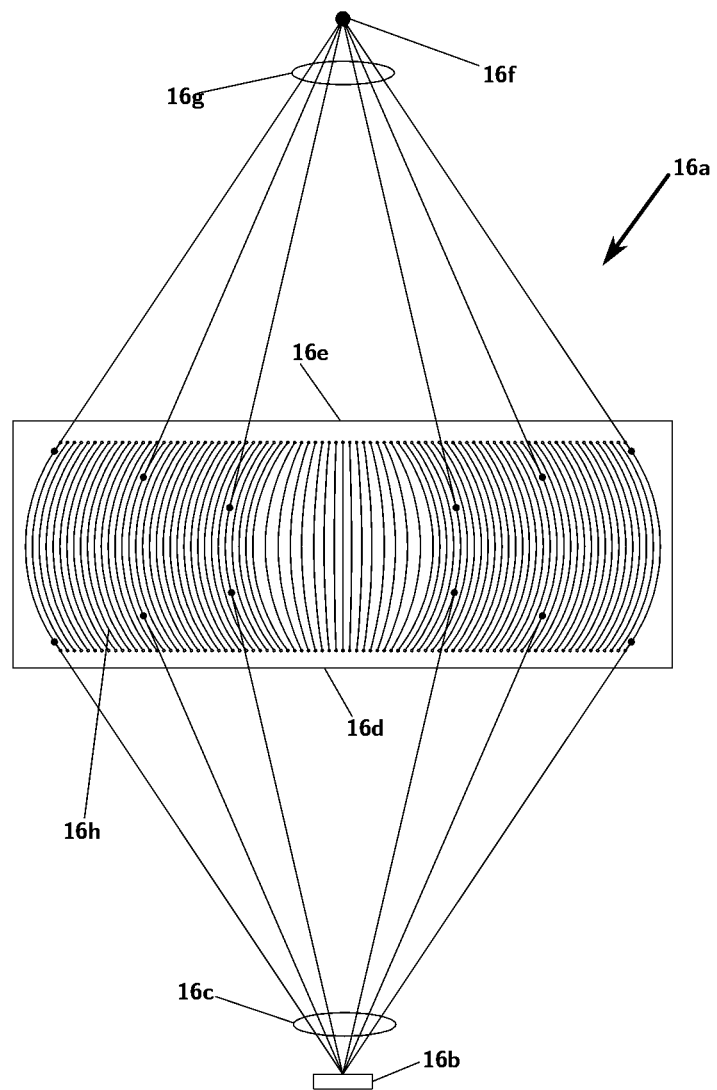
FIG. 16 shows in cross section a variable focus lens based on electronically controlled soft matter.

FIG. 16 slows in cross section an electronically controlled variable focus and light distribution lens 16a based on controlling the flow of light using electronics to configure a plurality of waveguides. A light transducer 16b, which may be either a source of light or a receiver of light is shown. Examples of light sources include, but are not limited to: light emitting diodes (LED) and lasers. Examples light receivers include, but are not limited to: solar cells and devices for image capture.

The light transducer 16*b* emits or receives a first bundle of rays 16*c*. These rays pass through a plurality of waveguides defined by adjacent fluidic control channels. An example of a schematic representation of a microfluidic control channel, which is used to contain and control an IMF, is 16*h*. Electrode and other fluidic control mechanism are suppressed in the figure to remove clutter and the reader can refer to other parts of this disclosure to see IMF actuation embodiments. The fluidic control channels and waveguides are shown between a first surface 16*d* and a second surface 16*e*. The fluid in the fluidic control channels is configured so that light is easily accepted by the waveguides so that light sourced or received from the light transducer 16*b* is received or sourced from/to the far field point 16*f* by means of a second bundle of rays 16*g*.

Figure 17:
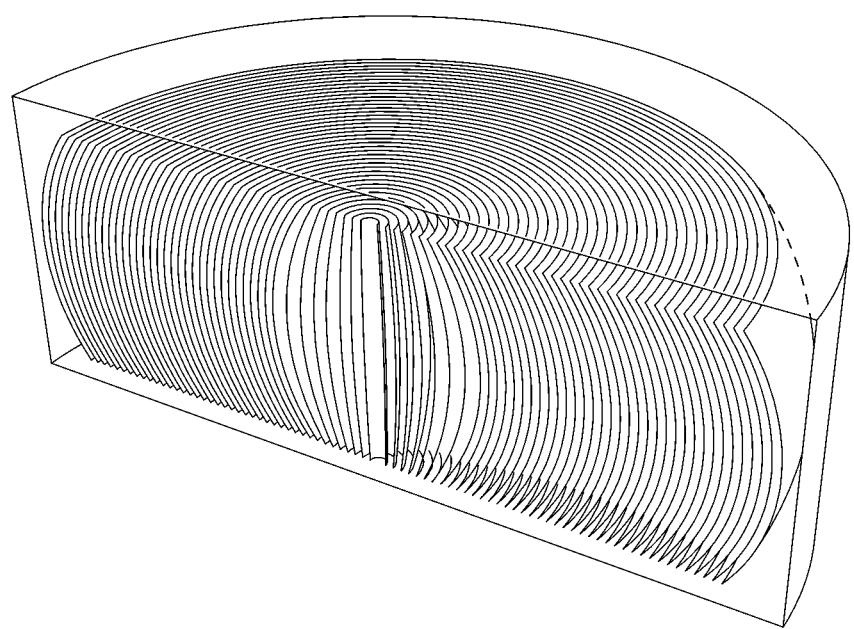
FIG. 17 shows in perspective a cross sectional cut through a variable focus lens based on electronically controlled soft matter.

FIG. 17 shows a three dimensional perspective of FIG. 16 when rotated about an optical axis. Again, this figure suppresses everything (including IMF reservoir) except the location of the microfluidic control channels so that the reader can see where IMF would be injected and extracted from.

Figure 18:
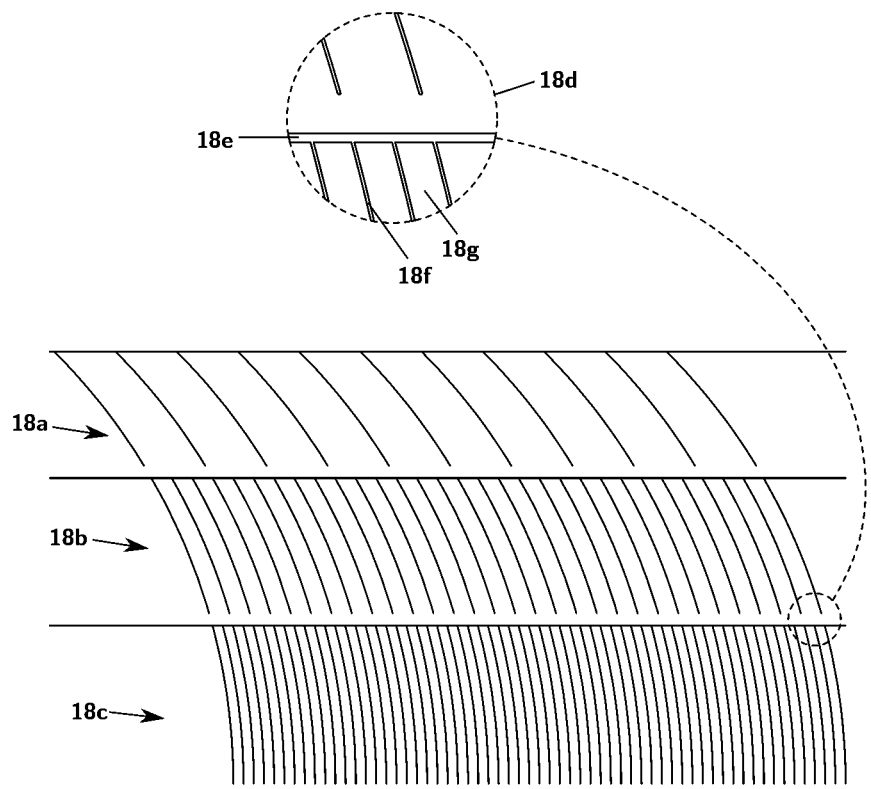
FIG. 18 shows in cross-section a geometry for control channels, which are used to maintain or improve the angular extent of steered waves and provide vernier control of the angular extent.

FIG. 18 shows three LPBS devices that are stacked into three layers, however in general more or less layers and SPBS are also possible. A first steering layer 18*a*, a second steering layer 18*b* and a third steering layer 18*c* are shown. These layers are feed from an index matching fluid reservoir that has reservoir channels running left-to-right in the figure. This is shown in the magnified view 18*d* where the reservoir channel 18*e* feeds into cladding control channels such as 18*f*, and all light propagation is within the waveguide 18*g*. This geometry provides a means to improve the angular resolution of the overall steering.

Figure 19:
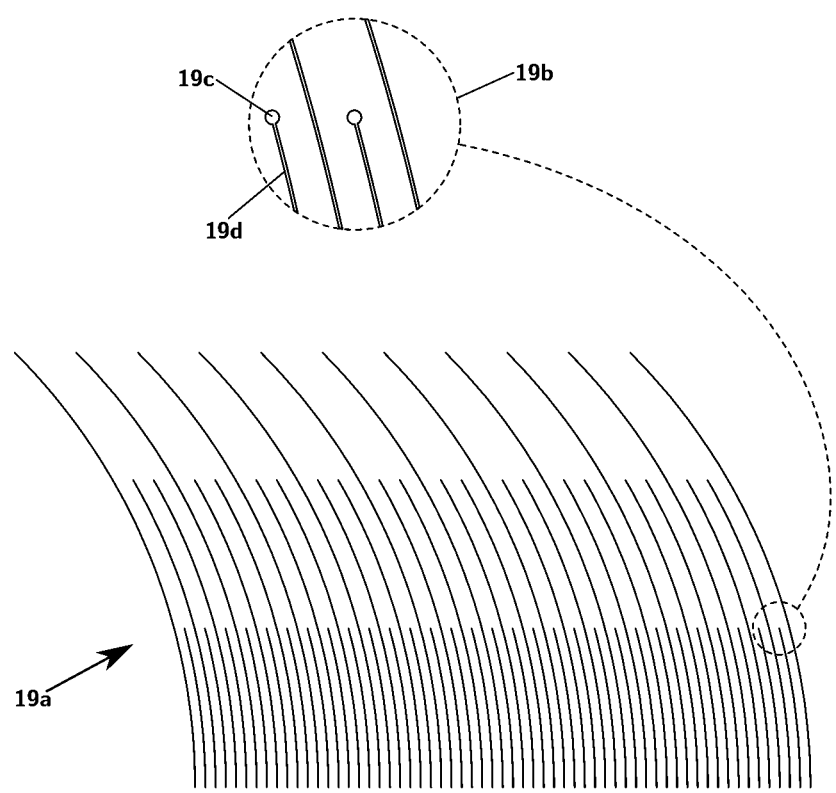
FIG. 19 shows in cross-section an alternate geometry for control channels, which is used to maintain or improve the angular extent of steered waves.

Similarly, FIG. 19 shows three LPBS devices that are interdigitated into a three layer steering device 19*a*. The magnified view 19*b* shows reservoir channels that are directed into the page of the figure, an example of which is 19*c*. Index matching fluid control channels, such as 19*d*, are connected to the reservoir channels. The control channels may also be directly connected to the index matching fluid reservoirs.

Figure 20:
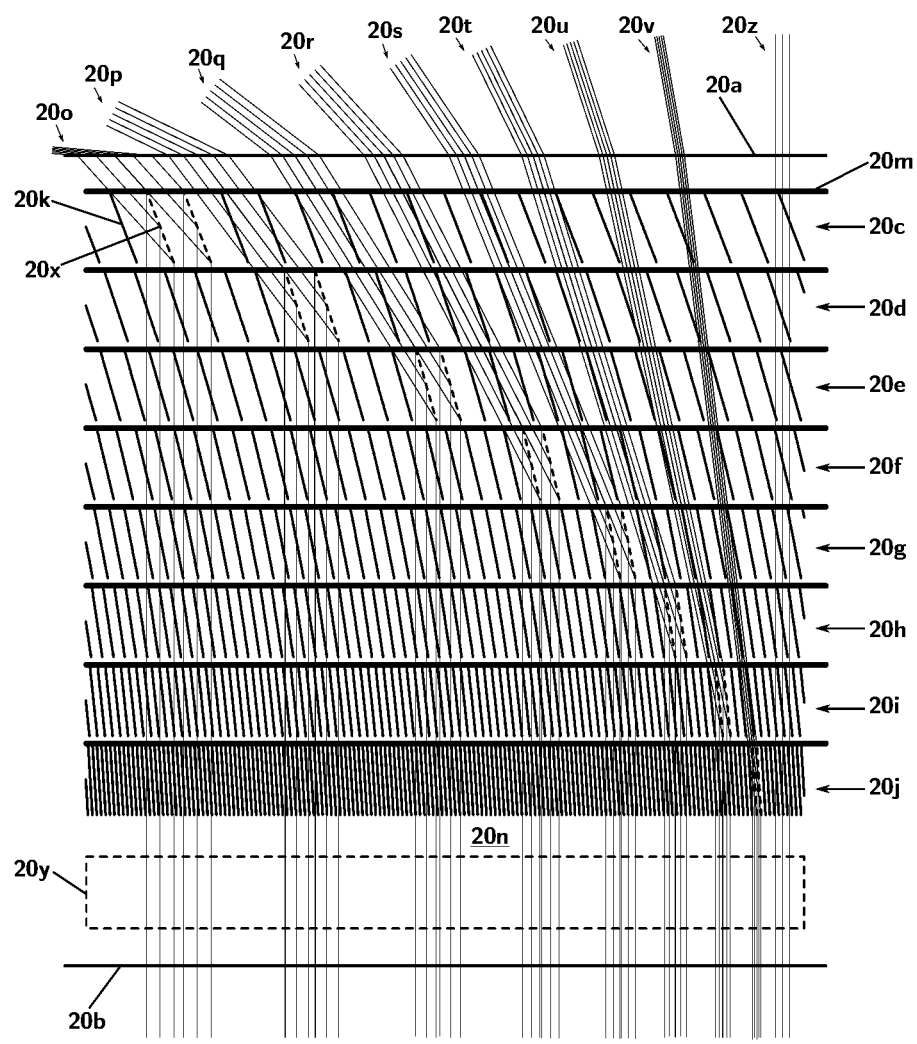
FIG. 20 shows in cross section a multilayer wave steering device, with each layer comprising an array of flat microfluidic control channels.

FIG. 20 shows a beam steering device comprising a plurality of layers that are have fluidic control channels that are flat line segments in cross section—i.e. radius of curvature is infinite. This has the advantage that input rays that are parallel are steered into output rays that are also perfectly parallel. Each of the layers shown has the same thickness, however, this is not a requirement and embodiments exist where each layer may have a different thickness. Also, each layer shown has an array of control channels with a different number of fluidic control channels per unit length, however, this is not a requirement and embodiments exist where each layer has a constant number of fluidic control channels per unit length. One of the key advantages of this embodiment is that layers either reflect or transmit. This discrete state, essentially digital, operation allows a strong forcing function to be applied to the fluids to overcome environmental noise. For example, a temperature gradient across the device would not result in index matching fluid traveling a different injection depth as a function of position.

FIG. 20 shows a first surface 20*a* and a second surface 20*b* of a solid transparent medium between which are located a plurality of microfluidic steering layers: 20*c*, 20*d*, 20*e*, 20*f*, 20*g*, 20*h*, 20*i* and 20*j*.

Each steering layer has an array of fluidic control channels. An example of a IMF control channel is 20*k*, which is shown schematically as a line in the figure, but the reader is to understand that it is a channel such as that shown in FIG. 2 or any number of other examples in this disclosure. Additionally, each layer has access to an IMF reservoir, which may be individual or shared. In FIG. 20, we see that each steering layer has its own IMF reservoir, an example of which is 20*m*.

Additionally, each steering layer is associated with a specific range of steering angles. For example, assuming that the refractive index of the transparent medium 20*n* is 1.494 (e.g. Acrylic) then we can create steering layers that are each 1 mm thick such that steering layer 20*c* has about 19 control channels per centimeter (19 $cm^{-1}$) and also has associated with it parallel steered light rays 20*o*, which may range in angle from about 90°-72° from the normal direction to the first surface first surface 20*a*. The steered light rays 20*o* reflect off of control channels in steering layer 20*c* by means of TIR, an example of TIR occurs at fluidic control channel 20*x*, when steering layer 20*c* has no IMF within its fluidic control channels and all the other steering layers do have IMF within their fluidic control channels. The steered light rays 20*o* also refract at the first surface 20*a*. Note that the nine different sets of rays shown in FIG. 20 are typically not sent through the device at the same time, but rather may be thought of as a time sequence of different rays that are being scanned in angle at different times with different layers having IMF removed or inserted as needed.

Similarly, steering layer 20*d* has a channel density of 24 $cm^{-1}$ and also has associated with it steered light rays 20*p*, which may range in angle from about 72°-58° from the normal direction to the first surface 20*a*. Similarly, steering layer 20*e* has a channel density of 30 $cm^{-1}$ and also has associated with it steered light rays 20*q*, which may range in angle from about 58°-48° from the normal direction to the first surface 20*a*. Similarly, steering layer 20*f* has a channel density of 37 $cm^{-1}$ and also has associated with it steered light rays 20*r*, which may range in angle from about 48°-38° from the normal direction to the first surface 20*a*. Similarly, steering layer 20*g* has a channel density of 48 $cm^{-1}$ and also has associated with it steered light rays 20*s*, which may range in angle from about 38°-30° from the normal direction to the first surface 20*a*. Similarly, steering layer 20*h* has a channel density of 64 $cm^{-1}$ and also has associated with it steered light rays 20*t*, which may range in angle from about 30°-22° from the normal direction to the first surface 20*a*. Similarly, steering layer 20*i* has a channel density of 93 $cm^{-1}$ and also has associated with it steered light rays 20*u*, which may range in angle from about 22°-15° from the normal direction to the first surface 20*a*. Similarly, steering layer 20*j* has a channel density of 162 $cm^{-1}$ and also has associated with it steered light rays 20*v*, which may range in angle from about 15°-6° from the normal direction to the first surface 20*a*. Finally, an optional vernier steering layer 20*y* may be provided by means of another light steering mechanism (not shown in FIG. 20) so that it has steered light rays 20*z*, which deviate by up to ±6° from the normal to the second surface 20*b* within the transparent medium 20*n*. The vernier layer may also correct for any deviations away from normal for light rays steered from other layers. NOTE: the numbers provided above are only a representative example and should not be construed to limit the number of layers, angles, or any other parameter. Additionally, the device's control channels may be formed, for example, by translation or by revolution about a vertical axis of the cross section shown. Additionally, for the avoidance of doubt the fluidic control channels are schematically shown as dashes lines to imply vacuum or gas filled control channels—see for example control channel 20*x*. Also, fluidic control channels are schematically shown as solid lines to imply a refractive index matching fluid is filling the control channel—see for example control channel 20*k*.

Figure 21:
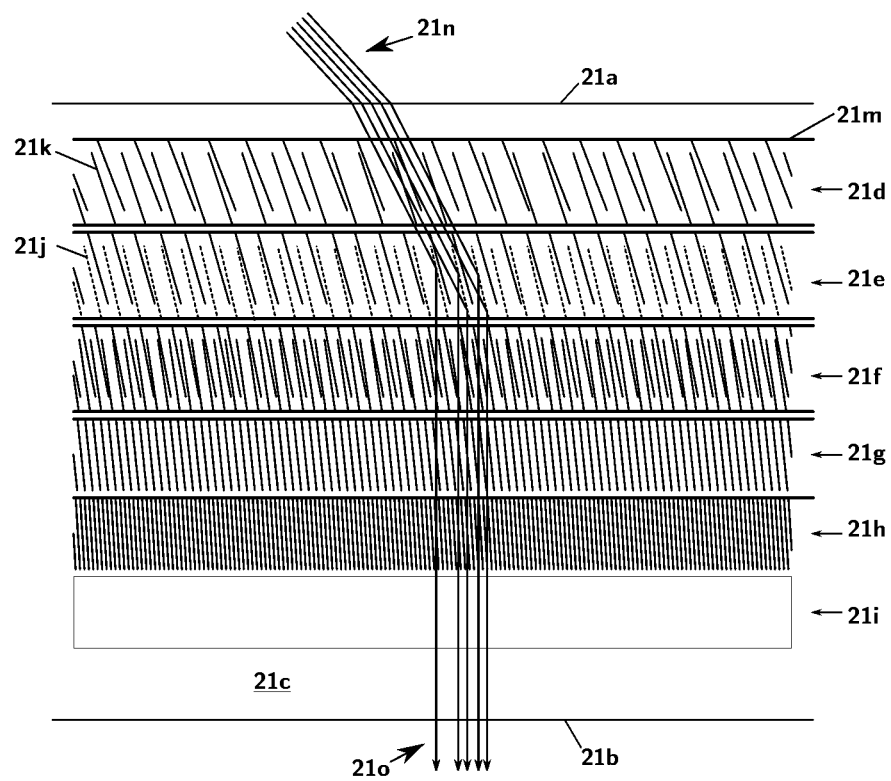
FIG. 21 shows in cross section a multilayer wave steering device, with each layer comprising an array of flat microfluidic control channels that are multiplexed for a plurality of different angular ranges.

FIG. 21, shows schematically how several layers from FIG. 20 may be combined to allow a thinner device. By multiplexing different angular ranges into the same physical layer it is possible to reduce the overall device thickness. This typically requires an aperiodic array of microfluidic control channels to avoid having a control channel of one angular range overlapping the control channels of another angular range. The control channel arrays in FIG. 21 are slightly aperiodic to ensure that all fluidic control channels are separate. Again, in FIG. 21 solid lines internal to the device indicate that there is an refractive index matching fluid and dashed lines indicate that there are fluidic control channels having vacuum internal to the device.

In particular, FIG. 21 shows a first surface 21*a* and a second surface 21*b* between which is located a transparent solid 21*c* having voids within which refractive index matching fluid may be injected. Furthermore, the internal structure is substantially that of steering layers. Multiplexed steering layers include 21*d*, 21*e*, 21*f* and non-multiplexed steering layers include 21*g* and 21*h*. An optional vernier steering layer 21*i* provides fine adjustments to the direction of propagation. The vernier steering layer may be implemented using any compatible technology. As in the previous figure fluidic control channels are schematically shown as dashes lines to imply vacuum or gas filled control channel—as was done in FIG. 20. Also, fluidic control channels are schematically shown as solid lines to imply a refractive index matching fluid is filling the control channel—see for example control channel 20*k*. Each array of control channels is feed from a fluidic distribution line and reservoir, an example of which is 21*m*. The particular configuration shown in FIG. 21 redirects input light 21*n* to output light 21*o*. Also, it is to be understood that the control channels are sheet voids—i.e. voids that extend into the page.

Figure 22:
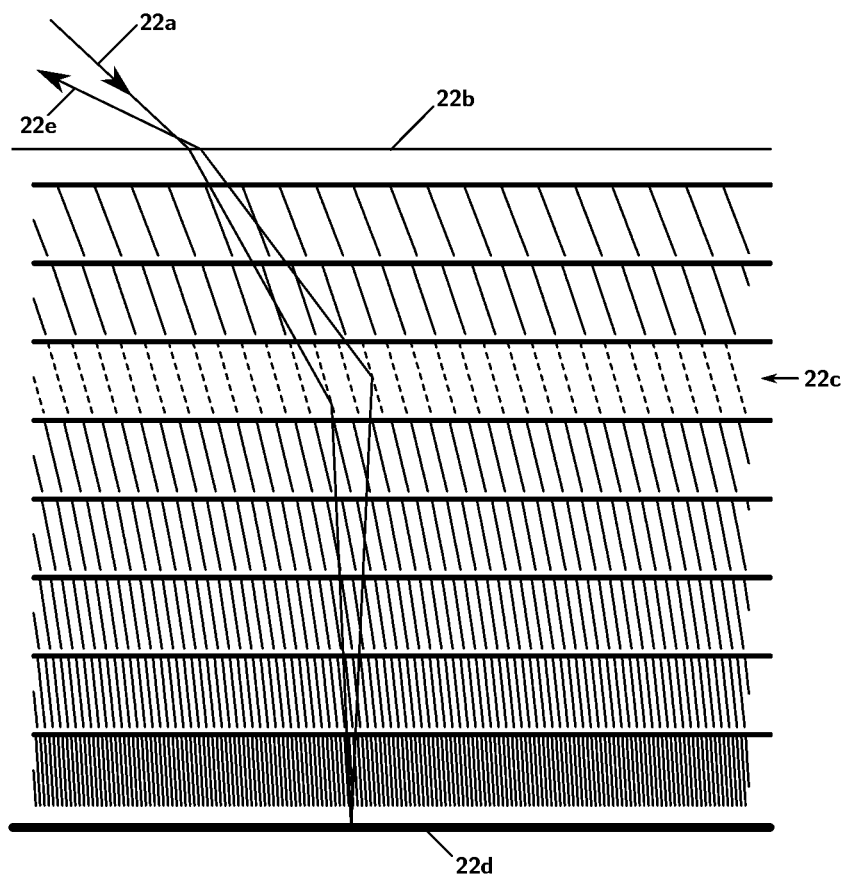
FIG. 22 shows in cross section a multilayer wave steering device that is based on reflection instead of transmission of waves and comprises an array of flat microfluidic control channels.

FIG. 22 is similar to FIGS. 20-21 except that the input and output rays are on the same side of the device. This may be accomplished by using a reflective surface such as, but not limited to a mirror, a reflective grating, a reflective hologram or a photonic crystal. In particular, input ray 22*a* refracts into the device at the first surface 22*b* and is redirected by TIR at active steering layer 22*c*. The light passes through all the other internal layers because they have been filled with refractive index matching fluid and reflection of refraction therefore become impossible at those locations. At the bottom of the device is a reflective surface 22*d* that sends the light back into the volume of the light steering device so that it can interact with the active steering layer 22*c* and the first surface 22*b* and emerge as output ray 22*e*. This device can be used in many application, an example of which is as a heliostat that redirects sunlight to a receiving tower.

While FIGS. 20-22 show only one active layer at a time, however it is clear that an obvious extension to the embodiments is that multiple beam steering layers can be configured as active mirrors simultaneously. The layers would need to be coordinated by an external set of activation signals. This vastly increases the number of ways of steering light into a particular direction because both sums and difference of angles are possible as light is steered sequentially in the positive or negative angular directions at each steering layer. This provides additional degrees of freedom to the embodiments to make the overall light steering devices thinner and have smaller steering errors—i.e. higher steering resolution. In such cases the complexity of the IMF injection signals increase but the hardware, which now has a smaller number of layers, becomes less complex.

Figure 23:
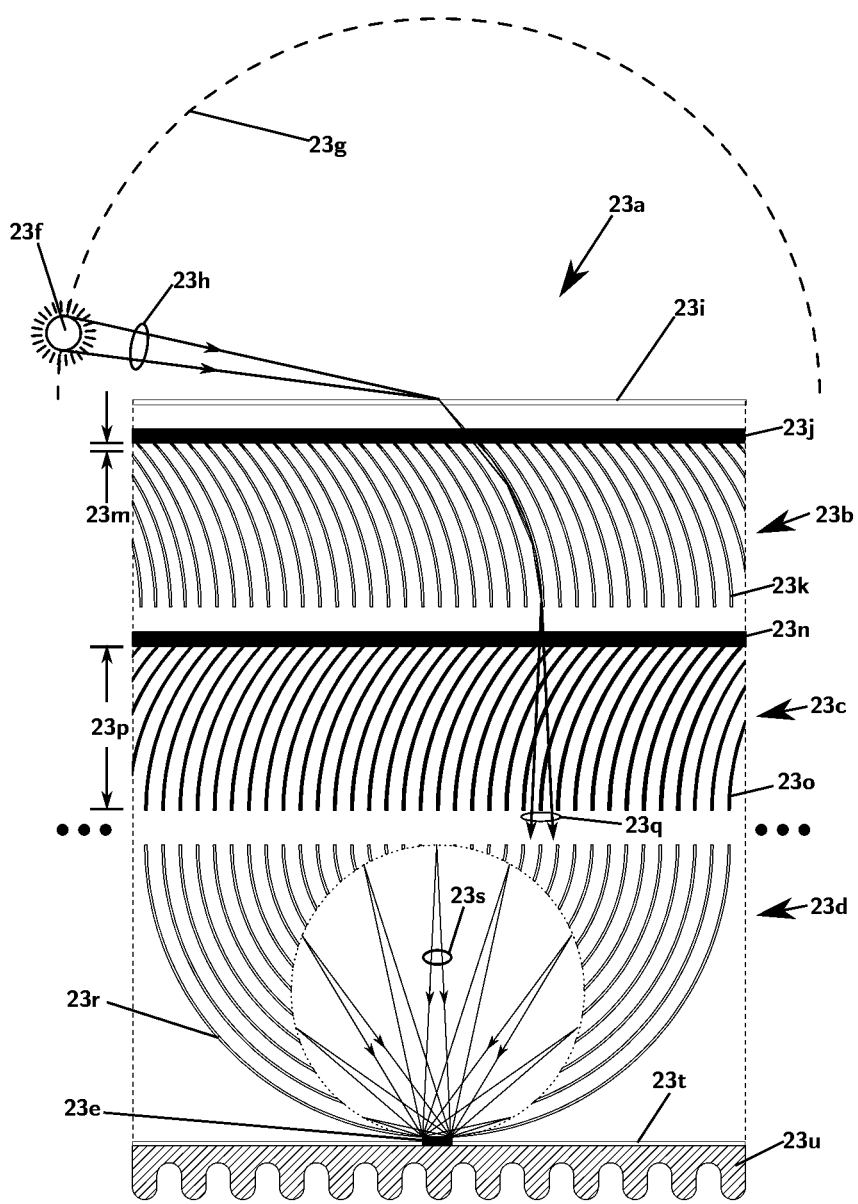
FIG. 23 shows in cross-section a portion of a concentrating solar panel having a one degree of freedom integrated tracking system during the early morning.
Figure 24:
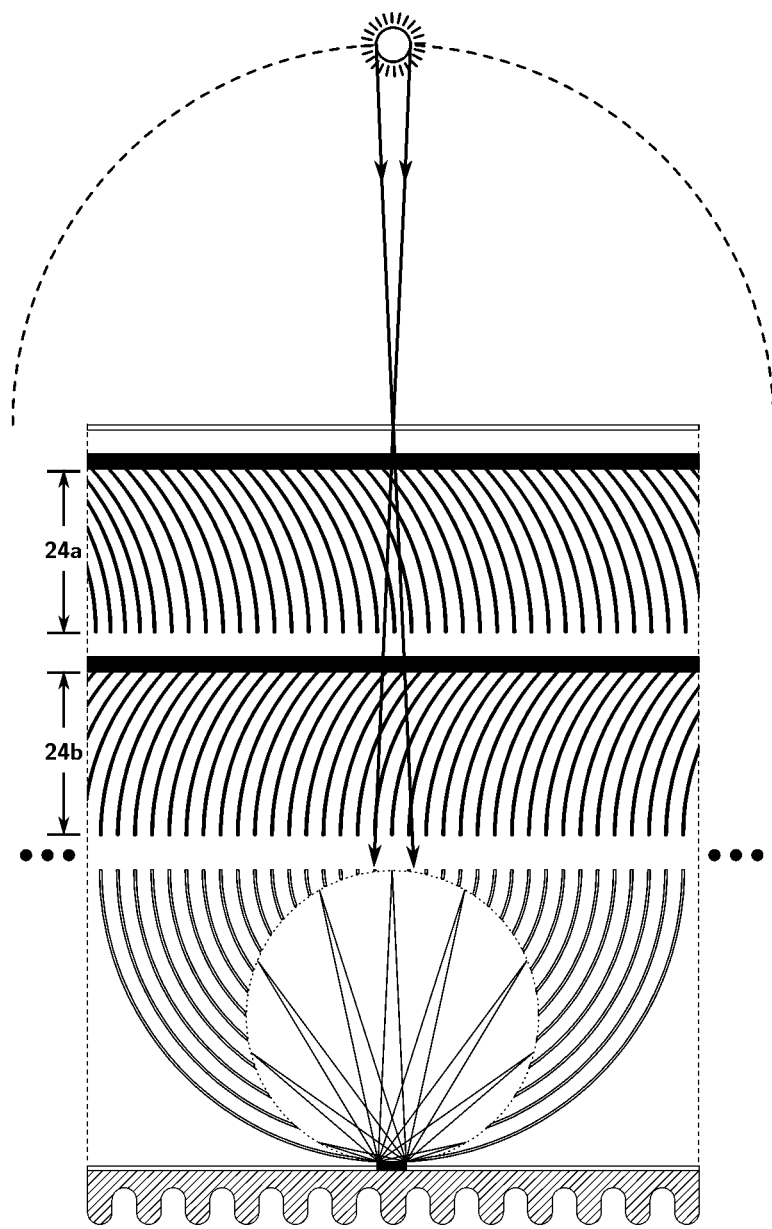
FIG. 24 shows in cross-section a portion of a concentrating solar panel having a one degree of freedom integrated tracking system near noon time.
Figure 25:
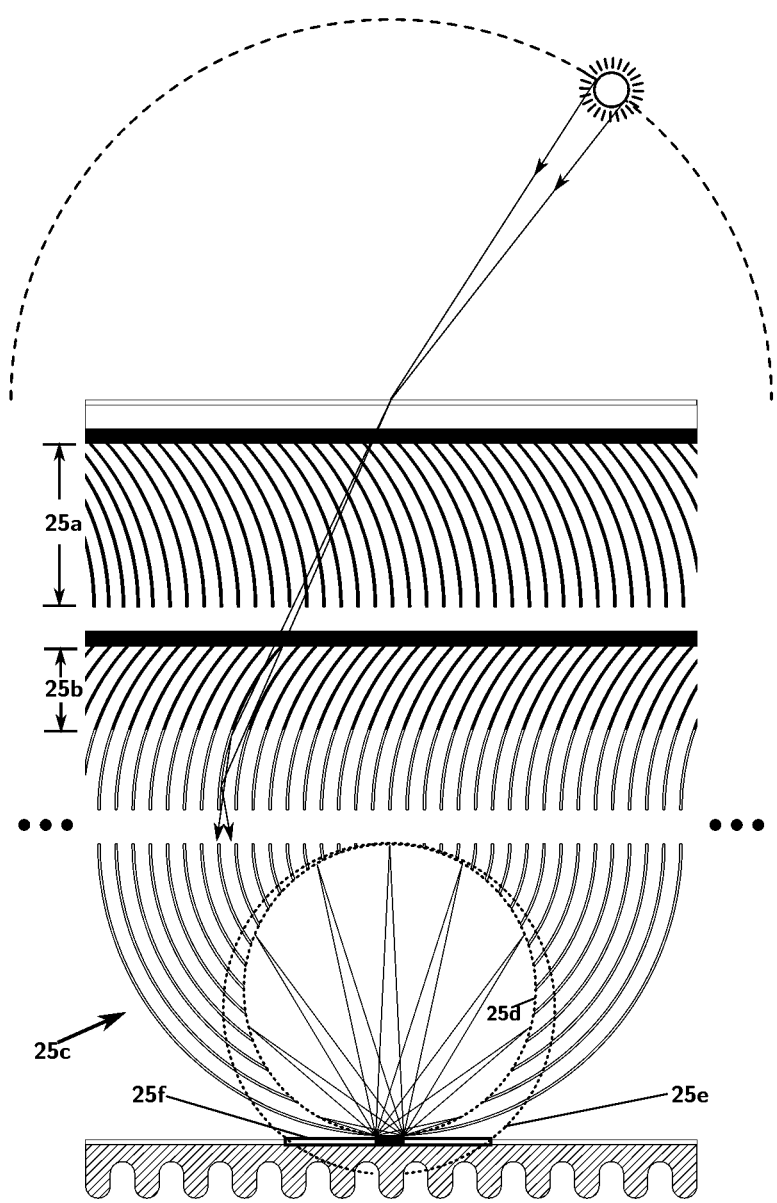
FIG. 25 shows in cross-section a portion of a concentrating solar panel having a one degree of freedom integrated tracking system during mid afternoon.

FIGS. 23, 24 and 25 show a time-sequence of a light steering system that shows how light from a remote source, such as but not limited to the the sun, is steered to a receiver like a photovoltaic cell. The rays in these figures may also be reversed so that the receiver becomes a light source, like a light emitting diode, and the steered light is transmitted into a large range of angles.

In particular, FIG. 23 shows a unit-cell of a concentrating solar panel 23*a* that integrates a first tracking layer 23*b* and a second tracking layer 23*c* with a concentrator 23*d* and a photovoltaic solar cell 23*e*. The sun 23*f* follows a trajectory 23*g* across the sky and emits a bundle of input rays 23*h* that refracts at first surface 23*i* into the first tracking layer 23*b*. In FIG. 23 the sun is shown in the early morning position with east to the left and west to the right so that the observer (reader) is south facing. The first tracking layer has an IMF reservoir 23*j* that feeds into vacuum (or partial vacuum) filled control channels, an example of which is 23*k*. The first tracking layer has index matching fluid injected into the control channels to an injection depth 23*m*, which activates the majority of each control channel and allows TIR and waves to steer the light downwards in the figure. Additionally, the second tracking layer 23*c*, having reservoir 23*n* is configured so that index matching fluid is injected into its control channels, an example of which is 23*o*. The index matching fluid injection depth 23*p* is show as completely filling the control channel so that steered ray bundle 23*q* passes undeviated through the second tracking layer 23*c*.

Although in general any optical concentrator may be used to concentrate the resulting steered light to the solar cell in FIG. 23 we see a concentrator based on an extension and modification of the geometry discussed in the text "Nonimaging Optics", by R. Winston et. al., ISBN: 0-12-759751-4, page-139. In particular, the concentrator uses control channels 23*r* that have a vacuum therein and within which index matching fluid may be injected to defocus the concentration and allow a means to better match the étendue of the input sun's rays to the optical system. This is critical in cases where the sun's rays have been partially scattered by aerosols in the atmosphere thereby inducing a diffuse component to the solar insolation. Consequently, the ray bundle 23*q* is mapped into a plurality of ray bundles, such as 23*s*, which converge onto the solar cell solar cell 23*e*. The energy of the sunlight is converted into electricity and distributed as electricity using electrical connection such as 23*t* and any residual heat is dispersed from the attached heat sink 23*u*. NOTE that the concentrator shown in the above cited Winston text is does not have to be based on quasi whispering gallery waves, moreover the Winston text and its references do not teach or anticipate using whispering gallery waves, which is one possible alternative embodiment for the concentrator described herein, which is affected by means of the spacing between control channels.

FIG. 24 shows the same system as FIG. 23 except that the sun is at the noon angular position. Both steering layers are now deactivated by full injection index matching fluid into all control channels. Hence the injection depths 24*a* and 24*b* are both at their maximum.

FIG. 25 shows the same system as FIG. 23 except that the sun is at the after noon angular position. The first steering layer on top is deactivated by full injection index matching fluid into all control channels so that the injection depth 25*a* is maximum and the second steering layer 25*b* has an injection depth that is about half of the maximum. Additionally, the concentrator control channels 25*c* may be partially filled with index matching fluid, between a first fluid boundary 25*d* and a second fluid boundary 25*e*, so as to reduce the level of ideal concentration for a secondary solar cell 25f. This is useful when atmospheric aerosols cause the non-diffuse component of sunlight to increase the effective angular extent of the sun. Thus, the concentrator can be made to dynamically adapt to the environment.

Thus control of the depth of injection depths 25a and 25b of the index matching fluid into the tracking layers controls the tracking angle of the sun, while the depth of injection of index matching fluid into the concentrator between boundaries 25d and 25e helps to focus the sunlight onto a solar cell, or series of concentric solar cells so that diffuse atmospheric sunlight is better able to be collected. The most efficient multi-junction solar cells would be at the center of the concentric stack and the least efficient on the edges. The above discussion was for a photovoltaic application, however it is clear that with minor a solar thermal application is also possible.

An alternate configuration for deploying a microfluidic sunlight steering collector-concentrator system can provide a 50% reduction in the thickness and cost of the microfluidic light steering panels while simultaneously providing concentration of sunlight. The strategy is based on observing that tracking the sun from north-to-south (NTS) requires essentially half the angular tracking capability compared to tracking the sun east-to-west (ETW). For a 1-axis (1-degree-of-freedom) tracker NTS tracking historically has not made any sense for prior-art-systems because the sun moves predominantly in the ETW direction. However, when the curvature of the fluidic channels is directed NTS then by Fermat's principle and the variational calculus it can be shown that light propagating along curved microfluidic mirrors traverse a geodesic helix.

In particular, by Fermat's principle we know that a light ray in going from point A to point B must traverse an optical path length that is stationary with respect to variations of that path. Consequently, the variation $\delta$ of the action integral must be zero $$\delta \int_A^B ds = 0, \tag{1}$$

where ds is a differential element of optical path length. The trajectory is a path in three dimensional space that is restricted to the manifold provided by a control channel. In cylindrical coordinates the line element ds is $$ds = n\sqrt{\left(\frac{dr}{d\sigma}\right)^2 + r^2\left(\frac{d\phi}{d\sigma}\right)^2 + \left(\frac{dz}{d\sigma}\right)^2}\, d\sigma \tag{2}$$

$$= n\sqrt{\dot{r}^2 + r^2\dot{\phi}^2 + \dot{z}^2}\, d\sigma \tag{3}$$

$$= L\, d\sigma \tag{4}$$

where n is the constant refractive index of the rigid transparent solid forming the control channels, r is the radius of the cylinder, $\phi$ is the cylinder's polar angle, z is the cylinders z-coordinate which is directed from ETW, $\sigma$ is the parameterization of the trajectory and L is the Lagrangian. Moreover, as the Lagrangian L is not an explicit function of the parameterization $\sigma$ we may consider the more convenient $L^1 = L^2$ as the effective Lagrangian with a constant r (i.e. for the spacial case of cylindrical control channels $\dot{r}=0$) so that the trajectory of the light rays must in general satisfy the two Euler-Lagrange equations $$\frac{d}{d\sigma}\left(\frac{\partial L'}{\partial \dot{z}}\right) - \frac{\partial L'}{\partial z} = 0 \tag{5}$$

-continued $$\frac{d}{d\sigma}\left(\frac{\partial L'}{\partial \dot{\phi}}\right) - \frac{\partial L'}{\partial \phi} = 0 \tag{6}$$

the solution of which is easily shown to be a geodesic heix $$\sigma = c_1 z + c_2, \tag{7}$$

where $c_1$ and $c_2$ are constants determined from the incident conditions of the ray onto the control channel manifold.

The effects of the helical trajectory are especially pronounced in the early morning or late afternoon, however the direction of rotation in the early morning is opposite to that of late afternoon. This rotation or "twisting of light" has the wonderful property of twisting predominantly ETW propagating sunlight into the NTS direction, thereby allowing partial control of the light in a way that a 2-axis collector provides, but with only a 1-degree-of-freedom system. This makes possible the use of two concentrators in series, e.g. a microfluidic light steering collector-concentrator and a conventional concentrator. Consequently, if the microfluidic light steering collector and another concentrator each have 10× concentration, then a total system concentration of 100× would be achieved. This reduces the steering and angular resolution requirements on the microfluidic light steering system. Also, note that while the continuous curved control channel is easy to analyze, the twisting of the light can also occur when using flat dynamic mirrors formed form arrays of flat control channels. The analysis is more difficult, but the results are much the same.

Figure 26:
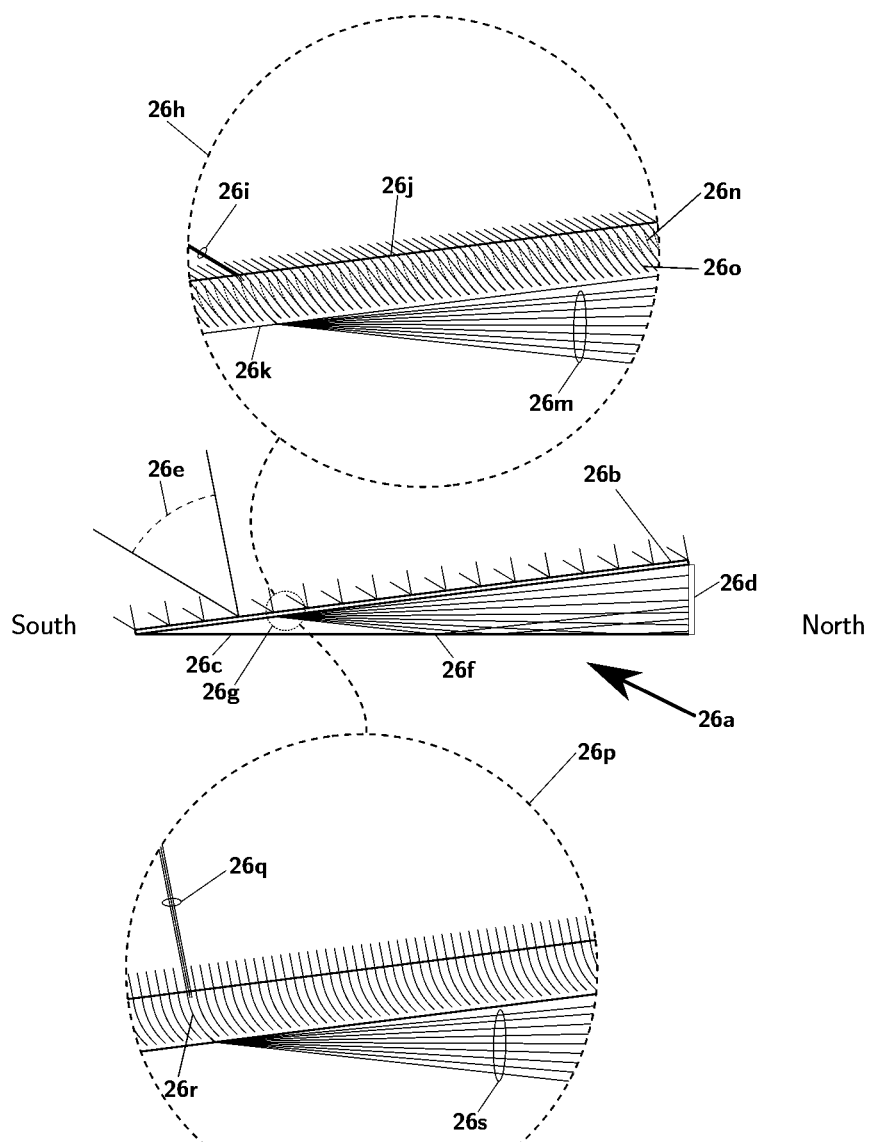
FIG. 26 shows in north-south cross section a hybrid 1-degree of freedom microfluidic solar collector and concentrator.

In particular, FIG. 26 shows in cross section a hybrid solar collector and concentrator that has 1-degree-of-freedom in steering sunlight in the north-south direction. This is done to compensate for the daily and seasonal variation in the sun's trajectory across the sky due to the earth's tilt angle, additionally it redirects sunlight onto a solar receiver at a concentration greater than unity. This reduces the number of conventional solar receivers needed for a fixed area. It also reduces the overall array costs and increases the utilization of the available sunlight to provide more energy from a fixed area.

In particular, a hybrid solar collector-concentrator 26a comprises a SM beam steering system 26b, an optional reflector 26c and a solar receiver 26d. The solar receiver may, for example, be a photovoltaic receiver, a solar thermal receiver or a combination of electricity generation and water heating so as to provide a means to both cool photovoltaic cells and use any remaining waste heat for practical purposes. In the north-south cross sectional view shown (assuming the system location is in the northern latitudes of earth) the SM beam steering system 26b intercepts light over an annual angular range 26e, which is about 48° and is due to the earth's tilt angle and fixed rotation direction with respect to the plane of the ecliptic. The sunlight that enters into the SM beam steering system 26b comprises rays that are substantially parallel, having about 0.275° angular radius (to form a light cone) about the mean direction of energy propagation. The hybrid solar collector-concentrator 26a is configured electronically to accept this light independent of the time of day and redirect it substantially towards the solar receiver 26d.

The purpose of the optional mirror reflector 26c is to allow either a horizontal bottom surface, as might be required on a flat roof, or a larger output angular extent of light from the SM beam steering system so as to reduce complexity and cost. Consequently the optional reflector 26c, when utilized, may or may not be configured to be horizontal as is shown in the figure. An example of a mirror reflection 26*f* is shown for a horizontal mirror surface and a large SM beam steering angular output.

The magnified region 26*g* is shown for two example cases: the summer solstice and the winter solstice. The winter solstice magnification 26*h* shows an input light bundle 26*i* refracting into a transparent medium at a first surface 26*j* and light refracting out of the transparent medium at a second surface 26*k*. The output light bundle 26*m* typically has a wider angular extent than the input light bundle 26*i* due to the processing of the light by the SM beam steering system. Additionally, the input and output surfaces typically are provided with anti-reflection coatings, such as multi-layer dielectrics or a graded refractive index surface, which allow refraction without appreciable reflection losses.

In between the first surface 26*j* and the second surface 26*k* fluidic control channels have IMF injected or extracted so that a curved TIR based mirror is dynamically reconfigured. The winter solstice magnification 26*h* shows schematically that the upper portions of a fluidic control channel array are injected with IMF. This is depicted, for example by the example deactivated mirror 26*n*, which has dashed curved contours. The lower portions of the control channels are devoid of IMF so that activated mirrors, such as 26*o*, are available to redirect the sunlight. Any electronic fluidic pumps, actuators or reservoirs for the IMF are not shown in this figure to keep the figure complexity to a minimum.

The summer solstice magnification 26*p* shows an input light bundle 26*q* from a different input angle, however, now each fluidic control channel is reconfigured by changing the distribution of IMF so that the curved mirrors of the mirror array allow a greater steering angle. An example of a fully activated mirror is shown as activated mirror 26*r*. Subsequently, sunlight that is refracted from the second surface forms an output light bundle 26*s* that is substantially the same as output light bundle 26*m* as projected onto the plane of the page independent of the time of day and the position of the sun.

Is should be clear that although the above description of FIG. 26 focused in the specific cased of an array of curved fluidic control channels forming dynamically reconfigurable curved mirrors, it is equally possible to use one or more dynamically formed flat mirrors, formed into layers, as has already been described in this document.

Figure 27:
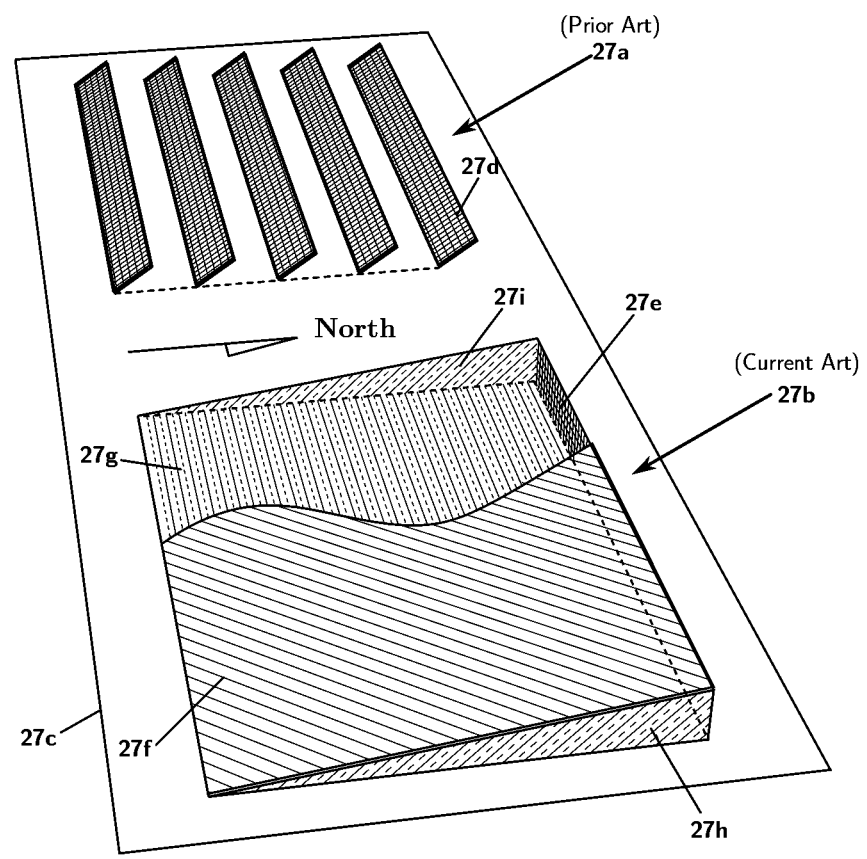
FIG. 27 shows an example of a Prior Art south facing 0-degree of freedom solar receiver array for the northern hemisphere of earth alongside the Current Art for a north-south 1-degree of freedom microfluidic solar collector and concentrator integrated with a solar receiver.

FIG. 27 makes a comparison, in a perspective geometry view, of a typical south facing 0-degree of freedom (0-DOF) solar panel array (prior art) 27*a* to a south facing 1-DOF SM beam steering collector-concentrator system (Current Art) 27*b*. The current art was also discussed and shown in FIG. 26. Both systems take up the same overall area on the ground 27*c* and use the same row of solar panels so that the row of solar panels 27*d* is the same as the row of solar panels 27*e*, but are orientated differently as shown. The 0-DOF prior art 27*a* operates at 1-sun of concentration, is tilted up at the the latitude angle (in this case 35°) and requires five rows of solar panels. The 1-DOF current art 27*b* system operates at 8-suns of concentration and has only one row of solar panels and has a hybrid solar collector-concentrator 27*f* forming the top of an enclosure having a bottom mirror 27*g* and side mirrors 27*h* and 27*i*. The side mirrors redirect sunlight to ensure that there are no losses of light from the east and west edges of the system. Note, all of the mirrors 27*g*, 27*h* and 27*i* are optional, but they do help capture more sunlight.

In the particular example shown in FIG. 27 the 1-DOF current art system 27*b* provides about 33% more energy than the 0-DOF prior art system 27*a* while using the same ground area and it does this with only 20% of the solar panels needed for the prior art system. If the installed cost of the SM beam steering system is 10% of the installed cost of the PV system on an area-basis then the cost of energy in dollars per kilowatt-hour decreases by nearly 67%. Thus, for a fixed PV manufacturing line, five times as many solar installations can be installed and each produces about 33% more energy at about 67% less cost. The numbers provided here assume that the solar panels can handle the heat load of the concentrated solar energy and the example is provided to demonstrate the cost-of-energy enhancements that are possible.

Figure 28:
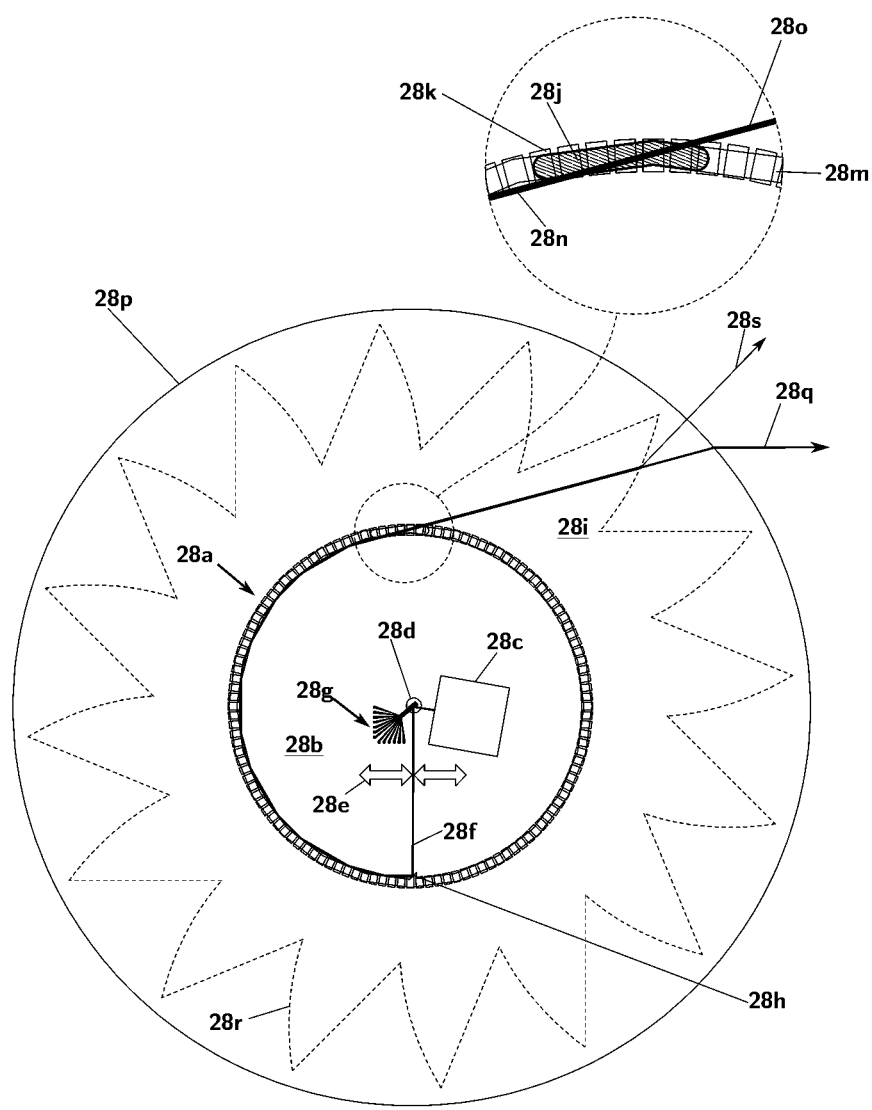
FIG. 28 shows in cross section an embodiment for an angle-agile light steering system that is able to steer light into any of nearly 360 degrees.

FIG. 28 shows a different embodiment for a soft matter beam steering device comprising a single fluidic control channel 28*a* embedded within a solid transparent medium 28*b* as a means to steer light to any angle within $2\pi$ radians. The single fluidic control channel 28*a* can be circular or any other shape. One particular shape that provides a particular advantage is that of a polygon. If the reader looks closely at FIG. 28 they will see that it shows a 24 sides to the polygon for the fluidic control channel. The flat edges of the polygon ensure that parallel light rays remain parallel from a light source 28*c*. Moreover, the polygons surfaces more easily allow beam steering to be separated into light steering and vernier light steering stages. This is not a requirement, but is shown here by way of example to demonstrate the flexibility of beam steering using fluidics and an IMF. Additionally, the single fluidic control channel 28*a* has electrode located above and below it to allow auction of an IMF droplet.

In detail, a light beam from a light source 28*c* is reflected from a vernier steering device 28*d* (see detailed FIG. 30 and discussion below), which provides a vernier beam translation 28*e* function of left or right to produce an intermediate light beam 28*f*. Electrodes 28*g* provide digital signals to the vernier steering device 28*d*, which provides fine-tuned angular beam steering by changing the specific vernier beam translation 28*e* of the intermediate light beam injection onto the boundary between the fluidic control channel 28*a* and the solid transparent medium 28*b*. The intermediate beam is reflected, for example by means of a mirror facet fabricated on the fluidic control channel to provide a beam injector 28*h* into the fluidic channel by TIR. The intermediate light beam 28*f* once injected onto the boundary between the fluidic control channel 28*a* and the solid transparent medium 28*b* becomes a gallery wave, which is reflected by means of TIR from the flat polygon surfaces of the control channel. The gallery wave is reflected multiple times by the flat polygon surfaces until it reaches the angular location where light is to be launched into a free propagation state within the solid transparent medium 28*i*.

Figure 29:
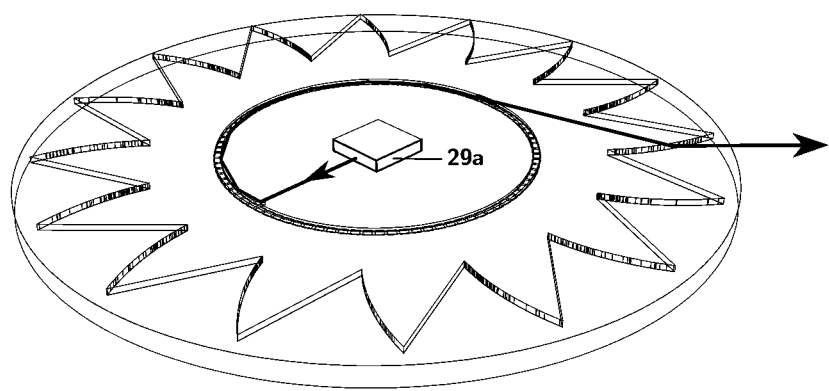
FIG. 29 shows in perspective an embodiment for an angle-agile light steering system that is able to steer light into any of nearly 360 degrees.

Referring now to the magnified view, we see that a IMF droplet 28*j* has been positioned within the vacuum of the fluidic control channel by means of voltages on electrodes, an example of which is 28*k*. When energized by voltages these electrodes change the wetting properties of the fluidic control channel 28*m* using the well known electro-wetting actuation technique, which actuates polar fluids along normally hydrophobic surfaces like the inside of the fluid control channel. Additionally, the electrodes are located above and below the fluidic control channel. This is difficult to see in this figure, but for each rectangular profile there are two electrodes: one above and one below the fluidic control channel and suitable connections to a controller (not shown). Finally, there is nothing special about electro-wetting and other means of fluidic actuation could have used equally well for the actuation of the IMF droplet. The result is that the gallery ray 28*n* passes through the IMF droplet 28*j* and becomes free propagating light 28o in the solid transparent medium 28i. This freely propagating light may be directly refracted out of the system at output optical surface 28p as output light ray 28q. This ray is in general not in line with the geometric center of the system so that optionally, we may introduce a beam centering surface 28r, which refracts free propagating light 28o into a centered light beam 28s through its flower-like "optical peddles". FIG. 29 is a three dimensional perspective of FIG. 28, where the entire light source and vernier control are shown in vernier light source 29a.

Figure 30:
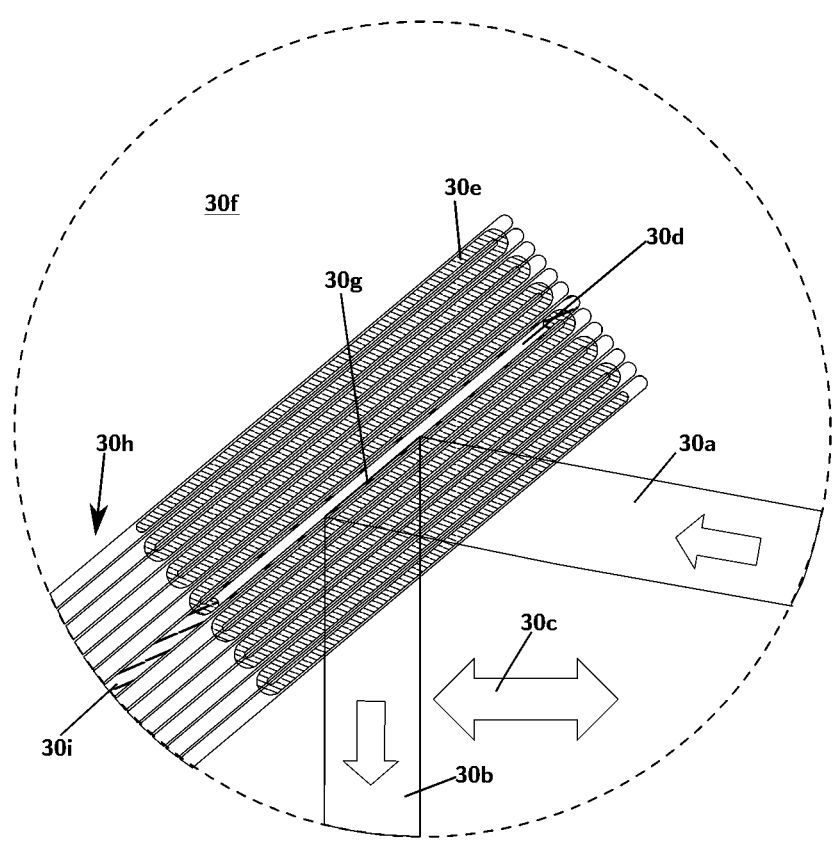
FIG. 30 shows a magnified view of a microfluidic vernier light beam controller that can translate an input beam in fine increments.

FIG. 30 is a magnified view of one possible embodiment of a vernier light steering device 28d of FIG. 28. The device takes an input light beam 30a and provides an output light beam 30b that has a selectable position based on translation to the left or right as indicated by translation direction 30c. It accomplishes this by means of electronically controlling the position of a vacuum bubble 30d within a meandering fluidic control channel 30e which contains an IMF. The meandering fluidic control channel 30e is located within a transparent solid 30f. Consequently, all of the meandering fluidic control channel is optically hidden by the IMF except for the bubble. It is at the boundary between the transparent solid and the vacuum bubble within the IMF that TIR redirection 30g occurs and the input light beam is redirected into the output light beam. There are a number of control electrodes 30h that have a sequence of voltages applies so that the electro-wetting properties of the meandering fluidic control channel are dynamically changed and the bubble is forced to the desired section of the control channels to effect a translation in the output light beam. The electrode directly underneath the vacuum bubble is the bubble electrode 30i and it is energized in time sequence with its neighbors to shift the bubble position using well know electro-wetting fluid and bubble transport techniques. Alternately, the electrodes could be to resistors that heat the IMF to the point of vaporization to form a vapor bubble.

Figure 31A:
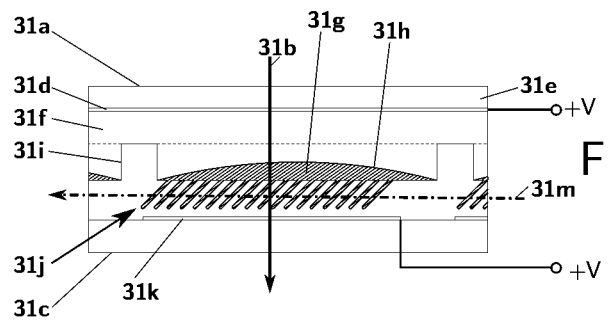
FIG. 31A shows a cross section of a deactivated pixel in a transparent display.

FIG. 31 shows as an example an embodiment of a single pixel, which is taken from an array of pixels, that form a transparent display using fluidic beam steering. One application is for head-mounted augmented-reality displays. In particular, FIG. 31A shows a cross section of a single deactivated pixel in a transparent display. A first surface 31a refracts an input scene ray 31b from an external scene into the pixel cell shown. A second surface 31c retracts light out of the pixel. Between the first and second surfaces are several structures that control IMF and the light that passes through the pixel. A global transparent electrode 31d is on the bottom surface of transparent cover 31e. The global electrode is held a voltage +V (typically in the range of 1-10 volts) and it is made from a transparent conductor such as indium tin oxide (ITO). Beneath the transparent cover is a polar first IMF 31f and a non-polar second IMF 31g. The first and second IMF are chose to be non-miscible so that a well defined fluid boundary 31h exists. The second IMF is contained within a pixel cell, which in cross section is defined by the periodic transparent well 31i. The second IMF is hel in place by capillary forces which are typically 1000 times that of gravity for a well width on the order of 100 µm.

The refractive index of the first and second IMFs may be identical or different depending on the scale and function of the fluidic control channels 31j. In particular, the fluidic control channels may be used for diffraction or for total internal reflection. In the case of controllable diffraction a plurality of fluidic control channels are fabricated (as is shown) and the widths of the fluid control channels are smaller than the wavelength of light being diffracted. Alternately, in the case of total internal reflection as few as one fluidic control channel is required (instead of the plurality shown in the figure) and it may be quite physically wide, even to the point of taking up a significant portion of the pixel area at many hundreds or even a thousand times the size of the largest wavelength of light form the scene.

For diffractive systems the first and second IMF have a small difference in refractive indices to allow a periodic variation in the refractive indices to exist (a prerequisite for diffraction) because the periodic transparent well 31i that defines the pixel shape has the same refractive index as only one of the IMFs and the plurality of fluidic control channels can contain the IMF that has the different refractive index the the pixel's active state. In contradistinction a pixel utilizing total internal reflection the first and second IMF can have different refractive indices that are an order of magnitude greater than the difference required for diffractive systems. If identical refractive indices for the first and second IMF are used then one of the IMFs must never be allowed to wet the inside of the fluidic control channels so that a vacuum exists in the fluid control channels in the active pixel state.

In FIG. 31A the pixel is deactivated and the light from the input scene ray 31b passes through the pixel so that the second IMF has the same refractive index as the periodic transparent well 31i. Additionally, the curved surface of the fluid boundary 31h does not appreciably refract the light because the first and second IMF have nearly the same refractive index.

Note that in FIG. 31A the second IMF 31g fills the fluidic control channels 31j because no voltage difference exists between the global transparent electrode 31d and the local pixel electrode 31k as both have a voltage of +V. The second IMF being non-polar can wet the surface of a hydrophobic periodic transparent well 31i. Consequently, the information ray 31m also passes without diffraction or reflection through the fluidic control channels 31j filled with the second IMF 31g.

Figure 31B:
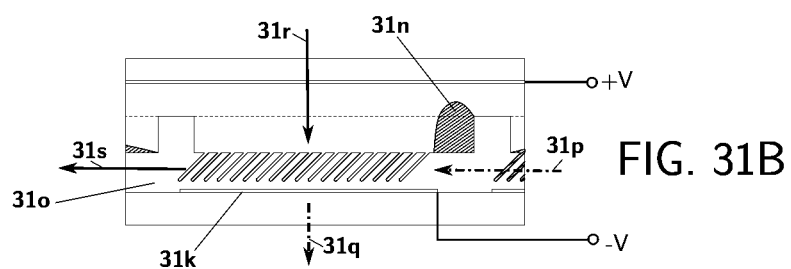
FIG. 31B shows a cross section of an activated pixel in a transparent display.

In FIG. 31B the voltage on the local pixel electrode 31k is switched to −V from +V and the second IMF 31g is pushed away to the side as stored second IMF 31n because of electro wetting induced forces as the polar first IMF 31f is drawn into the pixel region. Notice that the pixel medium is ideally conductive. Conductive thermoplastic compounds that are similar to acrylic are available in special forms that can be tailored to offer electrical properties spanning the surface resistivity spectrum from $10^0$ to $10^{12}$ ohm/sq and which are formulated for injection molding, extrusion or ultraviolet curing to allow 3D printing and micro stereolithography processing. The surface of the fluidic control channels are also hydrophobic.

Consequently, the information ray 31p gets substantially redirected by 90 degrees into the output ray 31q and the input scene ray 31r get redirected by substantially 90 degrees to become a discarded scene ray 31s. Thus the input scene ray and the information ray can be interchanged. If this process happens as part of a scanning of pixels on a screen then the update rate will determine how translucent the data is on the screen. The objective would be to overlay a screen of pixels with information data that can be utilized by a user that sees both the external scene and the data simultaneously.

Figure 31C:
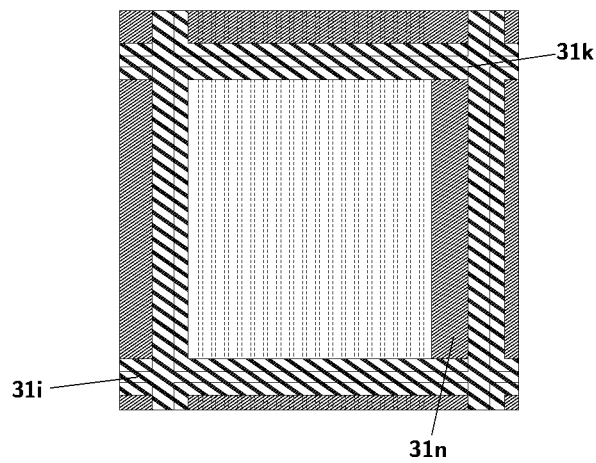
FIG. 31C shows a top view of a pixel for a transparent display.

FIG. 31C shows the situation in FIG. 31B from the top view of the pixel and the stored second IMF 31n is now seen as moved to the side and the periodic transparent well 31i is seen in two dimensions as forming the rectangular pixels.

The principles described in this document can be extended to other portions of the electromagnetic spectrum that are significantly different from visible light. For example, the wide-angle, broad-band, polarization independent steering of millimeter wave radiation can be accomplished in nearly the same way as has been described in the preceding document. To accomplish this one would replace the visible-light transparent glass or plastic solid-medium with a material that is transparent to millimeter waves, such as certain ceramics and glass. A SM medium that can replace the IMF with a plasma—which may also be considered a form of SM.

The fluidic control channels that were previously described in this document would now always contain a rarified gas instead of a vacuum or liquid. However, by suitable application of the electrical, photonic or other forms of energy the gas may can be excited into a plasma. Thus the control channel now either contains (or does not contain a plasma) depending on the control signal. However, a plasma can be constructed to provide a reflective medium for electromagnetic radiation like millimeter radiation.

This then provides a completely new way to steer broadband electromagnetic radiation for unconventional radar, communications and remote sensing. It would avoid the need for phased array antennas. Such system would have high accuracy pointing for extremely broadband signals. Thus, for example, it becomes possible in principle to create agile radar beams that are broadband (even for narrow-pulsed time-domain millimeter wave signals) and capable of hyper-spectral resolution. This is a capability that phased array beam steering systems do not possess as they are inherently narrow-band.

In general the technique of SM beam steering can be used with many different forms of wave energy. Waves in general may be transverse, longitudinal, surface, or combinations thereof. Examples of transverse waves include electromagnetic waves such as visible light waves or millimeter waves, which can have both transverse electric and/or magnetic components. An example of a longitudinal wave is sound. An example of a surface wave is a water wave at the air-water boundary. Note that a surface water wave is a wave in which particles of the medium undergo a circular motion and are therefore neither longitudinal nor transverse waves. An example of a hybrid wave is a surface plasmon polariton which has longitudinal compressing and expanding electron density in the direction of propagation along a metal-vacuum boundary surface and transverse oscillating magnetic fields relative the direction of propagation. The above examples are by no means exhaustive of the possibilities.

All of these waves may be steered using SM beam steering techniques adapted to the particular type of wave and scale of the system. For example sound waves may be steered using SM beam steering techniques by observing that a fluidic control channel can have either a fluid or vacuum therein. Note that a vacuum never supports any sound wave propagation and a fluid does support sound wave propagation so that reflection from a fluidic control channel is only dependent on the presence of absence of SM within the control channel. Again, an IMF that is well matched in acoustic refractive index between the surrounding solid and the IMF allows easy beam steering steering of sound. Also note that sound waves with wavelengths even smaller than the wavelengths of visible light have been demonstrated with nano-scale transducers so that device size can be very small even for acoustic waves.

The manufacturing technique used to fabricate a soft matter beam steering device depends on the scale of the structures and the materials that are used. These in turn are a function of the application. For soft matter beam steering millimeter wave electromagnetic radiation the control channels may be many millimeters in width; sound waves may have smallest feature sizes that are larger still; and optics applications may require control channels sizes that are more than 1-10 μm in width. Larger features size devices can be fabricated by conventional subtractive or additive manufacturing technologies. However, the smaller feature sizes associated with optics are still challenging to achieve. With this in mind a discussion is provided about a subtractive and additive manufacturing techniques for creating meter-scale sheets of micro-fluidic control channels with smallest feature sizes having characteristic lengths of 1-10 μm.

In particular, optical materials are often transparent to the typical laser wavelengths used in subtractive manufacturing. Also, a laser beam would need to be focused through the surrounding material of the transparent material of the device being fabricated, which distorts and attenuates the laser beam as the desired structures are fabricated.

To overcome these and other problems with using energetic photons for subtractive manufacturing the use of energetic particles from an industrial nuclear accelerator is provided. Typical energetic particles used for particle-bombardment cutting may be ions, protons, or neutrons. For example, accelerators have been constructed to accelerate a charged beam of ions or protons to energies as high as about 100 Mega electron volts (MeV). Alternately, ultra-fast (short pulse) lasers called a laser-plasma accelerators have been constructed to accelerate particles to as high as almost 10 giga-Electron Volt (GeV) energies in just a few centimeters of space. Even higher particle energies have been developed for research class particle colliders. Neutron sources also exist that are typically based on fusion of isotopes of hydrogen, which can provide 14.1 MeV neutrons for deuterium-tritium fusion reactions and 2.5 MeV neutrons from deuterium-deuterium fusion. Therefore, it is seen that there are a large number of particle accelerator technologies that are either available or emergent from which to construct a subtractive manufacturing system.

Consequently, a fabrication technique using particle-bombardment subtractive manufacturing may use roughly 0.3-30 MeV beams for particle-bombardment cutting. Higher energies can increase the depth and rate of cutting for a fixed particle flux, however for a given material there is typically an optimum beam energy and particle flux for best cutting performance—including minimizing damage to the surrounding regions.

For example, a 1 MeV proton beam providing $6.25 \times 10^{14}$ particle per second (i.e. 100 μA average beam current) provides about 100 watts of beam power to the target over the area that is bombarded. If that area is about 10 μm×10 μm then about $1 \text{ W μm}^{-2}$ is deposited assuming complete absorption of the beam by the medium to be cut. Moreover, the characteristics of the beam, such as its diameter or shape can be controlled. Therefore, any complex shapes used for fluidic control channels in the soft matter beam steering devices of this disclosure may be formed. For a sense of scale note that proton linear accelerators (linacs) of about 10 m in length can deliver energies of about 30 MeV. A linac will take the continuous particle beam coming out of an ion source, bunch them according to a given Radio Frequency (RF) frequency (provided for example by a klystron) and then accelerate it up to the required final energy. In general, linacs are pulsed accelerators that deliver a repetition frequency that is usually in the range of 1-100 Hz.

Figure 32:
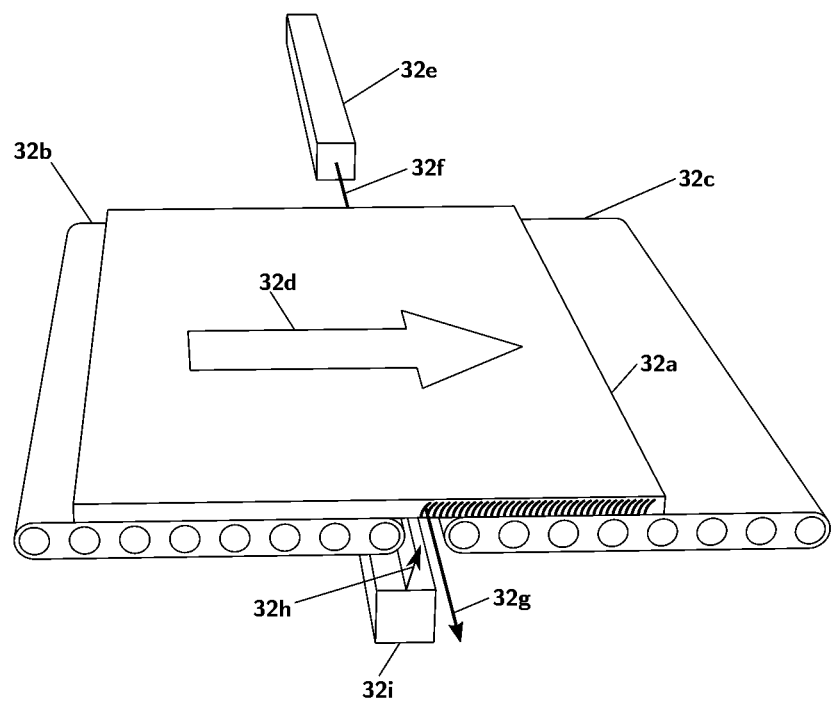
FIG. 32 Shows particle beams used in manufacturing soft matter beam steering device from a slab preform.

FIG. 32 shows a transparent slab preform 32a that is used in manufacturing soft matter beam steering device. The transparent slab can be a plastic or a glass. The glass may be a float glass. The slab preform moves along a first conveyor 32b and a second conveyor 32c in the direction of motion 32d. Between the conveyors two different forms of particle bombardment for subtractive manufacturing are shown. A first particle accelerator 32e provides an energetic compact particle beam 32f that is used to pattern one or more microfluidic control channels in the slab preform as the preform moves by. The compact particle beam 32f is sufficiently energetic so that it can in due course punch through the slab preform 32a, as shown by the exiting particle beam 32g. An alternative distributed particle beam 32h, in the form of a particle sheet is shown directed towards the slab preform 32a. The particle sheet is emitted from a second particle accelerator 32i. Note that a subsequent annealing heat treatment of the micro-structured slab can be used to relieve internal structural stress and strengthen the device.

Figure 33:
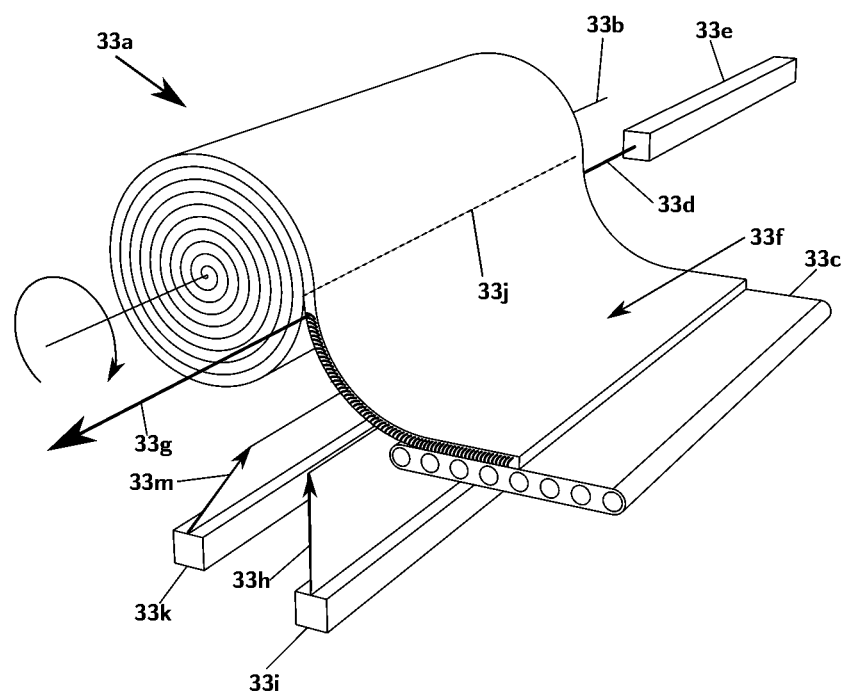
FIG. 33 Shows particle beams used in manufacturing soft matter beam steering device from a cylindrical preform.

FIG. 33 shows particle beams used in manufacturing soft matter beam steering device from a solid cylindrical preform 33a, which can rotate around the unrolling axis 33b to deposit a processed transparent medium on a conveyor 33c. In one embodiment a compact particle beam 33d is produced from a first accelerator 33e. This particle beam is used to form micro-structures in the unrolled preform 33f. The exiting particle beam 33g is seen exiting the unrolled portion of the preform. The cross-sectional shape of the particle beam may be controlled to affect a particular soft matter control channel.

To affect the unrolling of a solid cylindrical preform into a slab preform a first distributed particle beam 33h, in the form of a sheet of energetic particles from a first distributed accelerator 33i slices a slab from the rotating cylinder along an internal separation line 33j. In a second embodiment a second distributed accelerator 33k provides a second distributed beam 32m of particles in a sheet, which may be used to form features in the unrolled preform. Again, as in the situation of FIG. 32 the system in FIG. 33 may require that the output slab is annealed to reduce internal stresses after the control channels are formed.

There also other forms of manufacture. For example the use of 3D printing, such as but not limited to Large Area Projection Micro Stereolithography (LAPμSL), can provide small micron-scale features over meters of area and up to a few tens of millimeters thickness or more.

The following paragraphs provide some additional disclosures for applications wherein the wave energy may be pulsed and/or continuous in nature.

In the 1905 German physicist Heinrich Rubens demonstrated controlling flame using sound by using a length of pipe with holes along the top. One end was sealed off with a sound speaker attached, the other sealed off and fixed with a flammable gas supply. After lighting the gas and changing the sound frequency being emitted, the height of the flames could be manipulated. Next, in 1913 a Mr. Kinley used the shock waves generated from dynamite to "blow out" oil well fires in California. This was one of the earliest effective methods of fire control using acoustic energy and is still widely used. Next, in 2012 the Defense Advanced Research Projects Agency (DARPA) published videos demonstrating acoustic suppression of flame in a substantially enclosed volume. More recently, roughly around 2014-2015, researchers at George Mason University demonstrated acoustic suppression of flames without the need for an enclosure, wherein the flames could be extinguished out in the open by a modest level of sound wave energy. All of these demonstration have been leading to a waterless fire-suppression technology. Nonetheless, efforts to date have been limited because they do not assert significant spatial control over the acoustic wave energy.

In order to add more control to the process of acoustic fire suppression electronic steering of acoustic wave energy is provided by soft matter beam steering techniques. In particular, this document discloses a way to electronically steer (and optionally focus) sound using soft matter beam steering for the purpose of fire fighting and putting out fires.

Figure 34:
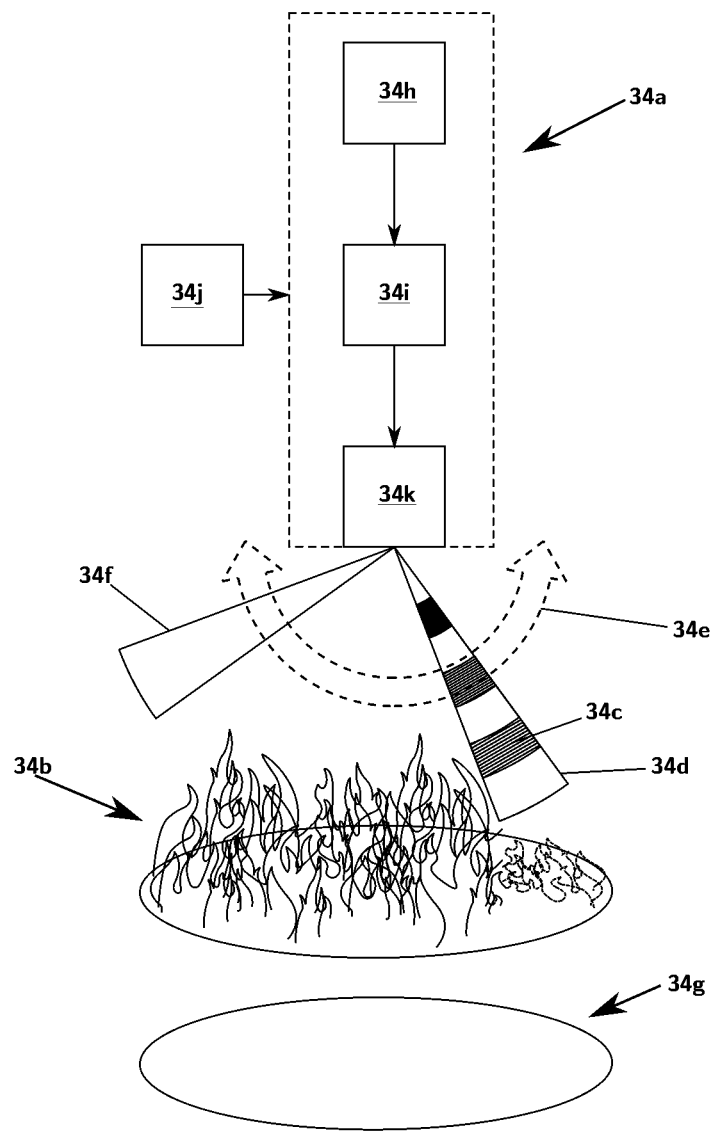
FIG. 34 Shows a block diagram of an electronic fire suppression system based on scanning acoustic waves using soft matter beam steering.

FIG. 34 shows a block diagram of scanning acoustic fire suppression system 34a for waterless fire suppression that is based on using soft matter beam steering of acoustic waves. An extended fire 34b is suppressed by acoustic wave energy 34c, which is transmitted as a first sound beam 34d. The sound beam is scanned through a scan angle 34e into other positions, such as a second sound beam 34f. This process continues until the fire is completely suppressed, as shown schematically by the fire free region 34g. The sweep may be periodic or aperiodic and the sound waveforms may be coordinated with the scanning process to minimize fire damage.

An acoustic source 34h provides fire suppressing wave energy. A soft matter first acoustic steering system 34i steers the acoustic wave energy to the desired direction in the plane of the figure at electronic speeds based on input from a controller 34j. A second acoustic steering system 34k steers the acoustic wave energy in the desired direction into or out of the page of the figure as needed, also based on inputs from a controller 34j. In combination, the first acoustic steering system 34i and the second acoustic steering system 34k allow fire suppression in any direction at electronic speeds.

The acoustic fire suppressing system can be operated in isolation for waterless fire suppression or it can be combined with a mist of water or other chemical fire suppressants to further enhance the fire suppressing capabilities of the system.

Figure 35:
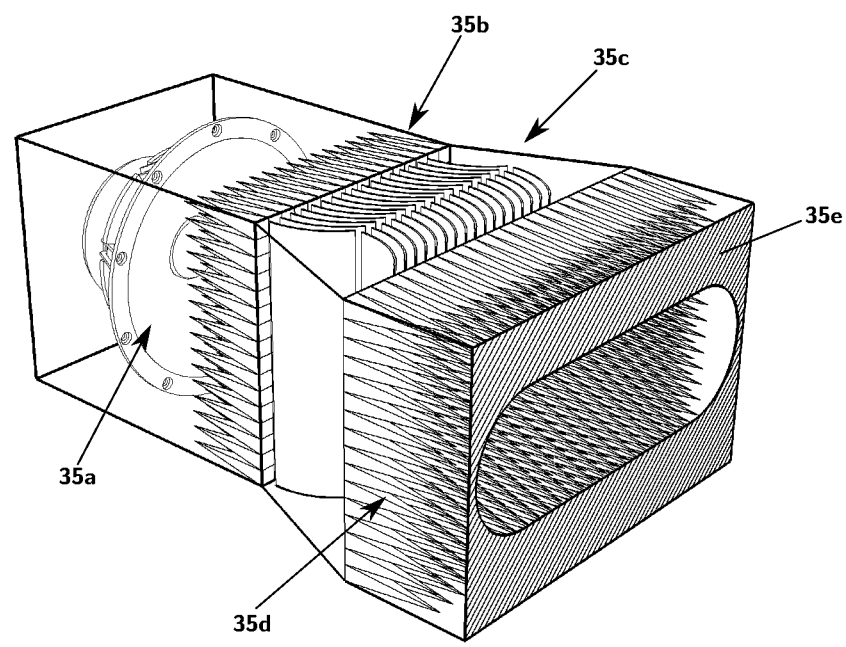
FIG. 35 Shows a one degree of freedom scanning acoustic fire suppression system in perspective.

FIG. 35 shows an embodiment of a scanning acoustic fire suppression system. It comprises an acoustic source 35a, which provides a source of sound waves. These waves pass through a first anti-reflection layer 35b so that waves in air pass into a acoustic beam steering device 35c with minimal reflection or attenuation. The first anti-reflection layer 35b comprises an array of pyramidal cones that gradually transition from a low material density (i.e. a gas) to a second high material density (i.e. a solid like a plastic or metal). Other forms of anti-reflection may be used as well. The acoustic beam steering device 35c shown is similar in form to that shown in FIG. 23, however any of the other suitable variations already discussed are also possible. Note, the index matching fluid reservoir and control systems are not shown to reduce the figure clutter and may be referenced in other figures of this disclosure. After the beam steering section a second anti-reflection layer 35d transitions the waves to a gas medium again and the system has a partial resonator cover 35e that partially reflects waves back into the system to form a "curved standing wave" that is directed into the desired direction. Essentially, what is occurring is that the soft matter beam steering section is modifying the internal geometry of a resonator so that the wave energy can be directed into the desired output direction.

Next, we consider SM beam steering to allow multistage concentration of wave energy, as shown in FIG. 30. To be specific we shall consider the case of light in a solar energy application in the following example, but the technique can be applied to other applications and forms of wave energy as well.

In particular, the well known compound parabolic concentrator 36a provides a single-stage of concentration. However, it can be reconfigured to provide greater concentration by utilizing a certain portion of it as part of an active two stage concentration system. Such a system can provide greater concentration of light than the standard compound parabolic concentrator and is more compact than the compound parabolic concentrator.

The compound parabolic concentrator 36a is formed by a portion of a parabolic curve 36b having focus at point 36c. This focus point is not on the symmetry axis of the concentrator, which is formed by a line between symmetry axis points 36d and 36e. If the parabolic curve 36b is rotated around the symmetry axis formed between axis points 36d and 36e then the resulting locus of points form the compound parabolic concentrator 36a. Light within the concentrator is reflected by surfaces that are reflective. The input circular aperture to the compound parabolic concentrator is a circle having its center at axis point 36d and contains points 36f and 36g on the edge of the input aperture. The compound parabolic concentrator has a reflective internal surface to reflect waves of interest that pass through the input aperture and then focuses those rays so they are contained within the circular region of the output aperture. It can be shown that the concentration of a compound parabolic concentrator is close to the ideal thermodynamic limit. The circular output aperture has points 36c, 36h, 36i and 36j in the edge of the receiver area. Many properties of the compound parabolic concentrator are well known, including the range of input angles and the expected concentration at the output aperture.

Figure 36:
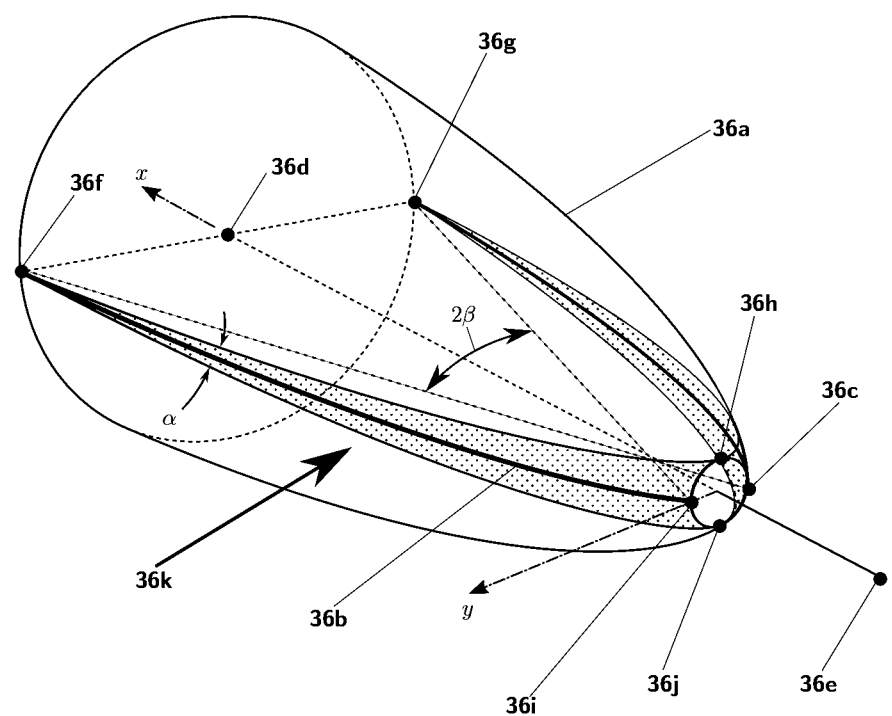
FIG. 36 Shows a compound parabolic concentrator of revolution with a wedge cut out from its surface to form a two stage concentrator when combined with an active collection surface.

However, a significantly different concentrator, compared to the well know compound parabolic concentrator 36a, can be obtained by cutting out a wedge shape to form a wedge concentrator 36k, which is shown having a shaded texture in FIG. 36. The input aperture is now the upper surface of the wedge containing aperture edge points 36h, 36g, 36d and 36f. This input surface is the first surface of a thin active slab that is capable of redirecting input wave energy roughly along the axis formed by axis points 36d and 36e—i.e. this utilizes the same principle that was shown in FIG. 26. Additionally, a reflecting surface is formed at the lower wedge surface containing edge points 36j, 36g, 36d and 36f.

A compound parabolic concentrator having a receiver diameter of d, which is the distance between points 36c and 36i, and a total acceptance angle of 2β, as shown in FIG. 36, has a parametric representation, for its position vector r(t) as a function of a parameter t—in radian units. In the first quadrant of the xy-plane the parametric curve is given by $$r(t) = d\left\langle \frac{\cos(\beta - t)(1 + \sin \beta)}{1 - \cos t}, -\frac{1}{2} - \frac{\sin(\beta - t)(1 + \sin \beta)}{1 - \cos t} \right\rangle \quad (8)$$

where $2\beta \leq t \leq \beta + \pi/2$. This is the equation of the curve 36b, which is a parabola that has been rotated and translated to ensure that the parabolic focus is at point 36c. The derivative of the y-component of the above parametric equation is zero when $t=2\beta$, which ensures that the input aperture between points 36f and 36g is maximum. The distance D between between points 36f and 36g is found by setting $t=2\beta$ and multiplying the y-component of $r(t)=\langle x(t), y(t)\rangle$ by two so that $D=2y(2\beta)$, resulting in $$D = d \csc \beta. \quad (9)$$

The concentration in the y-direction for rays in the xy-plane is therefore $$C_y = \frac{D}{d} = \csc \beta. \quad (10)$$

Similarly, if light enters the wedge concentrator input aperture, which is bound by edge points 36h, 36g, 36d and 36f, then the concentration in the z-direction, for a small wedge angle α, is approximately given by $$C_z \approx \frac{L}{d} = \csc \alpha, \quad (11)$$

where L is the length of the compound parabolic concentrator. The length can be found by setting $t=2\beta$ in the x-component of r(t) so that $L=x(2\beta)$ and $$L = d \csc \beta \left( \frac{1 + \sin \beta}{2 \tan \beta} \right), \quad (12)$$

and concentration in the z-direction $C_z$ becomes $$C_z \approx \csc \beta \left( \frac{1 + \sin \beta}{2 \tan \beta} \right). \quad (13)$$

Therefore, the total concentration of the wedge concentrator 36k having an active wedge input surface is approximately $$C_{active} \approx C_y C_z = \csc^2 \beta \left( \frac{1 + \sin \beta}{2 \tan \beta} \right), \quad (14)$$

which can be shown to be a good approximation to an exact (but very complicated) expression for the ideal $C_{active}$, which is obtained by taking the ratio of input to output areas for the wedge concentrator 36k.

Moreover, the passive and well known compound parabolic concentrator 36a has a concentration of approximately $$C_{passive} 26 \ C_y^2 = \csc^2 \beta. \quad (15)$$

So we can see that the ratio of active to passive (i.e. the wedge concentrator compared to the compound parabolic concentrator as a surface of revolution) is given by $$\frac{C_{active}}{C_{passive}} \approx \left( \frac{1 + \sin \beta}{2 \tan \beta} \right) > 1. \quad (16)$$

Figure 37:
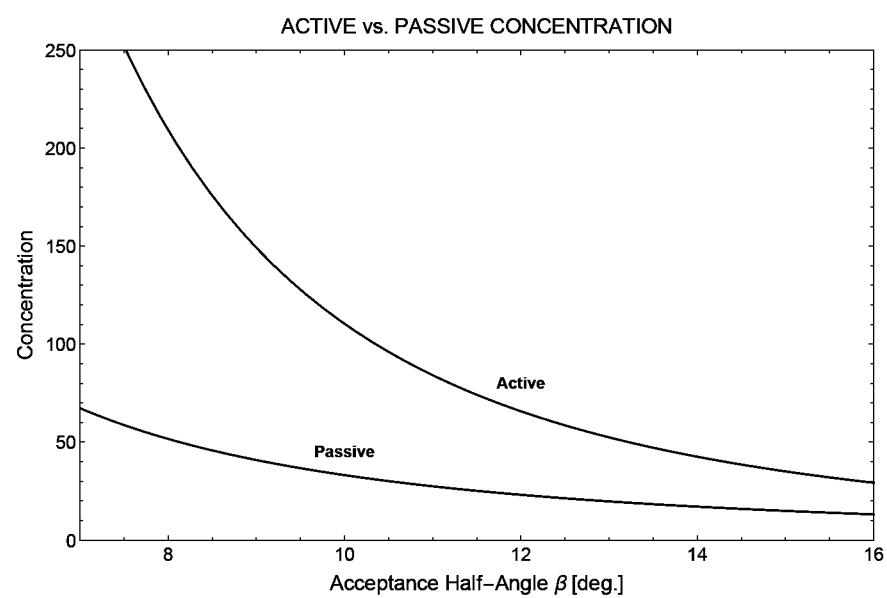
FIG. 37 Shows a comparison of the performance of a passive compound parabolic concentrator of revolution to an active wedge concentrator.

Therefore, the active wedge concentrator can provide many times greater concentration than the concentration the well known passive compound parabolic concentrator. A comparison of the performance of a passive compound parabolic concentrator of revolution to an active wedge concentrator is shown in FIG. 37. This graph shows a significant improvement for the active concentrator over the passive concentrator and the light is again concentrated at close to the thermodynamic limit of performance.

The improvement shown in FIG. 37 assumes that the active input device can redirect wave energy to within the angular range of 2β as already discussed and shown in FIG. 36. This may be done using a SM beam steering system like that shown in FIG. 26. Alternately, the redirection of light (or other types of waves) may be done by other forms of planar light redirection technology, such as but not limited to deformable mirrors embedded within a semi-solid slab, volume phase holograms, polarization holograms, liquid crystal based prism arrays and others. It should be further noted that the technique described herein may easily be generalized to that of a wedge-shaped concentrator having a greater wedge-width at the receiver (high-concentration) side than at the apex side of the wedge and not formed from a compound parabolic concentrator of revolution. One reason for not using an ideal compound parabolic concentrator is to optimize the spatial distribution of the concentrated energy at the receiver—e.g. to ensure that the light intensity is uniform across the receiver.

In one application the improvement in concentration provided by an active wedge concentrator is leveraged to provide a significant improvement over current concentrating solar thermal power plants, which are also commonly known as Concentrating Solar Power (CSP) plants.

Figure 38:
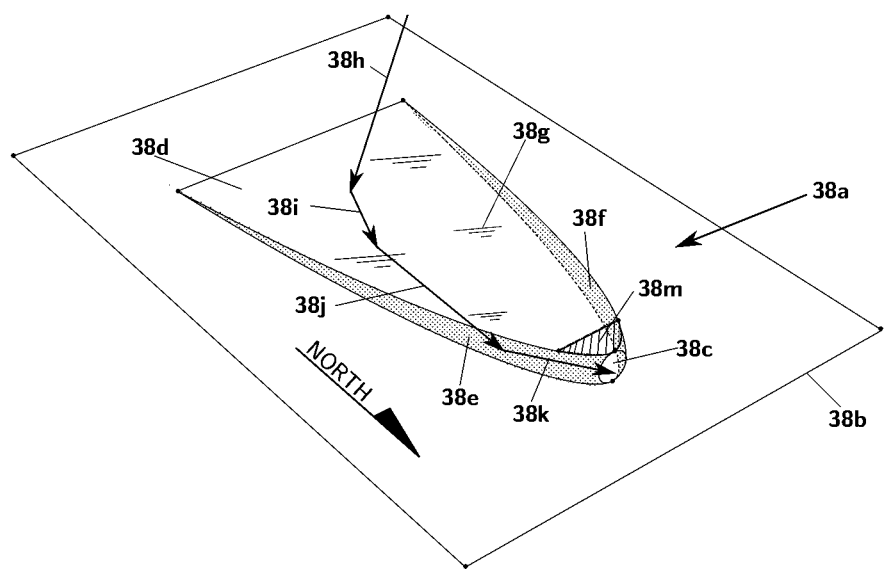
FIG. 38 Shows a concentrating solar power plant providing two stages of solar concentration.

In particular, FIG. 38 shows a large concentrating solar plant. It may be many hundreds of meters in width and length. Details like wall thickness have been suppressed in the image to avoid unnecessary clutter. The concentrating solar power plant may use a photovoltaic receiver, a thermal receiver (such as a molten salt energy storage device coupled to an electricity generating turbine) or a hybrid thermo-photovoltaic receiver that combines a molten salt energy storage system with a photovoltaic energy conversion to electricity. Note, because of the many possible choices of receiver the details of the receiver are not shown in FIG. 38.

Specifically, a concentrating solar collector 38a, comprising a compound parabolic wedge concentrator (as previously described in FIG. 36) is typically situated on the ground 38b and positioned with the output aperture 38c pointing substantially due north when the solar power plant is on the northern hemisphere of earth. The concentrating solar collector 38a comprises an active input slab 38d that redirects sunlight, while allowing the light to pass through the device. As already mentioned this may be similar to the SM beam steering system 26b described in FIG. 26, wherein a slab containing active mirrors is provided by microfluidic actuation of index matching fluids. Other active and transmissive light steering technologies may be used as well. Additionally, the concentrating solar collector 38a is substantially wedge shaped and has reflective sides 38e and 38f, which are reflective on the inside of the structure and follow a compound parabolic concentrator profile. Additionally, a reflective bottom 38g is opposite and below the active input slab 38d. Said another way: all surfaces are substantially reflective inside the structure except for structures associated with the input and output apertures, which are typically transmissive and absorptive respectively.

A typical input ray 38h, which is incident from the sun, is shown intercepting the active input slab 38d and being redirected thereby into an internal ray 38i, which may (as shown) reflect off of the reflective bottom 38g into internal ray 38j. This ray is further redirected by the reflective side 38e into an internal ray 38k that intercepts the output aperture 38c. Different rays passing through the system may not need to utilize all three redirections shown here. The only required redirection is that provided by the active input slab 38d—which provides a first stage of concentration. This concentration is caused simply by redirecting the input light towards towards the output at an angle close to the planar surface of the active input slab—see FIG. 26 and associated discussion. Most, but not all other input rays, also are redirected by one of the reflective sides 38e and 38f, which provide a second stage of concentration and are utilized at different times of the day. The reflective surfaces may be constructed of simple aluminum, which has a very large spectral bandwidth, is low-cost and durable within the protected inside of the concentrating solar collector 38a. In this way the product of the concentrations $C_y C_z$ provides the overall two stage concentration $C_{active}$ as already described.

Optionally, a safety region 38m of the input slab may be made opaque and of low thermal conductivity. This region being formed to protect wildlife, such as birds, from intense light and heat. Thus, the concentrating solar collector 38a, has the unique capability of also being a containment vessel for intense concentrated sunlight and heat generated by concentrated sunlight. This is a particularly important capability because currently deployed conventional solar towers have been known to spontaneously ignite or even flash vaporize many hundreds of birds in the course of an hour or two, forming what those in the concentrating solar power industry call "streamers", which are dead or dying birds that are literally on fire and falling out of the sky after flying into the intense solar radiation field of unprotected and exposed solar tower receivers.

The concentrating solar collector 38a is also nearly 100% area covering. This is unlike todays heliostats, which are used to form a collector for conventional solar towers. The prior art heliostat arrays can waste up to 90% of the area because sunlight falls between the heliostats. Thus a concentrating solar collector 38a could use about 10-20% of the area of a conventional solar tower, deliver the same amount of power and directly protect wildlife using a containment vessel for intense sunlight and heat—where temperatures could approach or exceed 1000° C. The concentrating solar collector 38a therefore has much lower impact on the environment.

Note, for the purposes of generalizing the above discussion consider FIG. 27, wherein the flat shape of the reflecting side wall mirrors 27h and 27i, in combination with the bottom mirror 27g and collector-concentrator 27f, i.e. the active beam steering system, form an expanding wedge concentrator for light that provides the special case of $C_y=1$ because the side wall mirrors are flat. The wedge is "expanding" because light has progressively more volume into which it may propagate as it moves towards a receiver, which in this case is a row of solar panels 27e. The need for an expanding volume is a requirement of étendue conservation, and must be provided to avoid the loss of light out of the concentrating system, especially for large-area systems.

Figure 39:
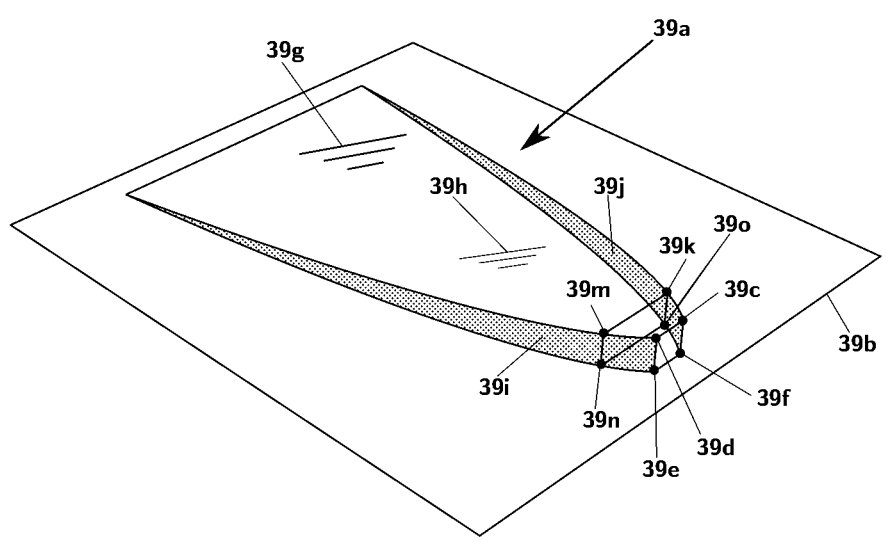
FIG. 39 Shows a another embodiment of a concentrating solar thermal power plant providing two stages of solar concentration.

FIG. 39 shows a slightly different version of a concentrating solar collector 39a located on the ground 39b. The collector is based on an extrusion of a compound parabolic cross section—instead of creating a surface of revolution as in FIG. 36. The shape of the receiver aperture, comprising boundary points 39c, 39d, 39e and 39f is now rectangular instead of circular. Just as before the input slab 39g contains an active form of wave redirection. The receiver is typically absorptive for solar applications. All other surfaces are reflective surfaces 39h, 39i and 39j, corresponding to the bottom and side surfaces respectively.

FIG. 39 also shows an optional long wavelength radiation containment volume comprising a volume defined by points 39k, 39m, 39n, 39o, 39c, 39d, 39e and 39f. The input to this volume is a long-wavelength radiation containment wall represented herein by corner points 39k, 39m, 39n and 39o.

Figure 40:
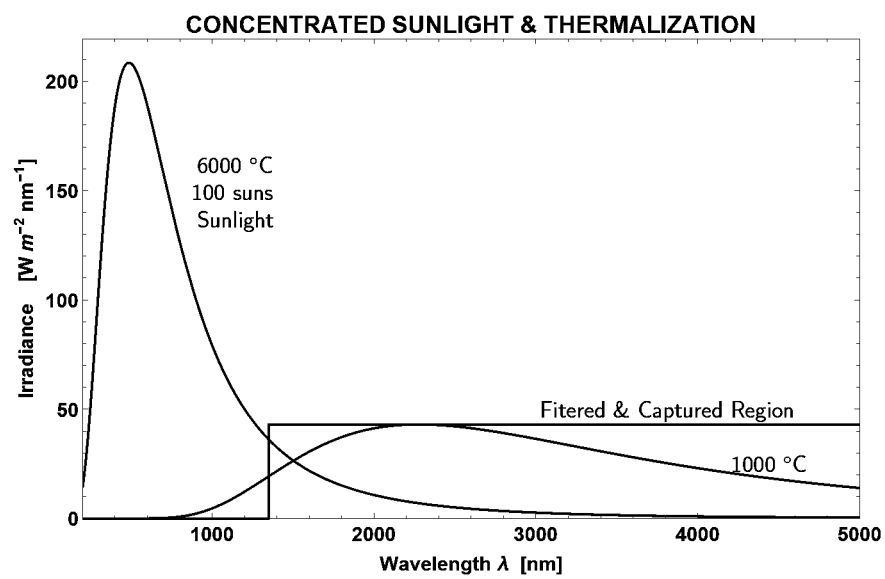
FIG. 40 Shows blackbody radiation curves for 100× concentrated sunlight and a heated solar receiver.

This wall is transparent to the solar spectrum and may be coated with layered dielectrics that provide a bandpass filter that allows most of the solar spectrum to pass to the receiver, but simultaneously blocks the majority of blackbody radiation emitted from the receiver. In this way a significant portion of the energy from the receiver cannot pass back out through the long-wavelength radiation containment wall. Other forms of filters are possible using, for example photonics crystals (photonic bandgap materials). The long-wavelength radiation containment wall is essentially a "leaky energy diode" that allows solar radiation (i.e. blackbody radiation temperature of about 6000° C.) to pass in predominantly one direction, but stops a significant portion of rethermalized black body radiation with a temperature of about 1000° C. from passing in the opposite direction—see FIG. 40. The long wavelength radiation containment volume may be evacuated of all air to also avoid convective flow of air. These techniques and structures assist in keeping a receiver hot and the external environment cool. In this way energy conversion is provided at maximum efficiency and wildlife, such as but not limited to birds, may be better protected from the extreme heat and intense light associated with a concentrating solar power plant.

The input surface may be formed from a close-packed tessellation of collector panels that are attached to a flexible and transparent material. This will allow the physical structure comprising the concentrating solar collector, such as 38a, to be formed by inflating one or more regions within the structure. This is similar to how some large-scale sports stadiums are constructed. The walls of the structure may be fabricated from standard construction materials like, metal, concrete and rebar or by means of non-standard ceramics and low-cost compressed earth bricks; or even rammed earth walls, which may be further stabilized by a chemical binder such as Portland cement. The walls may even be fabricated from a fabric that is either opaque and reflective on one side or transparent. The fabric and other materials can be further supported by cables to form a cable-stayed structure. Alternately, sections of the solar power plant could be prefabricated at a remote location and inflated into a functional power plant at the desired location. This modular approaching further lowering the cost of energy.

Note, features described above with respect to one embodiment or aspect of the invention may also be present in one or more other embodiments or aspects of the invention. Features described in relation to the method may be present in the corresponding system, and vice versa.

INDUSTRIAL APPLICABILITY

This invention has applicability for controlling wave energy such as light, microwaves, sound waves, water waves and surface plasmon polaritons. The control includes beam steering and focusing and general wavefront modification over large angles without significant restrictions due to polarization or power level. Specific applications include, but are not limited to: solar energy harvesting, medical uses of flow cytometry, electronically steered automotive headlights, projector display systems, electronic zoom lens, light art, photonic network configurations for computing, laser steering for welding, augmented-reality and virtual-reality head mounted projection systems, industrial surveying, architectural surveying, topographic mapping, automated inspection, LIDAR, RADAR, remote sensing of chemicals and biologic agents; high-power beamed energy applications for power transport, directing laser energy for laser and sound-wave sound wave focusing and scanning for acoustic-based fire suppression. In general, technology applications may exist whenever there is a need or desire to control wave energy.

Reference Signs List

1a Transparent Sheet
1aa External Medium
1b Waveguide
1c Fluidic Control Channel
1d Index Matching Fluid
1e Reservoir Channels
1f Fluidic Control Channel
1g Fluidic Control Channel
1h Fluidic Control Channel
1i Fluidic Control Channel
1j Light Ray
1k Light Ray
1l Light Ray
1m Light Ray
1n Light Ray
1o First Surface
1p Output Direction
1q Second Surface
1r Waveguide Medium
1s Light Ray
1t Light Ray
1u Magnified View
1v Hydrophobic Coating
1w Hydrophobic Coating
1x Transparent Electrode Array
1y Transparent Electrode
1z Reservoir Channel
2a Control Channel
2aa Light Ray
2ab TIR Point
2b Control Channel
2c Waveguide
2d Reservoir
2e Reservoir
2f Reservoir
2g Reservoir
2h Heating Resistor
2i Heating Resistor
2j Heating Resistor
2k Heating Resistor
2m Index Matching Fluid
2n Vacuum
2o Fluid Leading Edge
2p Fluid Leading Edge
2q Fluid Leading Edge
2r Fluid Leading Edge
2s Vacuum
2t Light Ray
2u Transparent Region
2v TIR Point
2w Light Ray
2x Light Ray
2y TIR Point
2z Light Ray
3a Control Channel
3b Control Channel
3c Waveguide Medium
3d Index Matching Fluid
3e Fluid Leading Edge
3f Fluid Leading Edge
3g Gas Filled Channel Segment
3h Gas Filled Channel Segment
3i Reservoir Channel
3j Reservoir Channel
3k Light Ray
3m TIR Point
3n TIR Point
3o Light Ray
3p Light Ray
3q Point
3r Light Ray
3s Light Ray
3t TIR Point
4a Control Channel

| Reference Signs List |
|---|
| 4b Control Channel |
| 4c Waveguide Medium |
| 4d Index Matching Fluid |
| 4e Fluid Leading Edge |
| 4f Fluid Leading Edge |
| 4g Transparent Electrode |
| 4h Transparent Electrode |
| 4i Voltage Source |
| 4j Electric Field |
| 4k Control Channel |
| 4m Control Channel |
| 4n Light Ray |
| 4o TIR Point |
| 4p TIR Point |
| 4q Light Ray |
| 4r Reservoir Channel |
| 4s Reservoir Channel |
| 4t Light Ray |
| 4u Point |
| 4v Light Ray |
| 4w Light Ray |
| 4x TIR Point |
| 5a Control Channel |
| 5b Control Channel |
| 5c First Fluid |
| 5d Waveguide Medium |
| 5e Second Fluid |
| 5f Fluid Leading Edge |
| 5g Fluid Leading Edge |
| 5h Reservoir Channels |
| 5i Reservoir Channels |
| 5j Reservoir Channels |
| 5k Reservoir Channels |
| 6a Soft Transparent Medium |
| 6b Control Channel |
| 6c Control Channel |
| 6d Normally Open Segment |
| 6e Closed Segment |
| 6f Transparent Electrode |
| 6g Transparent Electrode |
| 6h Open Segment |
| 6i Normally Open Segment |
| 6j Closed Segment |
| 6k Open Segment |
| 6m Input Edge Rays |
| 6n Output Edge Rays |
| 6o Active Boundary |
| 6p Active Boundary |
| 6q Light Ray |
| 6r Light Ray |
| 6s Light Ray |
| 6t TIR Point |
| 6u TIR Point |
| 6v Light Ray |
| 6w Light Ray |
| 6x Point |
| 8a First Light Steering Layer |
| 8b Light Rays |
| 8c Second Light Steering Layer |
| 8d Light Rays |
| 8e First Surface |
| 8f Output Direction |
| 9a π/2 Light Steering Layer |
| 9b π/2 Light Steering Layer |
| 9c First Optical Surface |
| 9d Second Optical Surface |
| 9e Input Light |
| 9f Output Light |
| 10a Output Light |
| 11a π Light Steering Layer |
| 11b First Optical Surface |
| 11c Second Optical Surface |
| 11d Input Light |
| 11e Output Light |
| 12a Beam Steering Layer |
| 12b Incident Light |
| 12c First Surface |

| Reference Signs List |
|---|
| 12d Transparent Material |
| 12e Control Channel |
| 12f TIR Active Point |
| 12g TIR Non-Active Point |
| 12h Index Matching Fluid |
| 12i Second Surface |
| 12j Output Ray |
| 12k Injection Depth |
| 12m Angular Steering Range |
| 13a Incident Light |
| 13b Control Channel |
| 13c Gallery Ray |
| 13d Leading Edge of Control Channel |
| 13e IMF Reservoir |
| 13f IMF Injection Depth |
| 13g IMF Injection Depth |
| 13h IMF Injection Depth |
| 13i IMF Injection Depth |
| 16a Variable Focus Lens |
| 16b Light Transducer |
| 16c First Bundle Of Rays |
| 16d First Surface |
| 16e Second Surface |
| 16f Far Field Point |
| 16g Second Bundle Of Rays |
| 16h Control Channel |
| 18a First Steering Layer |
| 18b Second Steering Layer |
| 18c Third Steering Layer |
| 18d Magnified View |
| 18e Reservoir Channel |
| 18f Control Channel |
| 18g Waveguide |
| 19a 3-Layer Steering Device |
| 19b Magnified View |
| 19c Reservoir Channel |
| 19d Control Channel |
| 20a First Surface |
| 20b Second Surface |
| 20c Fluidic Steering Layer |
| 20d Fluidic Steering Layer |
| 20e Fluidic Steering Layer |
| 20f Fluidic Steering Layer |
| 20g Fluidic Steering Layer |
| 20h Fluidic Steering Layer |
| 20i Fluidic Steering Layer |
| 20j Fluidic Steering Layer |
| 20k Control Channel |
| 20m IMF Reservoir |
| 20n Transparent Medium |
| 20o Steered Light Rays |
| 20p Steered Light Rays |
| 20q Steered Light Rays |
| 20r Steered Light Rays |
| 20s Steered Light Rays |
| 20t Steered Light Rays |
| 20u Steered Light Rays |
| 20v Steered Light Rays |
| 20x Control Channel |
| 20y Vernier Steering Layer |
| 20z Steered Light Rays |
| 21a First Surface |
| 21b Second Surface |
| 21c Transparent Solid |
| 21d Multiplexed Steering Layer |
| 21e Multiplexed Steering Layer |
| 21f Multiplexed Steering Layer |
| 21g Non-Multiplexed Steering Layer |
| 21h Non-Multiplexed Steering Layer |
| 21i Vernier Layer |
| 21m Reservoir |
| 21n Input Light |
| 21o Output Light |
| 22a Input Ray |
| 22b First Surface |
| 22c Steering Layer |
| 22d Reflective Surface |

| Reference Signs List |
|---|
| 22e Output Ray |
| 23a Unit Cell |
| 23b First Tracking Layer |
| 23c Second Tracking Layer |
| 23d Concentrator |
| 23e Solar Cell |
| 23f Sun |
| 23g Trajectory |
| 23h Input Rays |
| 23i First Surface |
| 23j Reservoir |
| 23k Control Channel |
| 23m Injection Depth |
| 23n Reservoir |
| 23o Control Channel |
| 23p Injection Depth |
| 23q Ray Bundle |
| 23r Control Channel |
| 23s Ray Bundle |
| 23t Electrical Connection |
| 23u Heat Sink |
| 24a Injection Depth |
| 24b Injection Depth |
| 25a Injection Depth |
| 25b Injection Depth |
| 25c Control Channels |
| 25d First Fluid Boundary |
| 25e Second Fluid Boundary |
| 25f Secondary Solar Cell |
| 26a solar collector-concentrator |
| 26b Beam Steering System |
| 26c Reflector |
| 26d Solar Receiver |
| 26e Annual Angular Range |
| 26f Mirror Reflection |
| 26g Magnified Region |
| 26h Winter Solstice Magnification |
| 26i Input Light Bundle |
| 26j First Surface |
| 26k Second Surface |
| 26m Output Light Bundle |
| 26n Deactivated Mirror |
| 26o Activated Mirror |
| 26p Winter Solstice Magnification |
| 26q Input Light Bundle |
| 26r Activated Mirror |
| 26s Output Light Bundle |
| 27a 0-DOF Prior Art |
| 27b 1-DOF Current Art |
| 27c Ground |
| 27d Row of Solar Panels |
| 27e Row of Solar Panels |
| 27f solar collector-concentrator |
| 27g Bottom Mirror |
| 27h Side Mirror |
| 27i Side Mirror |
| 28a Fluidic Control Channel |
| 28b Transparent Medium |
| 28c Light Source |
| 28d Vernier Steering Device |
| 28e Vernier Beam Translation |
| 28f Intermediate Light Beam |
| 28g Electrodes |
| 28h Beam Injector |
| 28i Transparent Medium |
| 28j IMF Droplet |
| 28k Electrode |
| 28m Control Channel |
| 28n Gallery Ray |
| 28o Free Propagating Light |
| 28p Optical Surface |
| 28q Light Ray |
| 28r Beam Centering Surface |
| 28s Centered Light Beam |
| 29a Vernier Light Source |
| 30a Input Light Beam |
| 30b Output Light Beam |
| 30c Translation Direction |
| 30d Vacuum Bubble |
| 30e Fluidic Control Channel |
| 30f Transparent Solid |
| 30g TIR Redirection |
| 30h Electrodes |
| 30i Bubble Electrode |
| 31a First Surface |
| 31b Scene Ray |
| 31c Second Surface |
| 31d Global Transparent Electrode |
| 31e Transparent Cover |
| 31f First IMF |
| 31g Second IMF |
| 31h Fluid Boundary |
| 31i Transparent Well |
| 31j Fluidic Control Channels |
| 31k Local Pixel Electrode |
| 31m Information Ray |
| 31n Stored Second IMF |
| 31p Information Ray |
| 31q Output Ray |
| 31r Scene Ray |
| 31s Discarded Scene Ray |
| 32a Slab Preform |
| 32b First Conveyor |
| 32c First Conveyor |
| 32d Direction of Motion |
| 32e First Particle Accelerator |
| 32f Compact Particle Beam |
| 32g Exiting Particle Beam |
| 32h Distributed Particle Beam |
| 32i Second Particle Accelerator |
| 32m Second Distributed Beam |
| 33a Cylindrical Preform |
| 33b Unrolling Axis |
| 33c Conveyor |
| 33d Compact Particle Beam |
| 33e First Accelerator |
| 33f Unrolled Preform |
| 33g Exiting Particle Beam |
| 33h First Distributed Beam |
| 33i First Distributed Accelerator |
| 33j Separation Line |
| 33k Second Distributed Accelerator |
| 34a Acoustic Fire Suppression System |
| 34b Extended Fire |
| 34c Acoustic Wave Energy |
| 34d First Sound Beam |
| 34e Scan Angle |
| 34f Second Sound Beam |
| 34g Fire Free Region |
| 34h Acoustic Source |
| 34i First Acoustic Steering System |
| 34j Controller |
| 34k Second Acoustic Steering System |
| 35a Acoustic Source |
| 35b First Anti-Reflection Layer |
| 35c Acoustic Beam Steering Device |
| 35d Second Anti-Reflection Layer |
| 35e Partial Resonator Cover |
| 36a Compound Parabolic Concentrator |
| 36b Parabolic Curve |
| 36c Point |
| 36d Axis Point |
| 36d Point |
| 36e Point |
| 36f Point |
| 36g Point |
| 36h Point |
| 36i Point |
| 36j Point |
| 36k Wedge Concentrator |
| 38a Concentrating Solar Collector |
| 38b Ground |
| 38c Output Aperture |
| 38d Active Input Slab |

-continued

| Reference Signs List |
| --- |
| 38e Reflective Side |
| 38f Reflective Side |
| 38g Reflective Bottom |
| 38h Input Ray |
| 38i Internal Ray |
| 38j Internal Ray |
| 38k Internal Ray |
| 38m Safety Region |
| 39a Concentrating Solar Collector |
| 39b Ground |
| 39c Point |
| 39d Point |
| 39e Point |
| 39f Point |
| 39g Input Slab |
| 39h Reflective Surface |
| 39i Reflective Surface |
| 39j Reflective Surface |
| 39k Point |
| 39m Point |
| 39n Point |
| 39o Point |

The invention claimed is:

1. A method for controlling wave energy, comprising:
(a) providing at least one rigid material;
(b) providing at least one rigid control channel formed internal to said rigid material;
(c) providing at least one soft matter material;
wherein said one or more rigid control channels within said rigid material are arranged to receive and release said at least one soft matter material progressively in response to one or more time varying stimuli, thereby progressively changing the reflection and transmission properties along said one or more rigid control channels, to induce an angular change in the propagation direction of said wave energy; and
(d) providing at least one reservoir for said soft matter; wherein said one or more rigid control channels within said rigid material are arranged to receive and release said at least one soft matter material from said at least one reservoir thereby progressively changing the extent of said at least one soft matter in said at least one control channel to continuously change the reflection and transmission properties along the boundary formed on the surfaces of said at least one control channel that is formed by said rigid material and said soft matter to allow a change in the reflection properties of said at least one control channel to angularly redirect said wave energy as it propagates through said at least one rigid material.

2. The method of claim 1, wherein said method for controlling wave energy provides steering of electromagnetic waves from one direction into electromagnetic waves in a different direction.

3. The method of claim 1, wherein said method for controlling wave energy utilizes gallery waves for steering wave energy.

4. The method of claim 1, wherein said method for controlling wave energy provides concentration or expansion of wave energy from a source region to a real or virtual focus region.

5. The method of claim 1, wherein said rigid material is transparent.

6. The method of claim 1, wherein said at least one rigid control channel is uniform in thickness.

7. The method of claim 1, wherein said at least one rigid control channel is variable in thickness.

8. The method of claim 1, wherein said at least one soft matter material is transparent to said wave energy.

9. The method of claim 1, wherein said at least one soft matter material is reflective to said wave.

10. The method of claim 1, wherein said at least one soft matter material comprises a first refractive index matching fluid and a second index matching fluid which are non-miscible.

11. The method of claim 9, wherein one of said first refractive index matching fluid and said second refractive index matching fluid is a polar liquid and a remaining one of said first and second refractive index matching fluids is a non-polar liquid.

12. The method of claim 9, wherein said first refractive index matching fluid and said second refractive index matching fluid have different refractive indices.

13. The method of claim 1, wherein said wave energy is one of: electromagnetic; acoustic; a liquid surface wave; a surface plasmon polariton; and seismic.

14. The method of claim 1, wherein the wave energy is controlled using one or more stages of steering.

15. The method of claim 1, wherein the wave energy is passed through a device for controlling wave energy so that input and output surfaces of the device are separate and distinct.

16. The method of claim 1, wherein the wave energy comprises at least one of: a continuous wave; and a pulsed wave.

17. The method of claim 1, wherein said soft matter material comprises at least one of: a liquid; a soft solid; a gas; and a plasma.

18. The method of claim 1, wherein said soft matter material comprises a refractive index matching fluid having substantially the same refractive index as said at least one transparent solid.

19. The method of claim 1, wherein said at least one rigid control channel forms one of: a periodic array; and an aperiodic array.

20. The method of claim 1, wherein said at least one rigid control channel comprises at least one of: a curved cross section; and a flat cross section.

21. The method of claim 1, wherein different angular steering ranges are associated with different physical layers.

22. The method of claim 1, wherein different angular steering ranges are multiplexed into the same physical layer.

23. The method of claim 1, further comprising providing at least one soft matter distributor operative to emit at least one control signal and to distribute said at least one soft matter material; wherein said distributor comprises at least one of: a thermal expansion/contraction actuator; a thermal vaporization actuator; a magnetohydrodynamics actuator; a pressure gradient actuator; a dielectrophoresis pump; an acoustic actuator; an electro-wetting actuator; an electro-hydrodynamics actuator; an electro-osmosis actuator; an electro mechanical actuator; and an array of plasma inducing electrodes.

24. The method of claim 1, wherein said rigid material supports electrodes in close proximity to said at least one rigid control channel.

25. The method of claim 1, wherein said at least one rigid material has substantially the same refractive index as said at least one soft matter material.

26. The method of claim 1, wherein said method for controlling wave energy provides a device for harvesting solar energy.

27. The method of claim 1, wherein said method for controlling wave energy provides a device for a display.

28. The method of claim 1, wherein said method for controlling wave energy provides a device for directing wave energy.

29. The method of claim 1, wherein said method for controlling wave energy provides a device for focusing wave energy.

30. The method of claim 1, wherein said method for controlling wave energy provides a device for remote sensing of the environment.

31. The method of claim 1, wherein said method for controlling wave energy provides a device for dynamically configuring a computer network.

32. The method of claim 1, wherein said method for controlling wave energy provides a display pixel.

33. A system for controlling wave energy, comprising:
(a) at least one rigid material;
(b) at least one rigid control channel formed internal to said rigid material; and
(c) at least one soft matter material;
  wherein said one or more rigid control channels within said rigid material are arranged to receive and release said at least one soft matter material progressively in response to one or more time varying stimuli, thereby progressively changing the reflection and transmission properties along said one or more rigid control channels, to induce an angular change in the propagation direction of said wave energy; and
(d) at least one reservoir for said soft matter; wherein said one or more rigid control channels within said rigid material are arranged to receive and release said at least one soft matter material from said at least one reservoir thereby progressively changing the extent of said at least one soft matter in said at least one control channel to continuously change the reflection and transmission properties along the boundary formed on the surfaces of said at least one control channel that is formed by said rigid material and said soft matter to allow a change in the reflection properties of said at least one control channel to angularly redirect said wave energy as it propagates through said at least one rigid material.

34. The method of claim 1, wherein the wave energy is redirected by a reflecting surface so that input and output surfaces of a device for controlling wave energy are the same.

* * * * *